United States Patent
Nakamura et al.

(10) Patent No.: US 6,686,619 B2
(45) Date of Patent: *Feb. 3, 2004

(54) DYNAMIC RANDOM ACCESS MEMORY WITH IMPROVED CONTACT ARRANGEMENTS

(75) Inventors: Yoshitaka Nakamura, Ome (JP); Hideo Aoki, Musashimurayama (JP); Yoshikazu Ohira, Ome (JP); Tadashi Umezawa, Ome (JP); Satoru Yamada, Ome (JP); Keizou Kawakita, Ome (JP); Isamu Asano, Iruma (JP); Naoki Fukuda, Ome (JP); Tsuyoshi Tamaru, Hachioji (JP); Hidekazu Goto, Fussa (JP); Nobuyoshi Kobayashi, Kawagoe (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/137,426

(22) Filed: May 3, 2002

(65) Prior Publication Data

US 2002/0123190 A1 Sep. 5, 2002

Related U.S. Application Data

(62) Division of application No. 09/984,522, filed on Oct. 30, 2001, which is a division of application No. 09/215,270, filed on Dec. 18, 1998, now Pat. No. 6,329,681.

(30) Foreign Application Priority Data

Dec. 18, 1997 (JP) .............................. 9-348822

(51) Int. Cl.[7] .............................................. H01L 27/108
(52) U.S. Cl. ...................................... 257/297; 257/300
(58) Field of Search ................................. 257/296, 297, 257/298, 299, 300, 303, 90 P

(56) References Cited

U.S. PATENT DOCUMENTS

| | | | |
|---|---|---|---|
| 5,960,319 A | 9/1999 | Iwata et al. | 438/664 |
| 6,031,288 A | 2/2000 | Todorobaru et al. | 257/754 |
| 6,150,689 A | 11/2000 | Narui et al. | 257/306 |

Primary Examiner—Jack Chen
(74) Attorney, Agent, or Firm—Antonelli, Terry, Stout & Kraus, LLP

(57) ABSTRACT

A semiconductor integrated circuit device and a manufacturing method therefor provide advantages that undulations are prevented from being produced in polycrystal silicon plugs in bit line contact holes and that the undesired phenomenon of transversally etching silicide film at contacts of the bit lines and the polycrystal silicon plugs is avoided. The bit lines formed when forming a first wiring layer are made of a laminate film having a titanium film, a titanium nitride film and a tungsten film, and a titanium silicide film containing nitrogen or oxygen is formed in contact areas of the bit lines and plugs. A titanium silicide film containing nitrogen or oxygen is also formed in contact areas of the first wiring layer and semiconductor substrate. The titanium silicide film may be replaced by silicide film containing nitrogen or oxygen, cobalt silicide film containing nitrogen or oxygen or cobalt silicide film.

4 Claims, 48 Drawing Sheets

(a)

(b)

DYNAMIC RANDOM ACCESS MEMORY WITH IMPROVED CONTACT ARRANGEMENTS

This is a divisional of application Ser. No. 09/984,522, filed Oct. 30, 2001; which is a divisional of Ser. No. 09/215,270, filed Dec. 18, 1998 (now U.S. Pat. No. 6,329,681), the entire disclosures of which are hereby incorporated by reference.

BACKGROUND OF THE INVENTION

1. Field of the Invention

This invention generally relates to a semiconductor integrated circuit device and a method of manufacturing the same. More particularly, it relates to a technology effectively applicable to a semiconductor integrated circuit device comprising a DRAM (dynamic random access memory).

2. Related Art

DRAMs are typical large capacity semiconductor memories known to date. Recently, as DRAMs are made to have an ever-increasing storage capacity, the area exclusively occupied by the memory cells of a DRAM has to be reduced in order to enhance the degree of integration of the memory cells.

However, the storage capacity of the information storing capacitive elements (hereinafter referred to simply as capacitors) of the memory cells of a DRAM has to be held to a constant level regardless of the DRAM generation by taking the operational margin and software errors as well as other factors of the DRAM into consideration.

Thus, research and development efforts have been paid to improve the structure of capacitors so that a required storage capacity may be secured within a limited area provided exclusively for the capacitors of a DRAM. As a result of such efforts, cubic capacitor structures have been developed by arranging a plate electrode on a lower electrode having a crown-like three-dimensional profile and typically made of polysilicon with a capacitive insulation film interposed between the plate electrode and the lower electrode. Such structures are currently popularly used.

In capacitors having a cubic profile, or cubic capacitors, the capacitor electrode is normally arranged as an upper layer relative to the memory cell selector MISFET (metal insulator semiconductor field effect transistor: hereinafter referred to simply as selector MISFET) so that a large storage capacity may be secured within a relatively small area.

Japanese Patent Application Laid-Open No. 7-122654 describes a cubic capacitor structure known as capacitor over bit line (hereinafter referred to as COB) structure where the capacitor is arranged above the bit line.

In a DRAM having a COB structure, a selector MISFET and a MISFET for the peripheral circuit are formed on a semiconductor substrate and a bit line for writing and reading data and a first wiring layer of the peripheral circuit are formed above the selector MISFET with an interlayer insulation film interposed therebetween. Subsequently, a capacitor is formed by sequentially laying a storage electrode (lower electrode), a capacitive insulation film and a plate electrode (upper electrode) to produce a multilayer structure. The storage electrode of the capacitor is made of polycrystal silicon doped with an n-type impurity substance (phosphor) and connected to one of the semiconductor regions (the source or drain region) of the selector MISFET, which is of the n-channel type. The plate electrode is arranged as an electrode commonly used for a plurality of memory cells and held to a predetermined constant potential.

The bit line is connected to one of the semiconductor regions (source/drain regions) of the selector MISFET through a contact hole cut through the insulation film that covers the selector MISFET. This connection is realized by way of a polycrystal silicon plug formed in the contact hole. The other semiconductor region of the selector MISFET is connected to the capacitor. The bit line is typically made of a low resistance metal material in order to improve the speed of the data writing/reading operation.

In a DRAM having a configuration as described above, tungsten (W) film is used for the bit line or the first wiring layer of the peripheral circuit. The use of tungsten that is more resistive against electro-migration than aluminum (Al) for the bit line or the first wiring layer of the peripheral circuit provides an effective means for securing a prolonged service life for the wires of the DRAM.

However, more often than not, the metal material of the wires and the silicon of the substrate chemically react each other to produce a silicide layer in areas where the wires and the substrate contact each other. The silicide (tungsten silicide) layer formed by the chemical reaction of the tungsten film and the silicon substrate can generate significant stress in the substrate. Therefore, when the bit line or the first wiring layer of the peripheral circuit is made of tungsten film, a metal film has to be formed under the tungsten film so that there may be given rise to a silicide layer that is subjected to little stress by the chemical reaction of the metal film and the silicon substrate.

The above cited patent document describes the use of titanium (Ti) film as metal film that gives rise to a silicide layer with little stress. Titanium film adheres well to insulation film and the titanium silicide ($TiSi_x$, $x \leq 2$) layer it produces as it reacts with the silicon substrate generates little stress in the substrate. Thus, titanium silicide is a material that can advantageously be used for the metal layer to be formed under the tungsten layer.

Additionally, a titanium silicide film formed on the interface between the semiconductor regions (source/drain regions) of the MISFET of the peripheral circuit and the first wiring layer operates as effective means for reducing the contact resistance of the wires of the device.

On the other hand, there is a problem of the chemical reaction between WF6 of the source gas and silicon (Si) that arises when forming a tungsten film by means of a CVD technique. Additionally, the tungsten film can react with silicon in a subsequent heat treatment process if they are held in direct contact with each other. Therefore, for forming a tungsten film on a titanium film by deposition, it is necessary to provide a barrier layer between the two films that adheres well to them in order to prevent any direct contact of WF6 and silicon or tungsten and silicon. The above cited patent document refers to the use of titanium nitride film (TiN) as barrier layer.

DRAMs generally comprises a memory cell array region, a direct peripheral circuit region and an indirect peripheral circuit region. The memory cell array region is a region where selector MISFETs and capacitors are formed, whereas sense amplifiers are formed in the direct peripheral circuit region to detect the presence or absence of a stored electric charge in each capacitor as recorded information. The indirect peripheral circuit region is formed around the direct peripheral circuit region. The word lines and the bit lines in the memory cell array region of a DRAM are processed with minimum processing dimensions in order to provide the DRAM with a maximal degree of integration. Then, in the direct peripheral circuit region, the MISFETs are processed with minimum processing dimensions and arranged at a pitch that is in line with that of arranging the word lines and the bit lines that have been processed with minimum processing dimensions. Furthermore, the gate electrodes and the contact holes for contacting the source/drain regions are generally also processed with minimum processing dimensions. On the other hand, the indirect peripheral circuit region is subjected to less rigorous requirements in terms of device layout and it is less influential in determining the total area of the chip so that the contact holes for contacting the source/drain regions of the MISFETs can be made to have a large bore in order to realize a reliable contact.

However, as the degree of integration is raised for DRAMs, the area in a DRAM exclusively spared for the capacitors is reduced to consequently reduce their storage capacity. Then, it is necessary to improve the sensitivity of the sense amplifiers and provide measures to reduce the capacity of the bit lines so that the presence or absence of a stored electric charge may be reliably detected in each of the capacitors that have only a small capacity. In order to reduce the capacity of the bit lines, it is necessary to reduce the width of the bit lines and increase the gap separating adjacent bit lines or reduce the film thickness of the bit lines so that adjacently located bit lines may face each other with a minimal surface area.

Additionally, it is also necessary to reduce the area occupied by the memory cell array region who is the largest occupier in the DRAM and minimize the surface area of the chip if the degree of integration is to be enhanced for the DRAM. The area occupied by the memory cell array region can be reduced only by optimally selecting the profiles and the positions of the contact holes for contacting the active regions of the selector MISFETs of the memory cells, the word lines, the bit lines and the capacitors as well as other members. Note that the above listed members should not be made to show a complicated profile as a result of such optimization. More specifically, in the memory cell array region, the members are processed for patterning by exploring the technological limits of photolithography because they are processed with minimum processing dimensions. If the members have a complicated profile, defective patterns can be produced by the patterning operation due to interference of rays of light used for exposure as such interference can occur among adjacently located members. Thus, the members are required to show a profile that is as simple as possible. In the case of word lines and bit lines, a linear profile will be the best choice.

However, with bit lines having a linear profile and a minimal width, it will no longer be possible to completely cover the contact area of each bit line and the polycrystal silicon plug formed on the source/drain regions of a corresponding selector MISFET, which is a bit line contact hole, so that consequently and inevitably the bit line contact hole will remain open relative to the bit line. Then, the bit line contact hole will become etched during the operation of etching the bit line.

When bit lines are processed in such an open structure, the polycrystal silicon plug underlying the bit lines can be dug to produce undulations on the underlayer, which adversely affect the subsequent photolithography and etching steps to degrade the overall processing accuracy.

As described earlier, a titanium silicide film is formed between each bit line and the corresponding polycrystal silicon plug to reduce the contact resistance. However, when a bit line is etched in an open structure, the titanium silicide film that is apt to be etched can also be etched transversally to produce a cavity between the bit line and the polycrystal silicon plug. Then, such a cavity can hinder the communication between the bit line and the polycrystal silicon plug to consequently degrade the performance of the DRAM.

On the other hand, as also described earlier, the bit lines and the first wiring layer are formed as a common layer and a titanium silicide film is formed at the contacts of the first wiring layer and the semiconductor substrate. The titanium silicide film has a thermal resistance that is not sufficient to withstand the heat treatment process to be conducted after the formation of the bit lines and the first wiring layer so that a problem of an increased leak current can arise at their contacts. Particularly, the inventors of the present invention have noticed that the thermal resistance is particularly poor when the contact holes have a bore that is different between the direct peripheral circuit region and the indirect peripheral circuit region. Then, such a rise in the leak current, or a fall in the withstand voltage at the contacts, will become particularly remarkable when unreacted titanium is left on the bottom of any of the contact holes.

Thus, it is an object of the present invention to provide a technology for effectively preventing undulations from being produced in the polycrystal silicon plugs in the bit line contact holes to eliminate any possible adverse effect of such undulations on the subsequent photolithography and etching steps and improve the yield of these steps.

Another object of the present invention is to provide a technology for preventing the phenomenon that the silicide film at the contacts of the bit lines and the polycrystal silicon plugs is etched transversally from taking place in order to secure the communication between each bit line and the corresponding polycrystal silicon plug and consequently improve the yield and the reliability of manufacturing semiconductor integrated circuit devices.

Still another object of the present invention is to provide a technology for reducing the capacity of each bit line and hence the storage capacity of a DRAM required to store a given amount of information so that the operating speed of the DRAM may be improved.

A further object of the present invention is to provide a technology for improving the thermal resistance of the contacts between the first wiring layer and the semiconductor substrate and suppressing the leak current at the contacts that can appear in subsequent steps involving the use of heat particularly when the bit lines of the DRAM and the first wiring layer of the peripheral circuit region are formed in a common layer so that consequently the yield and the reliability of manufacturing semiconductor integrated circuit devices may be improved.

These and other objects and the novel features of the present invention will become more apparent by reading the following description made in conjunction with the accompanying drawings.

SUMMARY OF THE INVENTION

Some of the different aspects of the present invention will summarily described below.

(1) A semiconductor integrated circuit device according to an aspect of the invention contains a memory cell array region having memory cells including selector MISFETs and capacitors and arranged in array on the principal surface of a semiconductor substrate for a DRAM and a peripheral circuit region including MISFETs and arranged along the periphery of the memory cell array region. More specifically, it comprises polycrystal silicon plugs, each being electrically connected to one of the source/drain regions of a corresponding selector MISFET, bit lines each being connected to the top surface of a corresponding polycrystal silicon plug by way of a first contact hole, and a first wiring layer connected to one of the source/drain regions of each of the MISFETs of the peripheral circuit or the principal surface of the semiconductor substrate by way of second contact holes, wherein a titanium silicide film containing nitrogen or oxygen, a tungsten silicide film containing nitrogen or oxygen, a cobalt silicide film containing nitrogen or oxygen or a cobalt silicide film is formed along the interface of each bit line and the corresponding one of the polycrystal silicon plugs or that of the first wiring layer and one of the source/drain regions of each of the MISFETs of the peripheral circuit or the principal surface of the semiconductor substrate. The impurity contained in the silicide film may be carbon or germanium in place of nitrogen or oxygen.

In a semiconductor integrated circuit device having the above described configuration, a titanium silicide, tungsten silicide or cobalt silicide film containing nitrogen, oxygen, carbon or germanium or a cobalt silicide film containing no impurity is formed along the interface of each bit line and the corresponding one of the polycrystal silicon plugs and therefore, if bit lines shows an open structure, or under a condition where the contact metal of the nitrogen-containing titanium silicide film or the like is exposed to an etching atmosphere, the contact metal operates as etching stopper that prevents the polycrystal silicon plug from being scraped off by etching. As a result, the polycrystal silicon plug would not be dug to produce undulations and any possible adverse effect of such undulations on the subsequent photolithography and etching steps is eliminated to improve the yield of these steps.

Additionally, since the contact metal is not etched, no insufficient communication occurs between the bit lines and the respective polycrystal silicon plugs to further improve the yield of manufacturing such semiconductor integrated circuit devices.

The use of the contact metal as etching stopper is devised by the inventors of the present invention on the basis of their finding that a titanium silicide film and a tungsten silicide film that contain nitrogen, oxygen, carbon or germanium as well as a cobalt silicide film regardless if it that contains or not contains any of the above impurities including nitrogen or the like are resistant against etching.

Thus, a semiconductor integrated circuit device according to the invention and having a configuration as described above shows improved thermal resistance because a titanium silicide, tungsten silicide or cobalt silicide film containing nitrogen, oxygen, carbon or germanium or a cobalt silicide film containing no impurity is formed along the interface of each bit line and the corresponding one of the polycrystal silicon plugs or that of the first wiring layer and one of the source/drain regions of each of the MISFETs of the peripheral circuit or the principal surface of the semiconductor substrate. As a result, a heat treatment step can be conducted after forming the first wiring layer(bit lines) and the leak current in the peripheral circuit region can be reduced to further improve the manufacturing yield. These improved are realized on the basis of a series of experiments conducted by the inventors of the present invention and their finding that the leak current does not increase in a contact hole where a contact metal is formed as a titanium silicide film or the like if it is heat treated in a subsequent step. It may be safe to presume that an increase in the leak current is attributable to coagulation of titanium silicide film or diffusion of titanium atoms into the surrounding impurity diffusing region that takes place as a result of heat treatment and that a titanium silicide film containing nitrogen, oxygen, carbon or germanium successfully suppresses such coagulation or titanium diffusion.

Preferably, the concentration of nitrogen or oxygen is between 1 atomic % and 13 atomic %. The resistance against etching will be reduced if the concentration of nitrogen or oxygen is too low, whereas the contact resistance of the contact metal will be increased to make the latter poorly operative if, on the other hand, the concentration of nitrogen or oxygen is too high. The inventors of the present invention came to find as a result of a series of experiments that there exists an appropriate concentration range for nitrogen or oxygen, which is preferably between 1atomic % and 13 atomic %. According to the findings of the inventors of the present invention, the impurity is most preferably nitrogen, whose concentration is between 1 atomic % and 3 atomic %.

(2) A semiconductor integrated circuit device according to a second aspect of the invention comprises selector MISFETs arranged in array on the principal surface of a semiconductor substrate, polycrystal silicon plugs, each being formed in a first insulation film on one of the source/drain regions of each of the selector MISFETs, and bit lines formed on a second insulation film arranged on the first insulation film, wherein a first contact hole is formed in the second insulation film on each of the polycrystal silicon plugs and each of the bit lines and the corresponding one of the polycrystal silicon plugs are connected by way of a metal plug formed in the corresponding first contact hole.

In a semiconductor integrated circuit device having the above described configuration, each of the bit lines and the corresponding one of the polycrystal silicon plugs are connected by way of a metal plug formed in the corresponding first contact holes cut through the second insulation film. Thus, if any of the bit lines shows an open structure relative to the corresponding first contact hole, the metal plug operates as etching stopper to prevent the contact metal of the polycrystal silicon plug from being exposed to the etching atmosphere when a patterning operation is conducted for the bit lines. As a result, the polycrystal silicon plug would not be dug to produce undulations and any insufficient communication due to a transversally etched contact metal can be prevented from taking place to consequently improve the yield and the reliability of manufacturing semiconductor integrated circuit devices as in the case of (1) above.

When the first contact hole is filled by a metal plug, the film thickness of the bit line can be made less than a half of the bore of the first contact hole. Such a thin bit line can show a reduced capacity of the bit lines and hence realize a reduced storage capacity of the DRAM or an improved accuracy for detecting the storage capacity.

More specifically, bit lines are arranged very close to the memory cell array of the DRAM and made to show a long profile extending over the memory cell array region between the direct peripheral circuits where sense amplifiers are arranged. Thus, if the bit lines have a large film thickness, adjacently located bit lines may face each other with a large surface area to increase the interline capacitance. An increase in the interline capacitance can reduce the detection sensitivity of the sense amplifiers to consequently degrade the performance of the DRAM. However, according to the invention, since the bit lines are made very thin to minimize the surface area with which adjacently located bit lines face each other and hence the inter-bit-line capacitance can be reduced. As a result, the accuracy of detecting the stored electric charge in each capacitor can be improved. Additionally, since the response speed of a capacitor is inversely proportional to the product of the stray capacitance and the resistance, the decrease in the interline capacitance can improve the response speed.

Still additionally, the bit lines and the metal plugs may respectively be made of tungsten or molybdenum and titanium nitride or tungsten nitride. Then, the bit lines may be appropriately etched by means of a fluorine type etching gas, whereas the metal plugs made of titanium nitride or tungsten nitride will hardly be etched by the fluorine type etching gas during the bit line patterning operation because of the low etching rate of such an etching gas. Therefore, the bit line patterning operation affords a sufficient degree of over-etching to allow a wide process margin.

In short, in a semiconductor integrated circuit device according to (1) or (2) above, the bit lines are made of a material that can be selectively etched relative to the underlying material in the first contact holes. The underlying material in the first contact holes is selected from materials that have a high etching-resistivity if compared with the bit lines and include nitrogen-containing titanium silicide or the like and titanium nitride or the like that is used for the metal plugs. By selecting an appropriate material having a high etching resistivity relative to the bit lines for the underlayer, undulations due to uniformly scraped underlying polycrystal silicon plugs and defective communication due to transversally etched contact metal can be prevented from occurring if the bit lines show an open structure as described above.

The metal plugs may be made of a laminate having a titanium nitride layer and a tungsten layer, while the bit liens may be of a single layer structure of tungsten. If such is the case, the etching selectivity of the single tungsten layer of the bit lines may not be able to be defined relative to the underlayer because the metal plugs, or the underlayer of the first contact holes, contain tungsten. However, the tungsten film of the bit lines can be made very thin and, if it is over-etched, the over-etching time may represent only about 50% of the film thickness of the bit lines, while the tungsten of the underlayer, or the metal plugs, will be etched only slightly during this time. In short, if bit lines are made of the material of the metal plugs, the plugs will not be etched down to the bottom by over-etching and hence the silicide film at the bottom of the plugs may be free from any trouble such as an etched side.

(3) A semiconductor integrated circuit device according to a third aspect of the invention comprises selector MISFETs arranged in array on the principal surface of a semiconductor substrate, polycrystal silicon plugs, each being formed in a first insulation film on one of the source/drain regions of each of the selector MISFETs, a second insulation film formed on the first insulation film by deposition and bit lines, each being connected to a corresponding one of the polycrystal silicon plugs by way of a first contact hole bored through the second insulation film on the polycrystal silicon plugs, wherein thickness L1 of the bit lines, distance L2 obtained by adding the thickness of the second insulation film and the thickness L1 of the bit lines and bore D of the first contact holes show a relationship of L1×(1+OVE)<L2 and L1>D/2 (where OVE is the extent of over-etching of the bit lines in the patterning process).

With a semiconductor integrated circuit device defined as above, where the requirement of L1>D/2 is satisfied and the first contact holes are completely filled with a coating film that eventually makes bit lines, while the requirement of L1×(1+OVE)<L2 is met to make the thickness of the bit lines in the first contact holes that is approximated by distance L2 obtained by adding the thickness of the second insulation film and the thickness L1 of the bit lines exceed the extent of etching as expressed by L1×(1+OVE), the coating film is left, if partly, in the first contact holes when the patterning operation for producing the bit lines is over. Under such a condition where the coating film still exists, the contact metal and the polycrystal silicon plugs will never be etched so that the above identified problems of undulations and defective communication will not occur. Therefore, as pointed out above under (1) and (2), a wide process margin will be allowed to consequently improve the yield and the reliability of manufacturing semiconductor integrated circuit devices.

Note that, in a semiconductor integrated circuit device according to any of (1) through (3) above, the bit lines may have a width smaller than the bore of the first contact holes so that the bit lines may show an open structure relative to the respectively contact holes. While an open structure as used herein refers to a structure that is intentionally made open in the stage of designing the mask, it may be needless to say that the present invention also applies well to a situation where an open structure is unintentionally produced as a result of a displaced mask during the manufacturing process.

(4) A semiconductor integrated circuit device according to a fourth aspect of the invention contains a memory cell array region having memory cells including selector MISFETs and capacitors and arranged in array on the principal surface of a semiconductor substrate for a DRAM, a direct peripheral circuit region formed along the periphery of the memory cell array region and an indirect peripheral circuit region arranged along the periphery of the memory cell array region and comprises contact holes connecting the principal surface of the semiconductor substrate in the direct peripheral circuit region or the indirect peripheral circuit region and the first wiring layer, wherein the bore of the contact holes is identical both in the direct peripheral circuit region and in the indirect peripheral circuit region.

With a semiconductor integrated circuit device having a configuration as described above, where the bore of the contact holes is identical both in the direct peripheral circuit region and in the indirect peripheral circuit region, the thermal resistance of the contact areas of the first wiring layer and the semiconductor substrate is raised to reduce the contact resistance and hence the leak current of the semiconductor integrated circuit device as a whole to consequently improve the yield and the reliability of manufacturing semiconductor integrated circuit devices as well as the performance of the devices.

More specifically, as a result of the fact that the bore of the contact holes is identical throughout the device, each of the layers including a titanium layer, a titanium nitride layer and a tungsten layer for forming wires and arranged in the contact holes to cover the bottom thereof shows a uniform thickness at the bottom in all the contact holes. As each of the layers has a uniform thickness on the bottom in all the contact holes, its thermal resistance does not vary among the contact holes to consequently improve the thermal resistance of the wires arranged in the bottom of each of the contact holes. Particularly, when the titanium layer is made to show a uniform thickness on the bottom in all the contact holes, a uniform titanium silicide film may be produced so that no unreacted titanium film may be left after the silicifying reaction. If, to the contrary, unreacted titanium film is left after the silicifying reaction, the unreacted titanium may be silicified in a subsequent heat treatment process to give rise to unexpected stress in the titanium silicide film and/or produce voids in the semiconductor substrate, which can eventually reduce the thermal resistance of the device. However, the a semiconductor integrated circuit device according to the invention is free from such a problem.

The inventors of the present invention found as a result of a series of experiments that an uneven film thickness of the titanium film in the contact holes can give rise to a residual titanium film left after the silicifying reaction, which by turn reduces the thermal resistance of the device as a whole.

The aspect ratio of the contact holes may be made identical throughout the memory cell array region, the direct peripheral circuit region and the indirect peripheral circuit region. If the bore of the contact holes varies in the device, the film thickness at the bottom of the contact holes can be made uniform in the entire device if the aspect ratio is made identical in the device. Thus, any degradation in the thermal resistance of the device due to a varying film thickness of the titanium film can be prevented from taking place.

(5) A method of manufacturing a semiconductor integrated circuit device according to a fifth aspect of the invention comprises steps of (a) arranging selector MISFETs in array in a memory cell array region, forming MISFETs for peripheral circuits in a peripheral circuit region and forming a first insulation film by deposition to cover the selector MISFETs and the MISFETs for the peripheral circuits, (b) forming first contact holes in the first insulation film, each being provided to expose at least one of the source/drain regions of a corresponding selector MISFET, and forming a polycrystal silicon plug in each of the first contact holes, (c) forming a second insulation film on the first insulation film and the polycrystal silicon plugs by deposition and forming second contact holes in the second insulation film to expose the top surface of the polycrystal silicon plugs, (d) forming third contact holes to expose the source/drain regions of the MISFETs of the peripheral circuits or the principal surface of the semiconductor substrate and (e) forming an electro-conductive film on the second insulation film by deposition and forming bit lines in the memory cell array region and wires of a first wiring layer in the peripheral circuit region by patterning the electro-conductive film, wherein an additional step of forming a member showing an etching rate lower than that of the electro-conductive film of the etching technique for patterning the electro-conductive film in the inside or the bottom of each of the second or the third contact holes is provided prior to the step (e).

With such a method of manufacturing a semiconductor integrated circuit device, an additional step of forming a member showing an etching rate lower than that of the electro-conductive film of the etching technique for patterning the electro-conductive film in the inside or the bottom of each of the second or third contact holes is provided prior to the step (e) so that the member can be used as etching stopper when etching the electro-conductive film for a patterning operation for producing bit lines. Thus, the polycrystal silicon plugs or the contact metal, if such is formed on the upper surface of each of the polycrystal silicon plugs, would not be etched at all. As a result, the polycrystal silicon plugs would not be dug nor the contact metal would be transversally etched so that the device will be free from undulations and bit lines that are defective for communication.

The members can be used as etching stopper for the etching operation of forming bit lines in the step (e) so that bit lines can be made to show a width smaller than the bore of the second contact holes. In other words, the bit lines can be made to show an open structure relative to the respective second contact holes to adapt the semiconductor integrated circuit device to a higher degree of integration and a reduction in the capacity of the bit lines.

The members can be prepared as silicide film produced by thermally treating the cobalt, titanium or tungsten film formed on the second insulation film and containing nitrogen, oxygen, carbon or germanium to a concentration level between 1 atomic % to 13 atomic % and causing a silicifying reaction to take place between the film and the polycrystal silicon plugs or the principal surface of the semiconductor substrate. The silicide film prepared in an above described manner contains nitrogen, oxygen, carbon or germanium to a concentration level between 1 atomic % to 13 atomic % and hence shows a resistivity against etching as pointed out earlier. If the film contains nitrogen, the resistivity of the film against etching can be made remarkably by limiting the nitrogen concentration between 1 atomic % and 3 atomic %.

The members may be plugs made of tungsten, titanium nitride or tungsten nitride and formed in the second or third contact holes respectively. Then, the plugs formed in the contact holes operate as etching stoppers.

With a manufacturing method as described above, the third contact holes arranged for the peripheral circuits may be made to show a same and identical bore. Then, the thermal resistance of the contact areas of the first wiring layer and the semiconductor substrate at the bottom of the third contact holes will be improved.

(6) In a semiconductor integrated circuit device according to the invention, the titanium, tungsten or cobalt silicide film is made to have a film thickness between 15 and 30 nm. As a result of a series of experiments, the inventors of the present invention found that, with a film thickness between 15 nm and 30 nm selected for the silicide film, the contact resistance of the device can be remarkably reduced in the film.

The present invention will be summarized below for all the aspects thereof.

1. A semiconductor integrated circuit device having first MISFETs for selecting memory cells formed on the principal surface of a semiconductor substrate and second MISFETs for peripheral circuits formed on the surface, comprising: polycrystal silicon plugs formed in a first insulation film and arranged on one of the source/drain regions of each of the first MISFETs; bit lines arranged on a second insulation film and electrically connected to the respective polycrystal silicon plugs by way of respective contact holes formed to pass through the second insulation film arranged on the first insulation film; and wires of a first wiring layer arranged on the second insulation film and electrically connected to the source/drain regions of the second MISFETs respectively by way of second contact holes formed to pass through the first and second insulation films; wherein a silicide film of an element selected from titanium, tungsten and cobalt containing an impurity or impurities, or a cobalt silicide film containing no impurity is formed in the contact areas of the bit lines and the polycrystal silicon plugs, or in those of the wires of the first wiring layer and the source/drain regions or the gate electrodes of the second MISFETs or the principal surface of the semiconductor substrate; the impurity or impurities being one or more than one elements selected from nitrogen, oxygen, carbon and germanium.

2. A semiconductor integrated circuit device according to claim 1, wherein a concentration of the impurity is between 1 atomic % and 13 atomic %.

3. A semiconductor integrated circuit device according to claim 2, wherein the impurity is nitrogen, and the concentration of nitrogen is between 1 atomic % and 3 atomic %.

4. A semiconductor integrated circuit device according to claim 1, wherein the width of the bit lines is not greater than the bore of the first contact holes.

5. A semiconductor integrated circuit device comprising: first MISFETs for selecting memory cells formed on the principal surface of a semiconductor substrate; polycrystal silicon plugs formed in a first insulation film and arranged on one of the source/drain regions of each of the first MISFETs; and bit lines arranged on a second insulation film on the first insulation film; wherein first contact holes are formed to pass through the second insulation film; and the bit lines and the polycrystal silicon plugs are connected respectively by way of first plugs formed in the respective first contact holes.

6. A semiconductor integrated circuit device according to claim 5, wherein the surface of the first insulation film and that of the second insulation film are planarized at least in a region where the first MISFETs are formed; and the surface of the first plugs and that of the second insulation film are located on a same plane.

7. A semiconductor integrated circuit device according to claim 5, wherein the film thickness of the bit lines is not greater than a half of the bore of the first contact holes.

8. A semiconductor integrated circuit device according to claim 5, wherein the width of the bit lines is not greater than the bore of the first contact holes.

9. A semiconductor integrated circuit device according to claim 5, wherein the bit lines are made of a material that can be selectively etched relative to the first plugs.

10. A semiconductor integrated circuit device according to claim 5, wherein the bit lines are made of a single layer film of tungsten or molybdenum; and the first plugs are made of a laminate film having a titanium nitride layer and a tungsten layer, or of titanium nitride or of tungsten nitride film.

11. A semiconductor integrated circuit device according to claim 5, wherein it further comprises second MISFETs for peripheral circuits formed on the principal surface of a semiconductor substrate and wires of a first wiring layer arranged on the second insulation film; second contact holes being formed to pass through the first and second insulation films; the wires of the first wiring layer and the source/drain regions or the gate electrodes of the second MISFETs or the principal surface of the semiconductor substrate being electrically connected by way of second plugs formed respectively in the second contact holes; the first and second plugs being made of a same material; and the first wiring layer and the bit lines being made of a same material.

12. A semiconductor integrated circuit device according to claim 11, wherein the surface of the first insulation film and that of the second insulation film are planarized over the entire surface of the semiconductor substrate; and the surface of the first plugs and that of the second insulation film are located on a same plane.

13. A semiconductor integrated circuit device according to claim 11, wherein the bit lines and the first wiring layer are made of a single layer film of tungsten or molybdenum; and the first and second plugs are made of a laminate film having a titanium nitride layer and a tungsten layer, or of titanium nitride or of tungsten nitride.

14. A semiconductor integrated circuit device according to claim 11, wherein a silicide film of an element selected from titanium, tungsten and cobalt containing an impurity or impurities, or a cobalt silicide film containing no impurity is formed in the contact areas of the first plugs and the polycrystal silicon plugs or in those of the second plugs and the source/drain regions or the gate electrodes of the second MISFETs or the principal surface of the semiconductor substrate; the impurity or impurities being one or more than one elements selected from nitrogen, oxygen, carbon and germanium; and a concentration of the impurity or impurities being between 1 atomic % and 13 atomic %.

15. A semiconductor integrated circuit device according to claim 14, wherein the impurity is nitrogen, and the concentration of nitrogen being between 1 atomic % and 3 atomic %.

16. A semiconductor integrated circuit device according to claim 11, wherein a silicide film of an element selected from titanium, tungsten and cobalt is formed in the contact areas of the first plugs and the polycrystal silicon plugs, or in those of the second plugs and the source/drain regions or the gate electrodes of the second MISFETs or the principal surface of the semiconductor substrate, or in the surface areas of the sources/drains of the second MISFETs; and the film thickness of the silicide film in any of the contact areas and the surface areas is between 15 and 30 nm.

17. A semiconductor integrated circuit device according to claim 16, wherein the second MISFETs include p-channel type MISFETs; and the film thickness of the silicide film formed on the surface areas of the sources/drains of the p-channel type MISFETs or in the contact areas of the bottoms of the second plugs and the source/drain regions of the p-channel type MISFETs is between 15 and 30 nm.

18. A semiconductor integrated circuit device comprising: first MISFETs for selecting memory cells arranged on the principal surface of a semiconductor substrate; polycrystal silicon plugs formed in a first insulation film and arranged on one of the source/drain regions of each of the first MISFETs; a second insulation film formed on the first insulation film; and bit lines connected to the respective polycrystal silicon plugs by way of respective first contact holes formed to pass through the second insulation film; wherein thickness L1 of the bit lines, distance L2 obtained by adding the thickness of the second insulation film and the thickness L1 of the bit lines, and bore D of the first contact holes show a relationship of L1×(1+OVE)<L2 and L1>D/2 (where OVE is the extent of overetching of the bit lines in the patterning process).

19. A semiconductor integrated circuit device according to claim 18, wherein the width of the bit lines is not greater than the bore of the first contact holes.

20. A semiconductor integrated circuit device containing: a memory cell region having first MISFETs for selecting memory cells arranged in array on a principal surface of a semiconductor substrate; a direct peripheral circuit region formed along the periphery of the memory cell region; an indirect peripheral circuit region arranged along the periphery of the direct peripheral circuit region; and contact hole formed in an insulating film over the principal surface of the direct or indirect peripheral circuit region; wherein the bore of the contact holes is identical both in the direct peripheral circuit region and in the indirect peripheral circuit region.

21. A semiconductor integrated circuit device according to claim 20, wherein the aspect ratio of the contact holes is identical throughout the memory cell region, the direct peripheral circuit region and the indirect peripheral circuit region.

22. A semiconductor integrated circuit device having first MISFETs for selecting memory cells formed on the principal surface of a semiconductor substrate and second MISFETs for peripheral circuits formed on the surface, comprising: polycrystal silicon plugs formed in a first insulation film and arranged on one of the source/drain regions of each of the first MISFETs; bit lines arranged on a second insulation film and electrically connected to the respective polycrystal silicon plugs by way of respective contact holes formed to pass through the second insulation film arranged on the first insulation film; and wires of a first wiring layer arranged on the second insulation film and electrically connected to the source/drain regions of the second MISFETs respectively by way of second contact holes formed to pass through the first and second insulation films; wherein a silicide film of an element selected from titanium, tungsten and cobalt is formed in the contact areas of the first plugs and the polycrystal silicon plugs, or in those of the second plugs and the source/drain regions or the gate electrodes of the second MISFETs or the principal surface of the semiconductor substrate, or in the surface areas of the sources/drains of the second MISFETs; and the film thickness of the silicide film in any of the contact areas and the surface areas is between 15 and 30 nm.

23. A semiconductor integrated circuit device according to claim 22, wherein the second MISFETs include p-channel type MISFETs; and the film thickness of the silicide film formed on the surface areas of the sources/drains of the p-channel type MISFETs or in the contact areas of the wires of the first wiring layer and the source/drain regions of the p-channel type MISFETs is between 15 and 30 nm.

24. A method of manufacturing a semiconductor integrated circuit device, comprising the steps of: (a) forming first MISFETs for selecting memory cells and a first insulation film for covering the first MISFETS, and etching the first insulation film in order to have openings on at least one of the source/drain regions of each of the first MISFETs; (b) depositing a polycrystal silicon film on the surface of the semiconductor substrate to fill the openings of the first insulation film and forming polycrystal silicon plugs electrically connected to the source/drain regions of the first MISFETs by removing the polycrystal silicon film on the first insulation film; (c) forming a second insulation film on the first insulation film and then forming first contact holes in the second insulation film by etching the second insulation film in order to expose the surface of polycrystal silicon plugs; (d) depositing a metal film containing titanium, tungsten or cobalt as principal ingredient and one or more than one impurities selected from nitrogen, oxygen, carbon and germanium, or a cobalt film containing no impurity on the bottom of the first contact holes and on the second insulation film, and then heat-treating the metal film; (e) depositing a first electro-conductive film on the metal film or the cobalt film, whichever appropriate, to fill the first contact holes; and (f) forming bit lines by etching the first electro-conductive film and the metal film or the cobalt film.

25. A method of manufacturing a semiconductor integrated circuit device according to claim 24, wherein the silicide film formed by the heat treatment in the contact areas of the metal film or the cobalt film, whichever appropriate, operates as etching stopper in the subsequent etching step.

26. A method of manufacturing a semiconductor integrated circuit device according to claim 24, wherein the pattern width of each bit lines is not greater than the bore of the first contact holes.

27. A method of manufacturing a semiconductor integrated circuit device according to claim 24, wherein the impurity concentration of the metal film is between 1 atomic % and 13 atomic %.

28. A method of manufacturing a semiconductor integrated circuit device according to claim 27, wherein the impurity is nitrogen and the nitrogen concentration of the metal film is between 1 atomic % and 3 atomic %.

29. A method of manufacturing a semiconductor integrated circuit device according to claim 24, wherein the first electro-conductive film is a laminate film having a titanium nitride layer and a tungsten layer.

30. A method of manufacturing a semiconductor integrated circuit device according to claim 24, wherein second MISFETs for peripheral circuits are formed in the step of forming the first MISFETs; second contact holes for electrically connecting to the source/drain regions or the gate electrodes of the second MISFETs or the principal surface of the semiconductor substrate are formed in the step of forming the first contact holes or immediately before or after the step of forming the first contact holes; a first wiring layer for peripheral circuits is formed in the step of forming the bit lines.

31. A method of manufacturing a semiconductor integrated circuit device, comprising the steps of: (a) forming first MISFETs for selecting memory cells and a first insulation film for covering the first MISFETS, and etching the first insulation film in order to have openings on at least one of the source/drain regions of each of the first MISFETs; (b) depositing a polycrystal silicon film on the surface of the semiconductor substrate to fill the openings of the first insulation film and forming polycrystal silicon plugs electrically connected to the source/drain regions of the first MISFETs by removing the polycrystal silicon film on the first insulation film; (c) forming a second insulation film on the first insulation film and then forming first contact holes in the second insulation film by etching the second insulation film in order to expose the surface of polycrystal silicon plugs; (d) depositing a first electroconductive film to fill the first contact holes and forming first plugs made of the first electro-conductive film in the first contact holes by removing the first electro-conductive film on the second insulation film; (e) depositing a second electro-conductive film on the first plugs and the second insulation film; and (f) patterning the second electroconductive film to produce bit lines.

32. A method of manufacturing a semiconductor integrated circuit device according to claim 31, wherein the first insulation film is planarized by means of a CMP technique before the step of etching the first insulation film; and the first plugs are formed by polishing the first electro-conductive film by means of a CMP technique.

33. A method of manufacturing a semiconductor integrated circuit device according to claim 31, wherein the film thickness of the second electro-conductive film is not greater than the bore of the first contact holes.

34. A method of manufacturing a semiconductor integrated circuit device according to claim 31, wherein the width of the bit lines is not greater than the bore of the first contact holes.

35. A method of manufacturing a semiconductor integrated circuit device according to claim 31, wherein the second electro-conductive film is made of a material having an etching selectivity relative to the first plugs.

36. A method of manufacturing a semiconductor integrated circuit device according to claim 31, wherein the first electro-conductive film is a laminate film including a titanium nitride film and a tungsten film or a single layer film of titanium nitride or tungsten nitride; and the second electro-conductive film is a single layer film of tungsten or molybdenum.

37. A method of manufacturing a semiconductor integrated circuit device according to claim 31, wherein second MISFETs are formed for peripheral circuits in the step of forming the first MISFETs; and second contact holes for electrically connecting to the source/drain regions of the second MISFETs are formed in the step of forming the first contact holes or immediately before or after the step of forming the first contact holes; second plugs made of the first electro-conductive film are formed in the second contact holes in the step of forming the first plugs; and a first wiring layer made of the second electro-conductive film is formed for peripheral circuits in the step of forming the bit lines.

38. A method of manufacturing a semiconductor integrated circuit device according to claim 37, wherein it further comprises; a step of depositing a metal film containing titanium, tungsten or cobalt as principal ingredient and one or more than one impurities selected from nitrogen, oxygen, carbon and germanium to a concentration between 1 atomic % and 13 atomic % or a cobalt film containing no impurity on the bottom of the first and second contact holes and on the second insulation film, and then heat-treating the metal film before forming the first and second plugs.

39. A method of manufacturing a semiconductor integrated circuit device according to claim 37, wherein it further comprises: a step of depositing a metal film containing titanium, tungsten or cobalt as principal ingredient to a film thickness between 10 and 20 nm on the bottom of the first and second contact holes and on the second insulation film, and then heat-treating the metal film before forming the first and second plugs.

40. A method of manufacturing a semiconductor integrated circuit device according to claim 37, wherein it further comprises: a step of depositing a film of silicide of titanium, tungsten or cobalt to a film thickness between 15 and 30 nm on the bottom of the first and second contact holes and on the second insulation film, and then heat-treating the metal film before forming the first and second plugs.

41. A method of manufacturing a semiconductor integrated circuit device according to claim 37, wherein it further comprises: a step of depositing a metal film containing titanium, tungsten or cobalt as principal ingredient and then a silicon film having a film thickness smaller than that of the metal film on the bottom of the first and second contact holes and on the second insulation film, and then heat-treating the metal film before forming the first and second plugs.

42. A method of manufacturing a semiconductor integrated circuit device according to claim 37, wherein it further comprises: a step of depositing a metal film containing titanium, tungsten or cobalt as principal ingredient on the bottom of the first and second contact holes and on the second insulation film, and annealing the metal film in an atmosphere of silicon hydride gas before forming the first and second plugs.

43. A method of manufacturing a semiconductor integrated circuit device according to claim 39, wherein the unreacted titanium, tungsten or cobalt is selectively removed by etching after the step of heat-treating the metal film.

44. A method of manufacturing a semiconductor integrated circuit device according to claim 40, wherein the unreacted titanium, tungsten or cobalt is selectively removed by etching after the step of heat-treating the metal film.

45. A method of manufacturing a semiconductor integrated circuit device according to claim 41, wherein the unreacted titanium, tungsten or cobalt is selectively removed by etching after the step of heat-treating the metal film.

46. A method of manufacturing a semiconductor integrated circuit device according to claim 42, wherein the unreacted titanium, tungsten or cobalt is selectively removed by etching after the step of heat-treating the metal film.

47. A method of manufacturing a semiconductor integrated circuit device comprising the steps of: (a) forming MISFETs on the principal surface of a semiconductor substrate and then an insulation film for covering the MISFETs; (b) etching the insulation film in order to have openings on the source/drain regions of the MISFETs; (c) depositing an electro-conductive film to fill the openings, forming wires; and (d) depositing a metal film containing titanium, tungsten or cobalt as principal ingredient to a film thickness between 10 and 20 nm on the bottom of the contact holes and on the insulation film prior to forming said electro-conductive film, and heat-treating it.

48. A method of manufacturing a semiconductor integrated circuit device comprising the steps of: (a) forming MISFETs on the principal surface of a semiconductor substrate and then an insulation film for covering the MISFETs; (b) etching the insulation film in order to have openings on the source/drain regions of the MISFETs; (c) depositing an electro-conductive film to fill the openings, forming wires; and (d) depositing a film of silicide of titanium, tungsten or cobalt to a film thickness between 15 and 30 nm on the bottom of the contact holes and on the insulation film prior to forming said electro-conductive film.

49. A method of manufacturing a semiconductor integrated circuit device comprising the steps of: (a) forming MISFETs on the principal surface of a semiconductor substrate and then an insulation film for covering the MISFETs; (b) etching the insulation film in order to have openings on the source/drain regions of the MISFETs; (c) depositing an electro-conductive film to fill the openings, forming wires; and (d) depositing a metal film containing titanium, tungsten or cobalt as principal ingredient and then a silicon film having a film thickness smaller than that of the metal film on the bottom of the contact holes and on the insulation film prior to forming said electro-conductive film, and heat-treating them.

50. A method of manufacturing a semiconductor integrated circuit device comprising the steps of: (a) forming MISFETs on the principal surface of a semiconductor substrate and then an insulation film for covering the MISFETs; (b) etching the insulation film in order to have openings on the source/drain regions of the MISFETs; (c) depositing an electro-conductive film to fill the openings, forming wires; and (d) depositing a metal film containing titanium, tungsten or cobalt as principal ingredient on the bottom of the contact holes and on the insulation film, and annealing the metal film in an atmosphere of silicon hydride gas prior to forming said electro-conductive film.

51. A method of manufacturing a semiconductor integrated circuit device according to claim 47, wherein the unreacted titanium, tungsten or cobalt is selectively removed by etching after the step of heat-treating the metal film.

52. A method of manufacturing a semiconductor integrated circuit device according to claim 47, wherein the electro-conductive film is a laminate film of titanium nitride and tungsten, or a three-layered laminate film of titanium, titanium nitride and tungsten.

53. A method of manufacturing a semiconductor integrated circuit device according to claim 48, wherein the unreacted titanium, tungsten or cobalt is selectively removed by etching after the step of heat-treating the metal film.

54. A method of manufacturing a semiconductor integrated circuit device according to claim 48, wherein the electro-conductive film is a laminate film of titanium nitride and tungsten, or a three-layered laminate film of, titanium, titanium nitride and tungsten.

55. A method of manufacturing a semiconductor integrated circuit device according to claim 49, wherein the unreacted titanium, tungsten or cobalt is selectively removed by etching after the step of heat-treating the metal film.

56. A method of manufacturing a semiconductor integrated circuit device according to claim 49, wherein the electro-conductive film is a laminate film of titanium nitride and tungsten, or a three-layered laminate film of titanium, titanium nitride and tungsten.

57. A method of manufacturing a semiconductor integrated circuit device according to claim 50, wherein the unreacted titanium, tungsten or cobalt is selectively removed by etching after the step of heat-treating the metal film.

58. A method of manufacturing a semiconductor integrated circuit device according to claim 50, wherein the electro-conductive film is a laminate film of titanium nitride and tungsten, or a three-layered laminate film of titanium, titanium nitride and tungsten.

59. A method of manufacturing a semiconductor integrated circuit device, comprising the steps of: (a) forming MISFETs on the principal surface of a semiconductor substrate; (b) depositing a metal film containing titanium, tungsten or cobalt as principal ingredient to a film thickness between 10 and 20 nm in areas covering at least the source/drain regions of the MISFETs; (c) heat-treating the metal film to form a silicide film in areas contacting the silicon; (d) selectively removing the unreacted titanium, tungsten or cobalt by etching; (e) forming an insulation film for covering the MISFETS; (f) etching the insulation film on the source/drain regions of the MISFETs so as to produce contact holes in the insulation film; and (g) depositing an electro-conductive film to fill the contact holes, and forming wires.

60. A method of manufacturing a semiconductor integrated circuit device according to claim 59, wherein the electro-conductive film is a laminate film of titanium nitride and tungsten or a three-layered laminate film of titanium, titanium nitride and tungsten.

61. A method of a semiconductor integrated circuit device having a first MISFET for a memory cell and a second MISFET for a peripheral circuit, comprising the steps of: (a) forming a first MISFET at a first portion of a semiconductor substrate and a second MISFET at a second portion of said semiconductor substrate; (b) forming a first insulating film covering said first and second MISFETs; (c) performing a first etching to said first insulating film in order to form a first contact hole to expose one of source and drain regions of said first MISFET; (d) depositing a polycrystal silicon film in said first contact hole and removing said polycrystal silicon film on said first insulating film so as to form a first plug electrode in said first contact hole; (e) forming a second insulating film over said first insulating film and said first plug electrode; (f) performing a second etching to said second insulating film in order to form a second contact hole to expose the surface of said first plug electrode, and performing said second etching to said second and first insulating films in order to form a third contact hole to expose one of source and drain regions of said second MISFET; (g) depositing a first metal film in said second and third contact holes in order to fill said second and third contact holes, and etching said first metal film on said second insulating film and leaving said first metal film into said second and third contact holes so as to form a second plug electrode in said second contact hole and a third plug electrode in said third contact hole; and (h) depositing a second metal film over said second insulating film and patterning said second metal film in order to form a bit line conductor electrically connected to said second plug electrode and a wiring conductor electrically connected to said third plug electrode.

DETAILED DESCRIPTION OF THE PREFERRED EMBODIMENTS

Now, the invention will be described in greater detail by referring to the accompanying drawings that illustrate preferred embodiments of the invention. Note that, throughout the drawings, same or similar components are denoted respectively by the same reference symbols and will not be described repeatedly.

(Embodiment 1)

Figure 1:
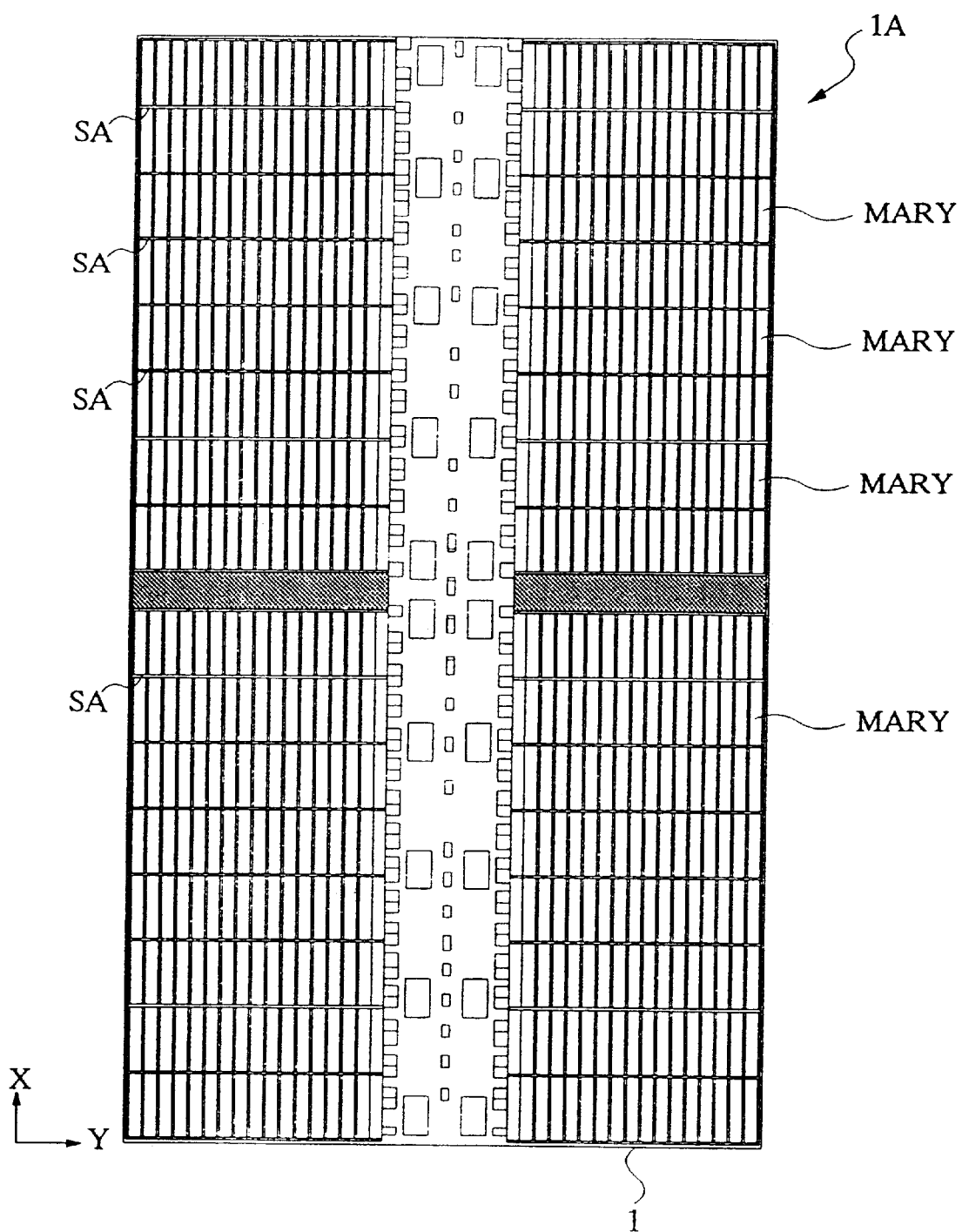
FIG. 1 is a schematic plan view of an entire semiconductor chip on which embodiment 1 of DRAM according to the invention is formed.

FIG. 1 is a schematic plan view of an entire semiconductor chip on which embodiment 1 of DRAM according to the invention is formed. As shown, a large number of memory arrays MARY are arranged along X-direction (or the long edges of semiconductor chip 1A) and Y-direction (or the short edges of semiconductor chip 1A) to form a matrix on the principal surface of a semiconductor chip 1A made of mono-crystal silicon. A sense amplifier SA is arranged between any two adjacently located memory arrays MARY in the X-direction. Word drivers WD, control circuits including a data line selection circuit, input/output circuits and bonding pads are arranged in a central area of the principal surface of the semiconductor chip 1A.

Figure 2:
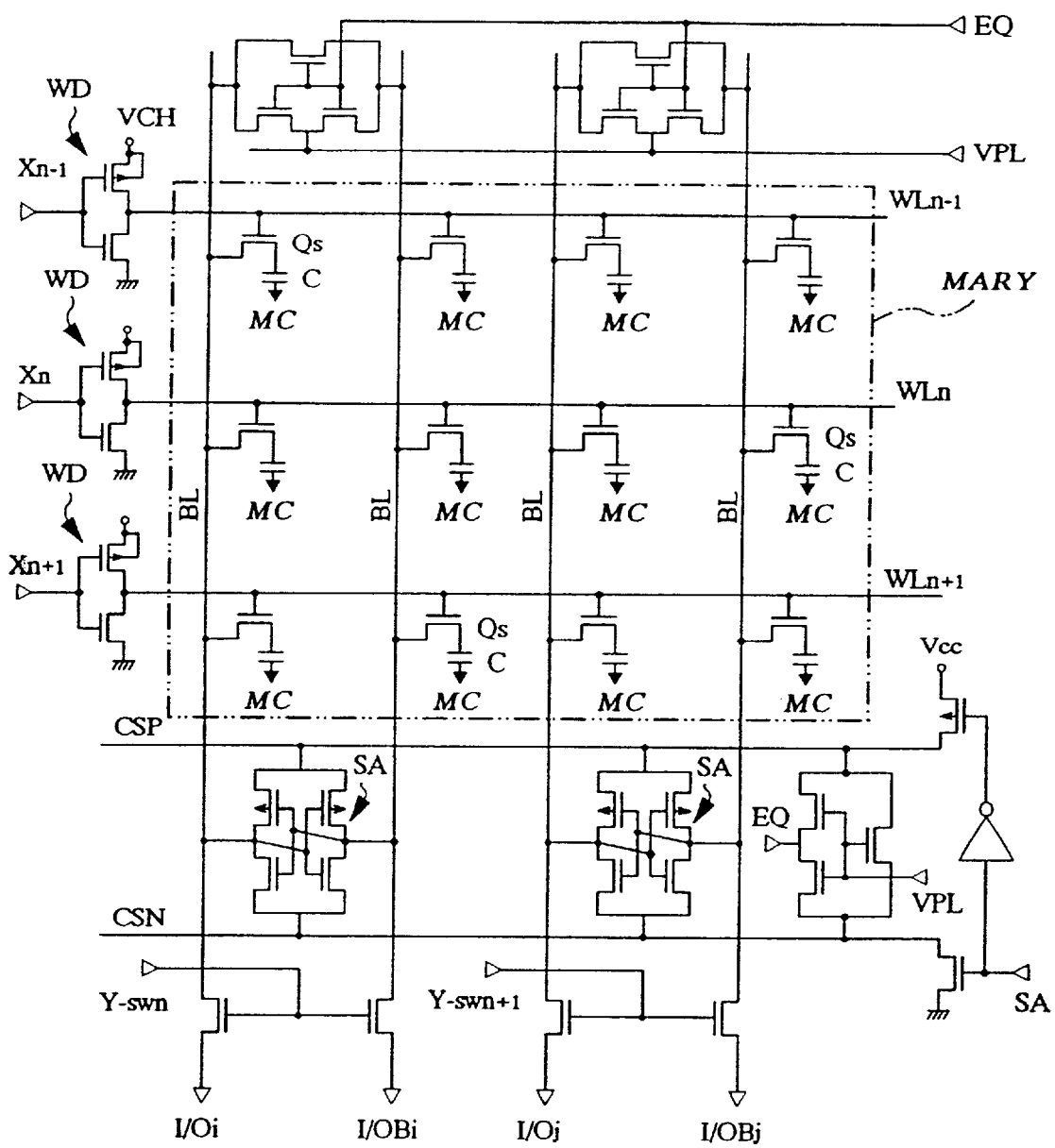
FIG. 2 is an equivalent circuit diagram of the embodiment 1 of DRAM.

FIG. 2 is an equivalent circuit diagram of the embodiment 1 of DRAM according to the invention. As shown, each of the memory arrays (MARY) of the DRAM comprises a plurality of word lines WL ($WL_{n-1}$, $WL_n$, $WL_{n+1}$, ...), a plurality of bit lines BL and a plurality of memory cells (MC) arranged respectively at the crossings of the word lines WL and the bit lines BL. A memory cell stores 1-bit information and comprises a capacitor C and a selector MISFET Qs connected to it in series. The selector MISFET Qs is electrically connected to the capacitor C by way of either the source or the drain thereof and the remaining drain or source, whichever appropriate, is electrically connected to a corresponding bit line BL. The word line WL is connected at an end thereof to a word driver WD and the bit line BL is connected at an end thereof to a sense amplifier SA.

Figure 3:
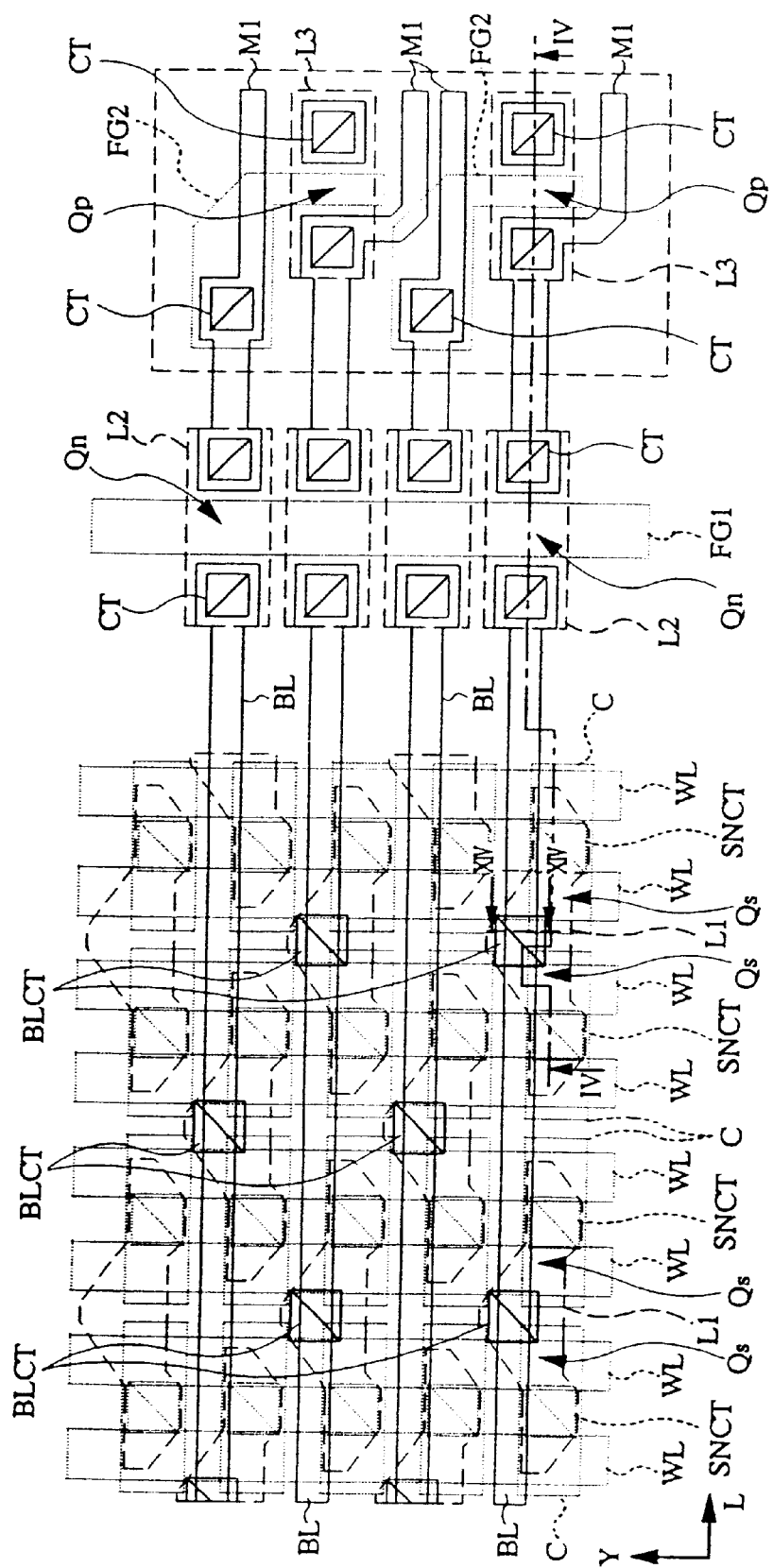
FIG. 3 is an enlarged schematic partial plan view of the semiconductor chip of FIG. 1.

FIG. 3 is an enlarged schematic partial plan view of the semiconductor chip of FIG. 1. Note that, in FIG. 3, bit lines BL, bit line contact holes BLCT and wires M1 of the first wiring layer are indicated by solid lines and all the remaining components are indicated by broken or dotted lines. The left half of FIG. 3 shows part of a memory array MARY whereas the right half of FIG. 3 shows n-channel MISFETs Qn for direct peripheral circuits and p-channel MISFETs Qp constituting part of a sense amplifier SA. The n-channel MISFETs Qn operate as shared MISFETs.

The memory array MARY contains active regions L1 and word lines WL are arranged along the Y-direction, whereas bit liens BL are arranged along the X-direction. In areas where the word lines WL and the active regions L1 overlap each other, the word lines WL operate as gate electrodes of the corresponding selector MISFETs Qs. A bit line contact hole BLCT is formed in a central area of each active region L1 where the active region L1 is sided by the areas of the adjacently located lines WL that operate as gate electrodes and the central area of the active region L1 and the corresponding bit line are connected to each other by way of the bit line contact hole BLCT. The opposite end areas of the active region L1 is connected to the corresponding capacitor C by way of a capacitor contact hole SNCT.

Active regions L2 and active regions L3 are formed in the peripheral circuit region of the memory array and n-channel MISFETs Qn that operate as shared MISFETs are arranged in respective areas where the active regions L2 and a gate wire FG overlap each other. One of the source/drain regions of each of the n-channel MISFETs Qn is connected to a bit line BL by way of a corresponding contact hole CT, whereas the other of the source/drain regions of the n-channel MISFET Qn is connected to a wire M1 of the first wiring layer also by way of a contact hole CT. A p-channel MISFET Qp constituting part of the corresponding sense amplifier SA is arranged in an area where an active region L3 and a gate wire FG2 overlap each other.

In this embodiment, the bit line contact holes BLCT shows an open structure relative to the respective bit lines BL. More specifically, the bit lines BL has a width smaller than the bore of the bit line contact holes BLCT and show a linear profile. Such bit lines BL would hardly give rise to interference to light used for exposure in a photolithography process and allows improvement in the resolution because of the linear profile. Additionally, the capacitance of each bit line can be reduced because of a relatively large gap separating adjacent bit lines. These and other characteristic features of bit lines facilitate the fine machining operations to which the bit lines are subjected and play a significant role in improving the sensitivity of the sense amplifiers SA relative to the reduction in the stored electric charge caused by the down-sizing of the device so that they are particularly advantageous for realizing DRAMs that are down-sized and integrated to an even higher degree.

Figure 4:
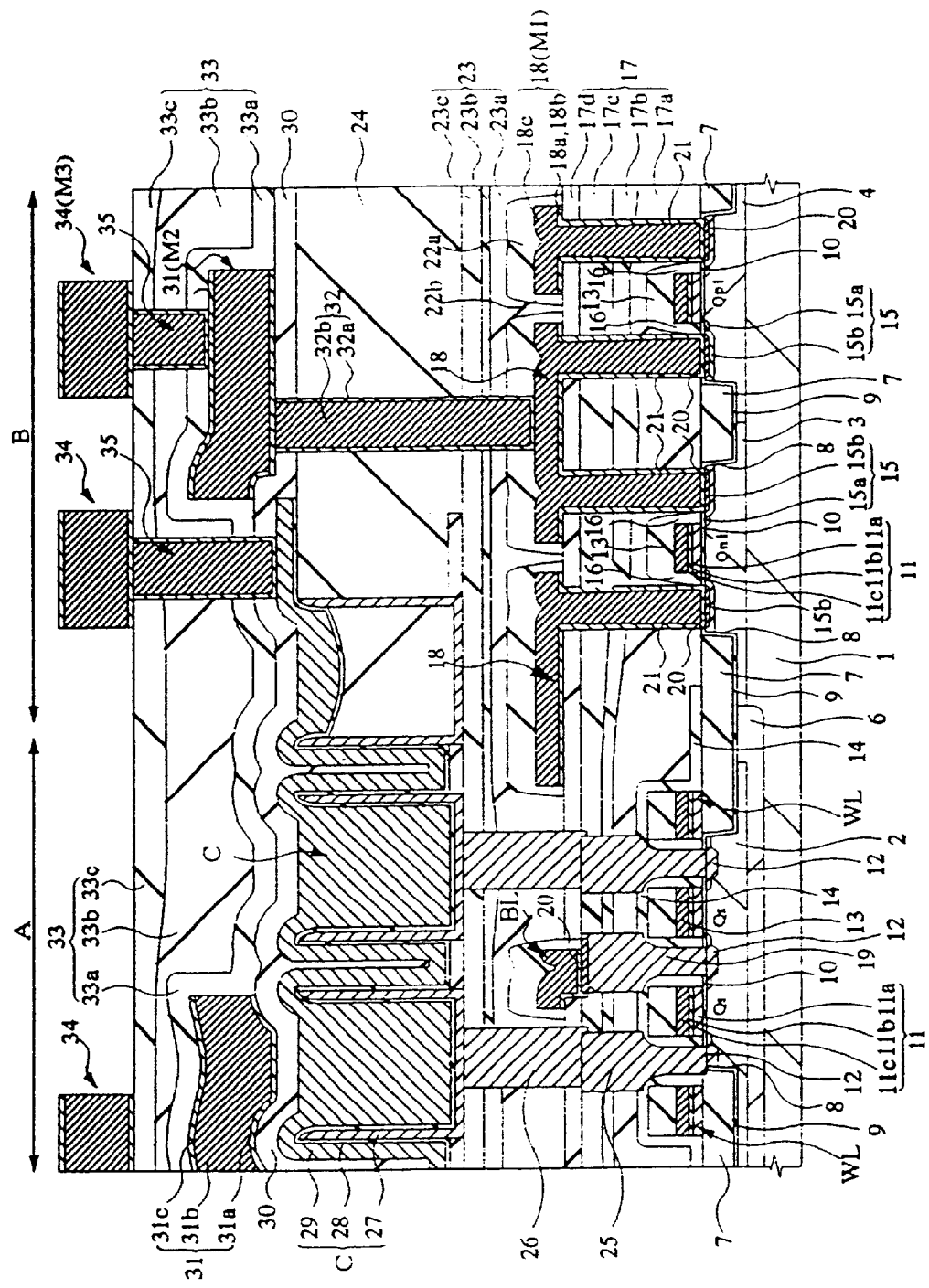
FIG. 4 is a schematic cross sectional view taken along line IV—IV in FIG. 3.

FIG. 4 is a schematic cross sectional view taken along line IV—IV in FIG. 3. In FIG. 4, reference symbol A denotes part of the region of memory arrays MARY and B denotes part of the region of peripheral circuits.

Referring to FIG. 4, a p-type well 2 is formed in the region A and a p-type well 3 and an n-type well 4 are formed in the region B on the principal surface of the semiconductor substrate 1 that is made of p-type mono-crystal silicon. Additionally, an n-type deep well 6 is formed to surround the p-type well 2. Each of the wells may be provided with a threshold voltage regulating layer.

An isolation region 7 is formed on the principal surface of each of the wells. The isolation region 7 is a film of silicon oxide, which is formed by way of a silicon oxide film 9 produced by thermal oxidation in a shallow groove 8 dug into the principal surface of the semiconductor substrate 1.

Selector MISFET Qs are formed for the DRAM on the principal surface of the p-type well. An n-channel MISFET Qn and a p-channel MISFET Qp are formed respectively on the principal surface of the p-type well 3 and that of the n-type well 4.

Each of the selector MISFETs Qs comprises a gate electrode 11 formed on the principal surface of the p-type well 2 by way of a gate insulation film 10 and impurity semiconductor regions 12 formed at opposite ends of the gate electrode 11 on the principal surface of the p-type well 2. The gate insulation film 10 is typically a silicon oxide film produced by thermal oxidation and having a film thickness typically between 7 and 8 nm. The gate electrode 11 may be a laminate film realized by sequentially laying, for example, a 70 nm thick polycrystal silicon film 11a, a 50 nm titanium nitride film 11b and a 100 nm thick tungsten film 11c. The impurity semiconductor region 12 is doped with an n-type impurity such as arsenic or phosphor.

A cap insulation film 13 of silicon nitride film is formed on the gate electrode 11 of the selector MISFET Qs and covered by a silicon nitride film 14. Note that the silicon nitride film 14 is present also on the lateral walls of the gate electrode 11 so that it may be utilized in the self-aligning process at the time of forming contact holes as will be described hereinafter. Note also that the gate electrode 11 of the selector MISFET Qs operates as word line of the DRAM, which word line WL is located on the upper surface of the isolation region 7.

On the other hand, the n-channel MISFET Qn and the p-channel MISFET Qp are formed respectively on the principal surface of the p-type well 3 and that of the n-type well 4 and each of them comprises a gate electrode 11 formed by way of a gate insulation film 10 and impurity semiconductor regions 15 formed at opposite ends of the gate electrode 11 on the principal surface of the related well. The gate insulation film 10 and the gate electrode 11 are identical with those of the above described selector MISFET Qs. Each of the impurity semiconductor regions 15 has a low concentration impurity region 15a and a high concentration impurity region 15b to show a so-called LDD (lightly doped drain) structure. The impurity semiconductor regions 15 are doped with an n-type impurity or a p-type impurity depending on the conductivity type of the related MISFET.

A cap insulation film 13 of silicon nitride film is formed on the gate electrode 11 of the n-channel MISFET Qn and that of the p-channel MISFET Qp and sided by side wall spacers 16 that are also made of silicon nitride film.

The selector MISFETs Qs, the n-channel MISFET Qn and the p-channel MISFET Qp are covered by an interlayer insulation film 17. The interlayer insulation film 17 may typically be a laminate film of an SOG (spin on glass) film 17a, a TEOS (tetramethoxysilane) oxide film 17b obtained by preparing a silicon oxide film by means of CVD, using TEOS for source gas (hereinafter referred to as TEOS oxide film), and planarizing the silicon oxide film and additional TEOS oxide films 17c and 17d. A bit line BL and a first wiring layer 18 are formed on the interlayer insulation film 17. The bit line BL and the first wiring layer 18 may typically be made of a laminate film of a titanium film 18a, a titanium nitride film 18b and a tungsten film 18c. With this arrangement, the electric resistance of the bit line BL and the first wiring layer 18 can be reduced to improve the performance of the DRAM. As will be described hereinafter, the bit line BL and the first wiring layer 18 are formed simultaneously to simplify the overall manufacturing process.

The bit line BL is connected to the impurity semiconductor region 12 that is shared by the paired selector MISFETs Qs by way of a plug 19. The plug 19 may typically be made of polycrystal silicon film doped with an n-type impurity. A titanium silicide film 20 is formed in an contact area connecting the plug 19 and the bit line BL to reduce the contact resistance between the bit line BL and the plug and improve the reliability of the contact.

The titanium silicide film 20 of this embodiment contains nitrogen to a concentration between 1 atomic % and 13 atomic %, preferably between 1 atomic % and 3 atomic %. As described earlier, the bit line contact hole BLCT shows an open structure relative to the bit line BL. As will be discussed hereinafter, the titanium silicide film 20 operates as etching stopper to prevent the plug 19 from being excessively etched when producing the bit line BL by patterning because the titanium silicide film 20 contains nitrogen to a concentration between 1 atomic % and 3 atomic %. Thus, no problem arises in the subsequent steps in terms of aligning and focusing to consequently increase the process margin and improve the yield and the reliability of manufacturing DRAMs. Additionally, the electric connection between the bit line BL and the plug 19 can be reliably maintained because the titanium silicide film 20 would not be etched even in transversal directions. While the conventional use of titanium silicide film containing no nitrogen, the film is etched to an excessive extent particularly in transversal directions during the operation of producing bit lines BL by patterning until a gap is produced between each bit line BL and a corresponding plug 19 to consequently reduce the reliability of the electric connection between the bit line BL and the plug 19. However, no such problem arises with the above described embodiment and the reliability of the electric connection and hence the operational reliability of the produced DRAM can be improved.

While the use of titanium silicide film containing nitrogen is described above, the nitrogen may be replaced by oxygen, carbon or germanium contained to a concentration level between 1 atomic % and 13 atomic %. Additionally, the titanium silicide film may be replaced by a tungsten silicide film. If a tungsten silicide film is used, it has to contain nitrogen, oxygen, carbon or germanium to a concentration between 1 atomic % and 13 atomic %. Alternatively, the titanium silicide film may be replaced by a cobalt silicide film that may or may not contain nitrogen, oxygen, carbon or germanium to a concentration between 1 atomic % and 13 atomic %. In other words, a cobalt silicide film that does not contain any of nitrogen, oxygen, carbon and germanium operates well as etching stopper when producing bit lines BL by patterning, although the etching-resistivity of the cobalt silicide film will be improved if it contains nitrogen, oxygen, carbon or germanium to a concentration between 1 atomic % and 13 atomic %. An improved etching-resistivity realized by using a titanium or tungsten silicide film containing nitrogen, oxygen, carbon or germanium or a cobalt silicide film that may or may not contain nitrogen, oxygen, carbon or germanium is based on the findings of the inventors of the present invention obtained as a result of a series of experiments. According to the results of the experiments, the rate of etching a titanium, tungsten or cobalt film is reduced by about one-third when nitrogen, oxygen, carbon or germanium is added thereto.

As will be discussed hereinafter, oxygen or carbon may enter a silicide film without intention during the process of forming the silicide film. Such migration takes place when organic gas that contains oxygen or carbon is used for source gas or when oxygen contained in the oxide film (silicon oxide film) formed on the surface of the silicon substrate is taken into the silicide film as a result of annealing the silicide film to reduce, if partly, the titanium, tungsten or cobalt of the silicide film. For the purpose of this embodiment, the silicide film may be made to contain an impurity such as oxygen or carbon to a concentration level between 1 atomic % and 13 atomic % by utilizing such natural migration of oxygen or carbon.

The first wiring layer 18 is connected to the impurity semiconductor region 15 of the n-channel MISFET Qn and that of the p-channel MISFET Qp by way of contact holes 21. Additionally, a titanium silicide film 20 is formed in the contact area connecting the first wiring layer 18 and each of the impurity semiconductor regions 15. As a result, the contact resistance between the first wiring layer 18 and each of the impurity semiconductor regions 15 is reduced to improve the reliability of the electric connection.

The titanium silicide film 20 formed in the contact area connecting the first wiring layer 18 and each of the impurity semiconductor regions 15 also contains nitrogen to a concentration level between 1 atomic % and 13 atomic %, preferably between 1 atomic % and 3 atomic %. The use of a nitrogen-containing titanium silicide film 20 significantly improve the thermal resistance of the contact area. Note that the nitrogen concentration is preferably between 1 atomic % and 3 atomic %. Any degradation in the thermal resistance appears as an increase in the contact resistance of the contact area or an increase in the leak current. However, the use of a nitrogen-containing titanium silicide film 20 as in the case of this embodiment does not give rise to any increase in the contact resistance nor in the leak current to reflect the findings of the inventors of the present invention obtained as a result of a series of experiments.

The nitrogen in the titanium silicide film 20 of the contact area of the first wiring layer 18 and each of the impurity semiconductor regions 15 may be replaced by oxygen, carbon or germanium that is also contained to a concentration between 1 atomic % and 13 atomic %. Additionally, the titanium silicide film may be replaced by a tungsten silicide film. If such is the case, the tungsten silicide film is required to contain nitrogen, oxygen, carbon or germanium to a concentration between 1 atomic % and 13 atomic %. The titanium silicide film may alternatively by replaced by a cobalt silicide film that is not necessarily required to contain nitrogen, oxygen, carbon or germanium to a concentration between 1 atomic % and 13 atomic %. In other words, the use of a cobalt silicide film containing any of nitrogen, oxygen, carbon and germanium can also improve the thermal resistance of the contact area. Note, however, that the use of a cobalt silicide film containing nitrogen, oxygen, carbon or germanium to a concentration between 1 atomic % and 13 atomic % can further improve the thermal resistance.

Such an improved thermal resistance is significant because no degradation occurs in the contact area during the heat treatment process for forming a capacitive insulation film for the capacitor C and hence the capacitive insulation film does not have to be subjected to restrictions in terms heat treatment. As a result, a capacitor C having a high storage capacity can be realized while suppressing any rise in the contact resistance and the leak current in the contact area.

The bit line BL and the first wiring layer 18 (M1) are covered by a cap insulation film 22a and side wall spacers 22b and further by an interlayer insulation film 23. The interlayer insulation film 23 may be a laminate typically comprising an SOG film 23a, a TEOS oxide film 23b planarized by CMP and another TEOS oxidation film 23c.

In FIG. 4, capacitors C for storing information are formed in the region A above the interlayer insulation film 23. An insulation film 24 is formed in the layer of the capacitors C located above the interlayer insulation film 23 in the region B. The insulation film 24 may be a silicon oxide film. As it is formed in the layer of the capacitors C, any undesired steps that may be attributable to the high position of the capacitors C would not be produced between the region A and the region B so that the depth of focus can show a wide margin for the photolithography process and make the device stably adapted to fine machining operations.

Each of the capacitors C comprises a lower electrode 27 connected to a plug 26 and further to a plug 25 that is to be connected to an impurity semiconductor region 12 other than the impurity semiconductor region 12 connected to the bit line BL of each of the selector MISFETs Qs, a capacitive insulation film 28 typically made of silicon nitride film and tantalum oxide and a plate electrode 29 typically made of titanium nitride.

A second wiring layer 31 (M2) is formed above the capacitors C with an insulation film 30 typically made of TEOS oxide film interposed therebetween. The second wiring layer 31 may be a laminate of a titanium film 31a, an aluminum film 31b and a titanium nitride film 31c.

The second wiring layer 31 is connected to the first wiring layer 18 by way of a plug 32, which plug may be a laminate of an adhesive layer 32a that is also a laminate of a titanium film and a titanium nitride film and a tungsten film 32b formed by CVD.

The second wiring layer 31 is covered by an interlayer insulation film 33 and a third wiring layer 34 (M3) similar to the second wiring layer 31 is formed on the interlayer insulation film 33. The interlayer insulation film 33 may be a laminate of a TEOS oxide film 33a, an SOG film 33b and another TEOS oxide film 33c. The third wiring layer 34 and the second wiring layer 31 are connected with each other by way of plugs 35 similar to the plug 32.

Now, a method of manufacturing the embodiment of DRAM will be described by referring to FIGS. 5 through 18, showing the embodiment in different manufacturing steps. In FIGS. 5 through 18, the embodiment is shown in cross section in different manufacturing steps.

Firstly, shallow grooves 8 are formed on the principal surface of a p-type semiconductor substrate 1. Then, the semiconductor substrate 1 is thermally oxidized to produce a silicon oxide film 9. The silicon oxide film is made to grow by deposition and then polished by a CMP technique to produce isolation regions 7, leaving the silicon oxide film only in the shallow grooves 8.

Figure 5:
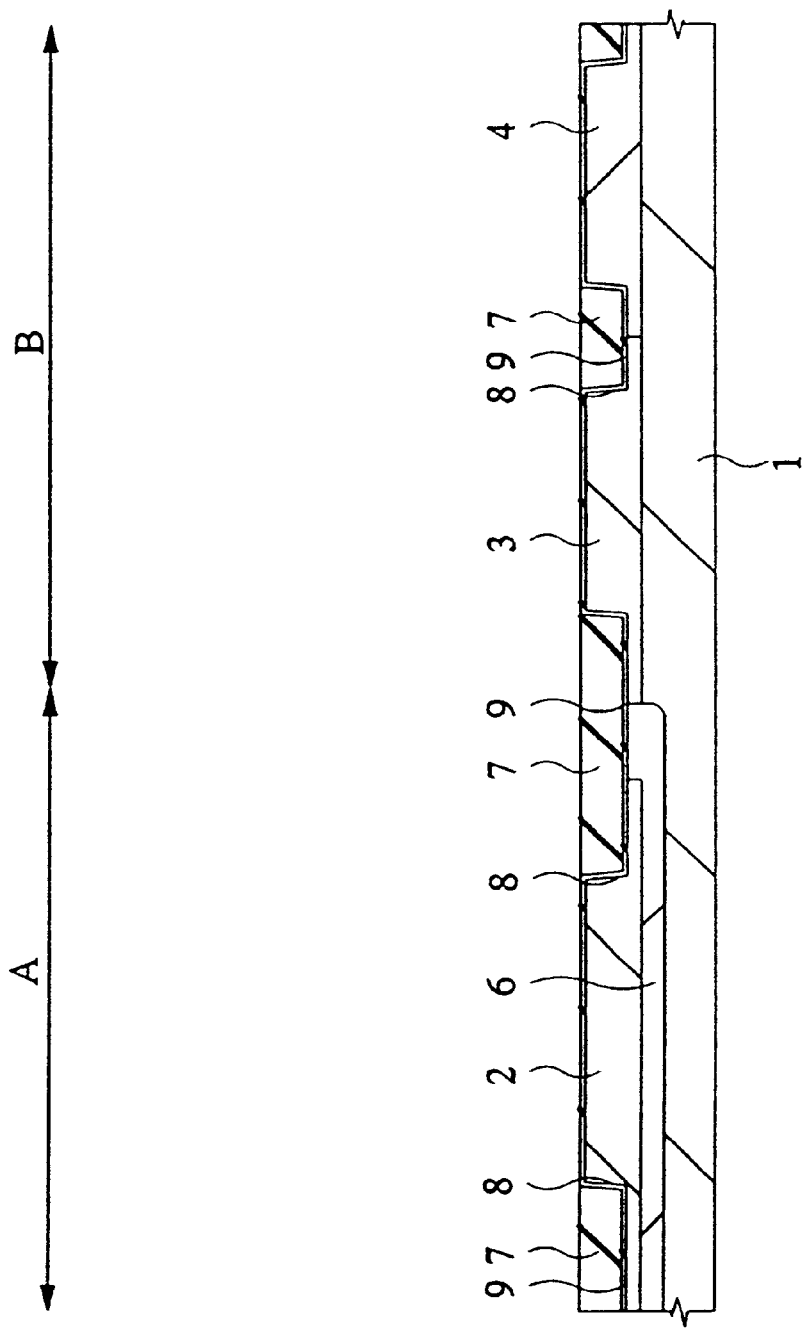
FIG. 5 is a schematic cross sectional view of embodiment 1 of DRAM, showing a step of manufacturing it.

Then, the semiconductor substrate is doped with an impurity by ion implantation, using photoresist as mask, to produce p-type wells 2, 3, n-type wells 4 and deep wells 6 (FIG. 5).

Figure 6:
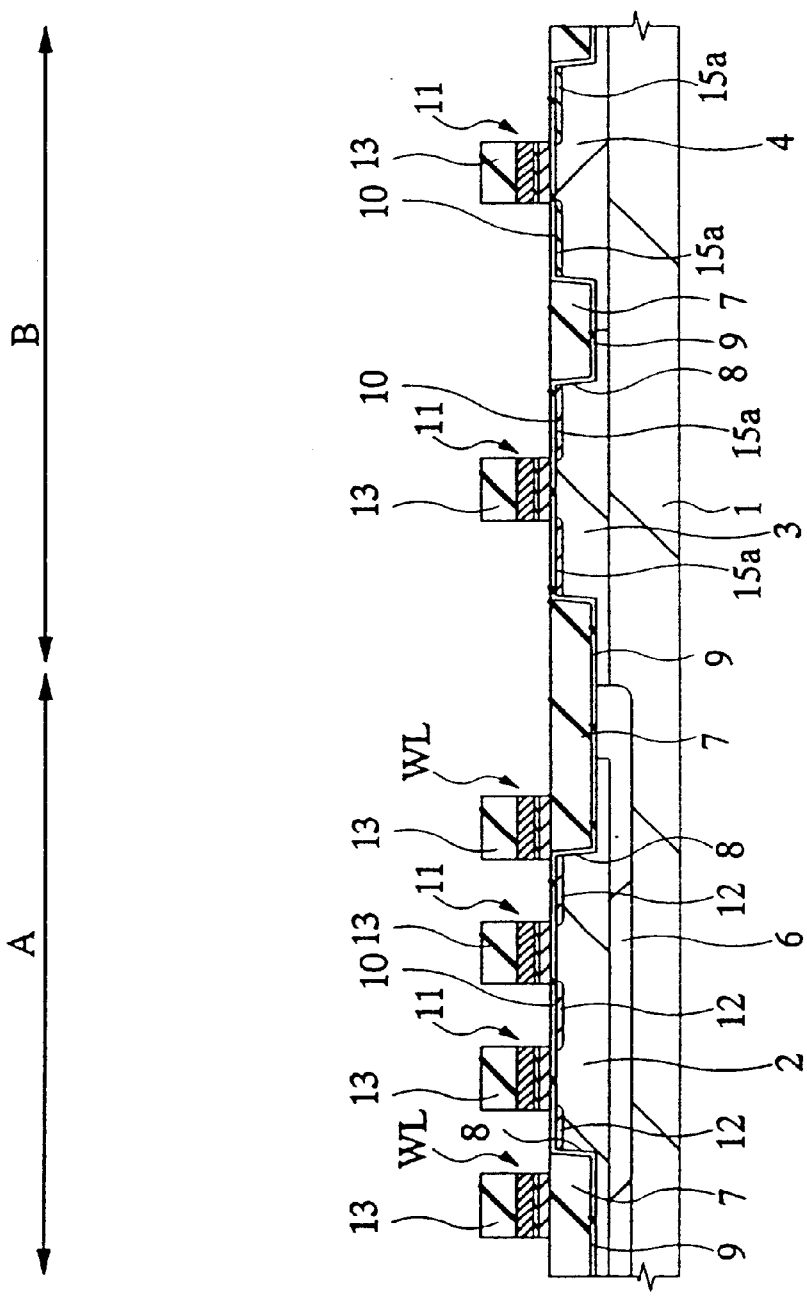
FIG. 6 is a schematic cross sectional view of embodiment 1 of DRAM similar to FIG. 5, showing a subsequent step of manufacturing it.

Thereafter, a gate insulation film 10 is formed by thermal oxidation in the active regions where the p-type wells 2, 3 and the n-type wells 4 and then a polycrystal silicon film, a titanium nitride film, a tungsten film and a silicon nitride film that are doped with an impurity are sequentially formed on the entire surface of the semiconductor substrate by deposition. Then, the silicon nitride film, the tungsten film, the titanium nitride film and the polycrystal silicon film are subjected to a patterning operation, using photolithography and etching, to produce gate electrodes 11 (word lines WL) and a cap insulation film 13. Then, the half-product is doped with an impurity by ion implantation, using the cap insulation film 13, the gate electrodes 11 and the photoresist as mask, to produce impurity semiconductor regions 12 and low concentration impurity regions 15a (FIG. 6).

Figure 7:
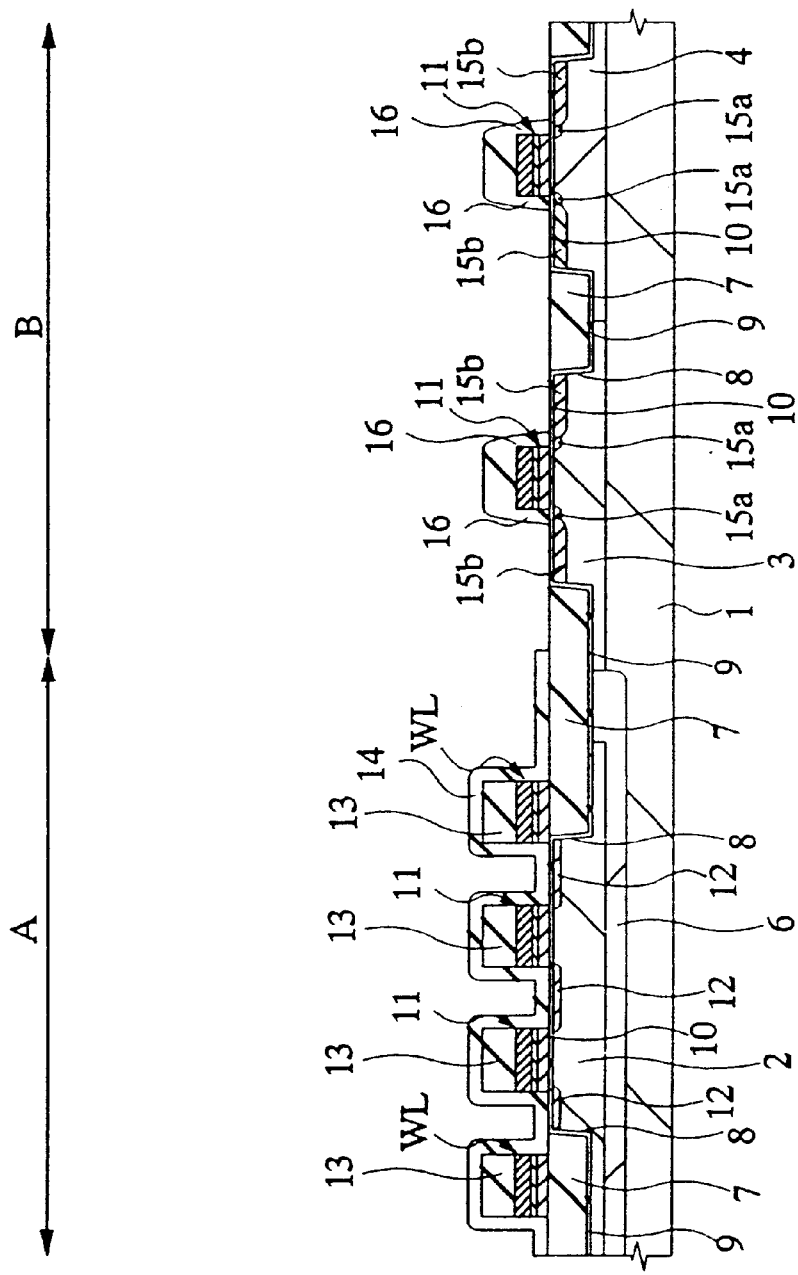
FIG. 7 is a schematic cross sectional view of embodiment 1 of DRAM similar to FIG. 6, showing a still subsequent step of manufacturing it.

Subsequently, a silicon nitride film (not shown) is formed on the entire surface of the semiconductor substrate 1 by deposition to produce a photoresist film (not shown) only in a region where memory cells are formed (region A). Then, the silicon nitride film is anisotropically etched, using the photoresist as mask, to produce a silicon nitride film 14 only in the region A on the semiconductor substrate 1 and, at the same time, side wall spacers 16 on the lateral walls of the gate electrodes 11 in the region B. Then, the half-product is doped with an impurity by implanting ions in a self-aligning fashion to produce high concentration impurity regions 15b (FIG. 7).

Then, after applying SOG on the entire surface of the semiconductor substrate i and allowing it to cure in order to produce an SOG film 17a, a TEOS oxide film 17b is formed thereon by deposition by means of CVD. The TEOS oxide film is then polished by CMP to planarize the surface. As a result, the focusing margin in a subsequent photolithography step can be improved to make it possible to cut fine contact holes. After cleansing the surface, another TEOS oxide film 17c is formed by deposition to complete the formation of an interlayer insulation film 17. The TEOS oxide film 17c is provided to repair the scratches on the TEOS oxide film 17 produced as a result of CMP.

Figure 8:
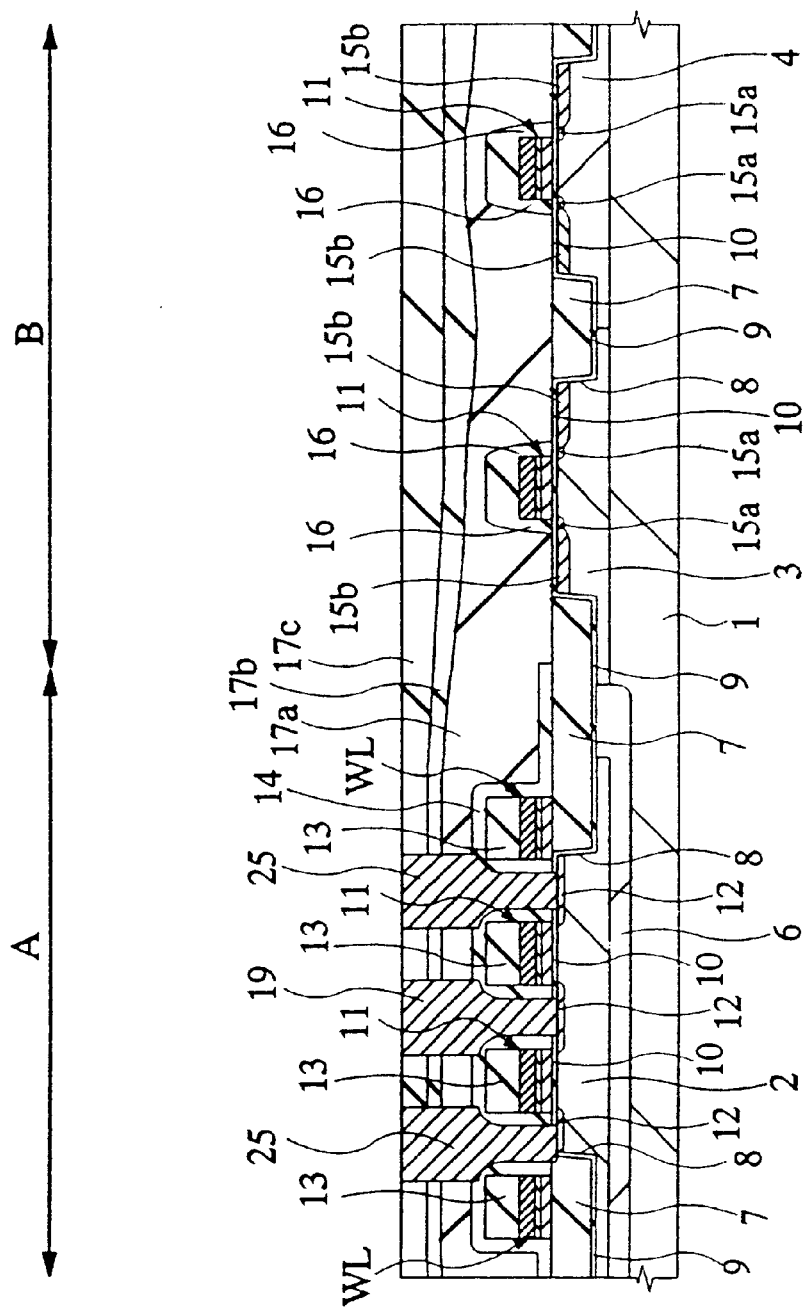
FIG. 8 is a schematic cross sectional view of embodiment 1 of DRAM similar to FIG. 7, showing a till subsequent step of manufacturing it.

Then, after cutting contact holes through the TEOS oxide films 17c, 17b and the SOG film 17a, an impurity-doped polycrystal silicon film is formed therein by deposition and polished by CMP to produce plugs 19, 25 (FIG. 8). The contact holes may be formed by a two-stage etching technique to prevent the semiconductor substrate 1 from being excessively etched.

Figure 9:
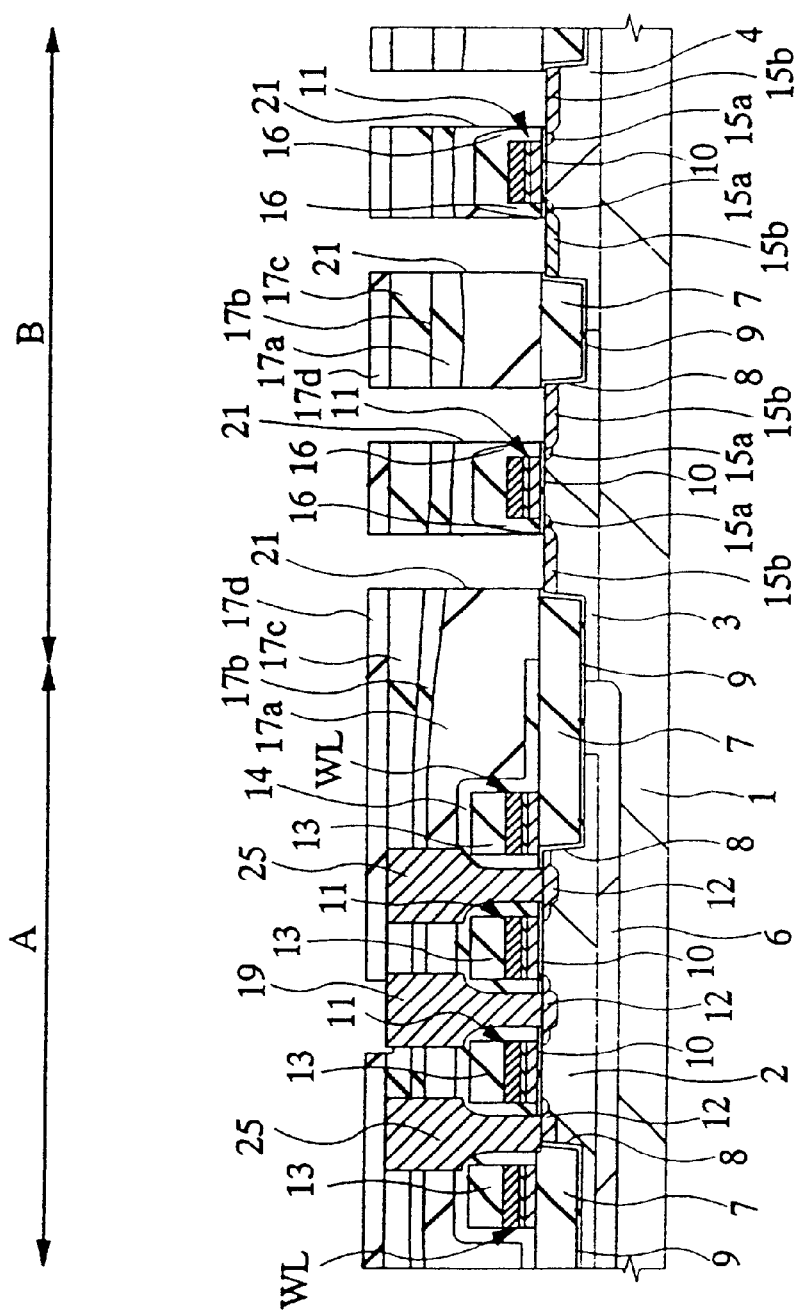
FIG. 9 is a schematic cross sectional view of embodiment 1 of DRAM similar to FIG. 8, showing a still subsequent step of manufacturing it.

After forming another TEOS oxide film 17d, an aperture is formed in the TEOS oxide film 17d until the plug connected to the bit line BL is exposed and then contact holes 21 are cut through the interlayer insulation film 17 until the impurity semiconductor region 15 of the n-channel MISFET Qn and that of the p-channel MISFET Qp become exposed (FIG 9).

Figure 10:
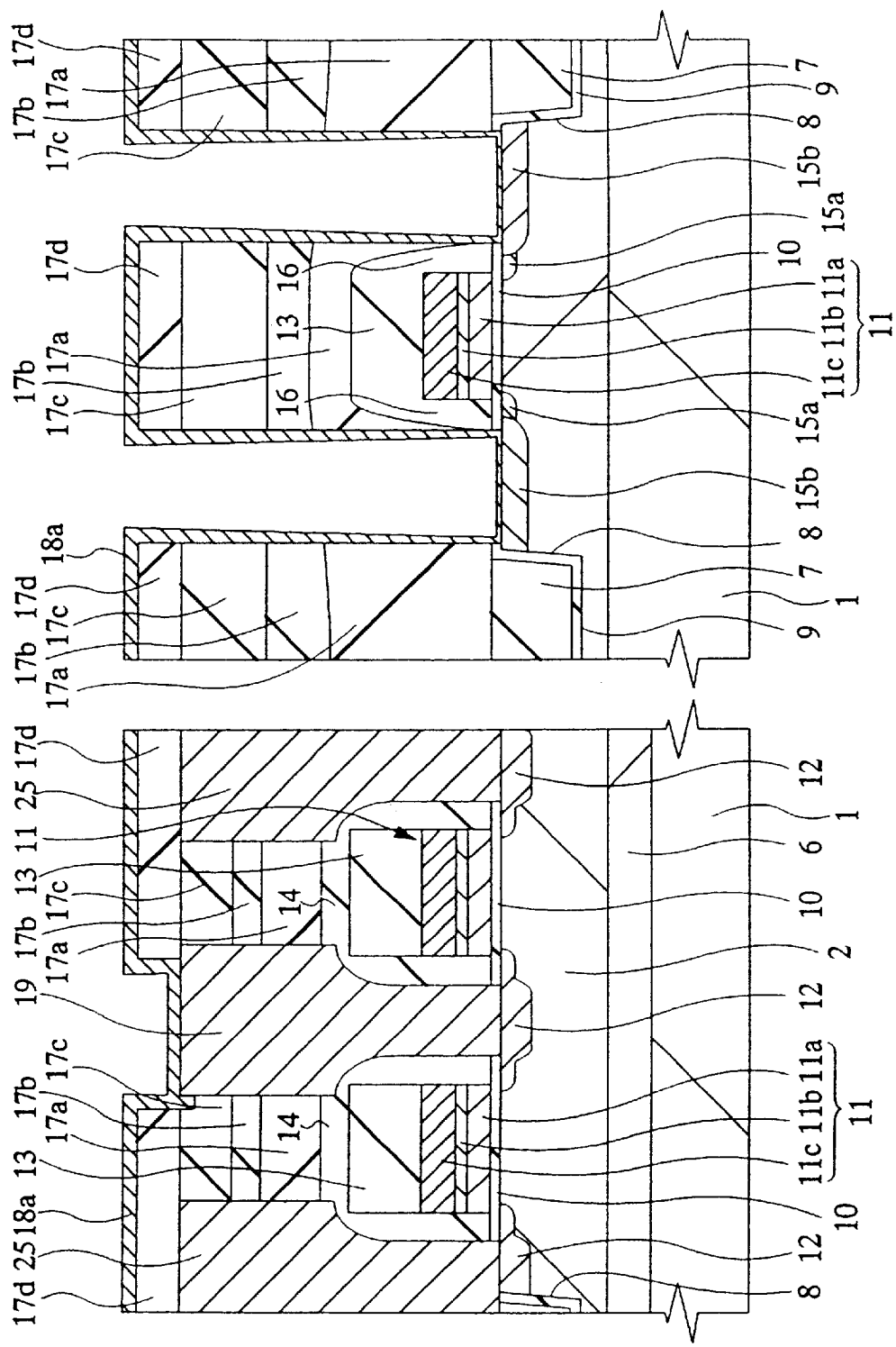
FIG. 10 is a schematic cross sectional view of embodiment 1 of DRAM similar to FIG. 9, showing a still subsequent step of manufacturing it.

Thereafter, a titanium film 18a is formed on the entire surface of the semiconductor substrate 1 by deposition. FIG. 10 shows an enlarged partial sectional view of the film deposit (FIG. 10). In FIG. 10, a bit line contact hole BLCT is shown in the left half, whereas contact holes CT for connecting the first wiring layer M1 and the principal surface of the semiconductor substrate 1 are shown in the right half.

The titanium film 18a is made to contain nitrogen to a concentration level between 1 atomic % and 3 atomic %. Such a nitrogen-containing titanium film can be deposed by reactive sputtering or CVD. The conditions to be met for forming such a film deposit by reactive sputtering typically include the following. Titanium (Ti) is used as target for sputtering and nitrogen ($N_2$) gas and argon (Ar) gas are used as ambient gas. The sputtering pressure is between 1 mTorr and 10 mTorr, preferably 3 mTorr. The power supply rate will be between 1 kW and 20 kW, preferably 4 kW. On the other hand, the conditions to be met for forming such a film deposit by CVD typically include the following. An combination of an organic source gas such as TDMAT (tetradimethylaminotitanium; $Ti(N(CH_3)_2)_4$) or TDEAT (tetradiethylaminotitanium; $Ti(N(C_2H_5)_2)_4$) and ammonium ($NH_3$) may be used as CVD gas. Alternatively, a combination of titanium tetrachloride ($TiCl_4$) and ammonium ($NH_3$) may be used as CVD gas. An IMP (ion metal plasma) technique may be used for forming the film deposit.

Figure 11:
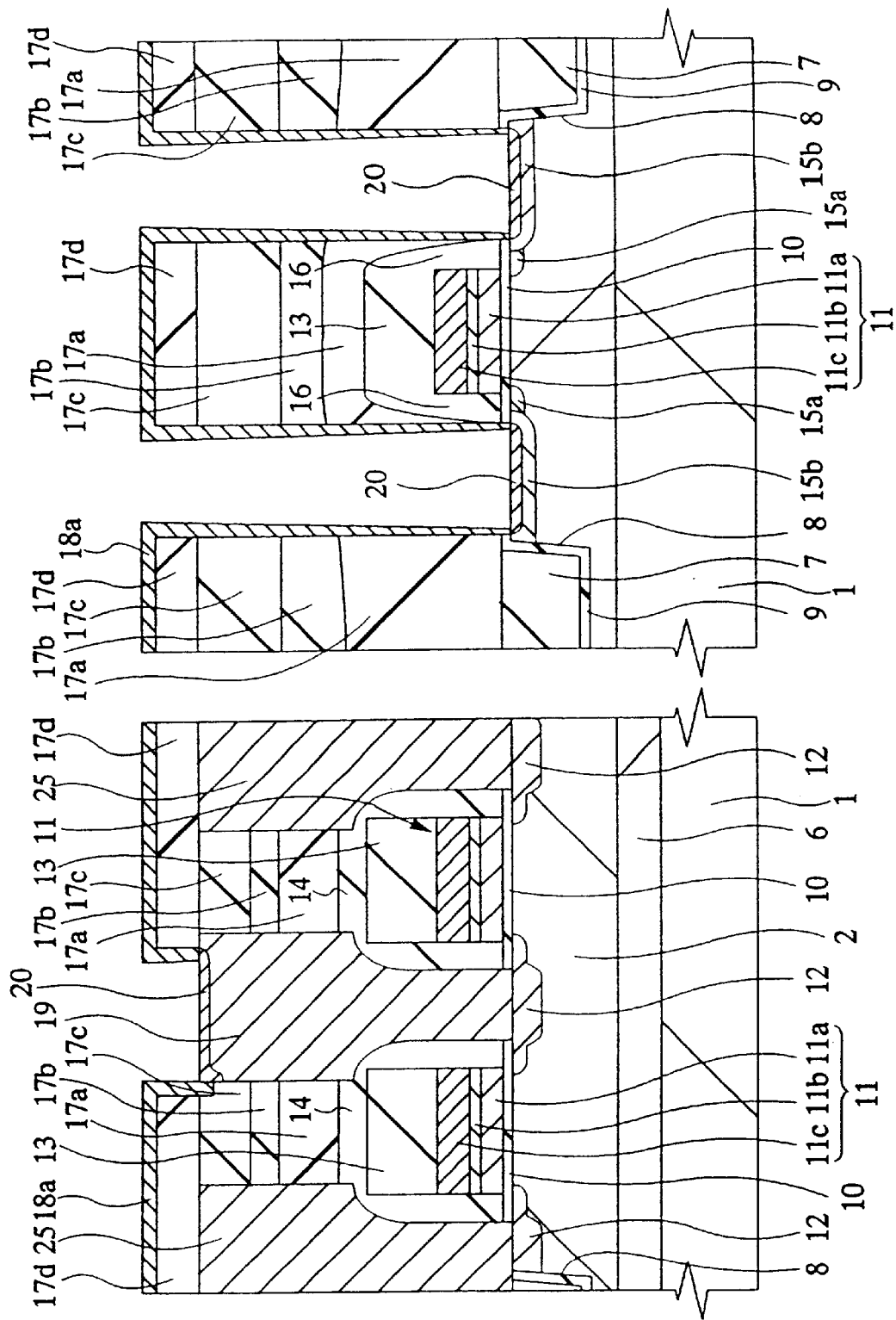
FIG. 11 is a schematic cross sectional view of embodiment 1 of DRAM similar to FIG. 10, showing a still subsequent step of manufacturing it.

Then, the semiconductor substrate 1 is held in an atmosphere with reduced pressure and subjected to a heat treatment at 650° C. for 1 minute in order to produce a titanium silicide film 20 by silicifying the nitrogen containing titanium film 18a, the plug 19 and the semiconductor substrate 1 (FIG. 11). The produced titanium silicide film 20 contains nitrogen to a concentration level between 1 atomic % and 3 atomic %.

While unreacted titanium film is left in the drawings, it may be removed selectively by means of a solution containing ammonium and hydrogen peroxide to a volume ratio of 1:5.

Then, a titanium nitride film 18b is deposited (FIG. 12) typically by sputtering.

Figure 13:
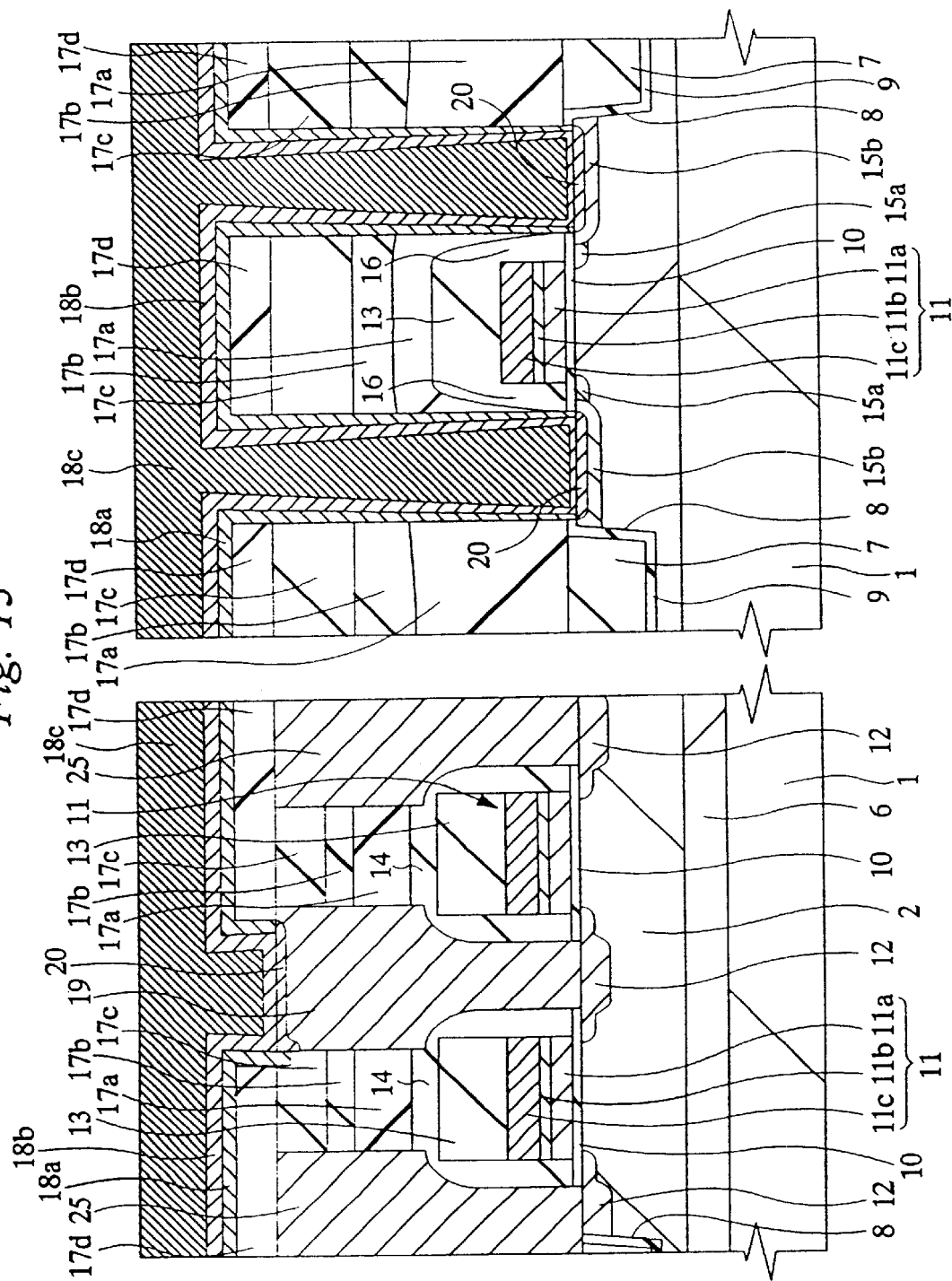
FIG. 13 is a schematic cross sectional view of embodiment 1 of DRAM similar to FIG. 12, showing a still subsequent step of manufacturing it.

Thereafter, tungsten film 18c is deposited by means of a blanket CVD technique (FIG. 13). With blanket CVD, fine contact holes 21 can successfully be filled with tungsten.

Figure 14:
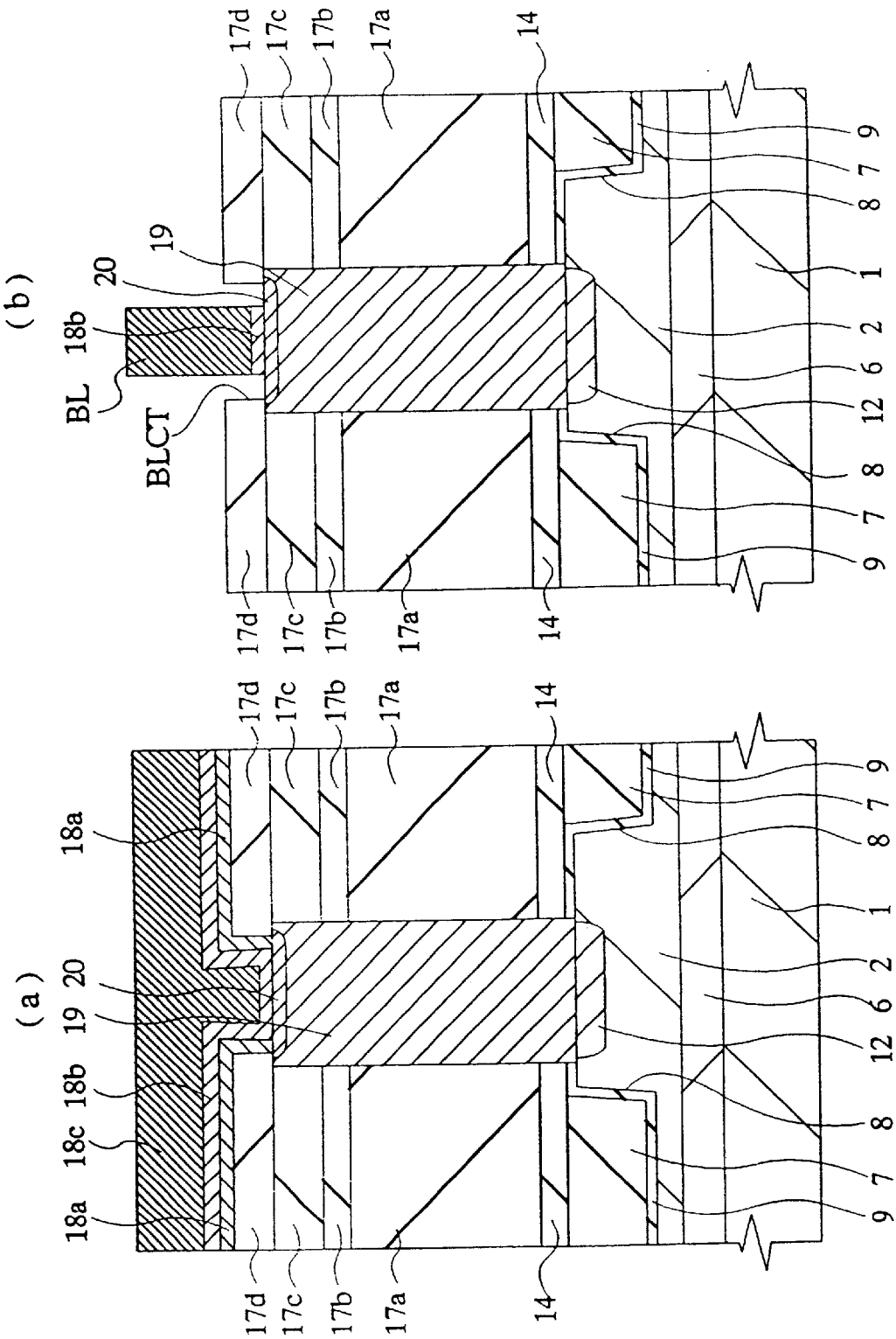
FIG. 14 is enlarged schematic cross sectional views of embodiment 1 of DRAM, wherein (a) of FIG. 14 shows a cross sectional view of the embodiment in the manufacturing step of FIG. 13 taken along line XIV—XIV in FIG. 3 and (b) of FIG. 14 shows a cross sectional view of the embodiment also taken along line XIV—XIV but after forming bit lines by patterning.

Then, a silicon nitride film is formed by deposition to make a cap insulation film 22a and then the silicon nitride film, the tungsten film 18c, the titanium nitride film 18b and the titanium film 18a are subjected to a patterning operation. FIG. 14 is enlarged schematic cross sectional views of the embodiment taken along line XIV—XIV in FIG. 3, wherein (a) shows the step of FIG. 13 and (b) shows the stage after forming the bit line BL by patterning. In (b) of FIG. 14, the bit line contact hole BLCT shows a structure totally open relative to the bit line BL. However, in this embodiment, since the titanium silicide film 20 contains nitrogen to a concentration between 1 atomic % and 3 atomic % and hence shows an etching-resistivity during the operation of patterning the tungsten film 18c, the titanium nitride film 18b and the titanium film 18a, it would not be etched even transversally so that consequently the plug 19 is prevented from being excessively etched away. Note that sulfur hexachloride ($SF_6$) may be used for etching the tungsten film 18c, while chlorine ($Cl_2$) gas may be used for etching the titanium nitride film 18b.

As a result of the etching operation, the first wiring layer M1 (18) is produced along with the bit line BL.

Figure 15:
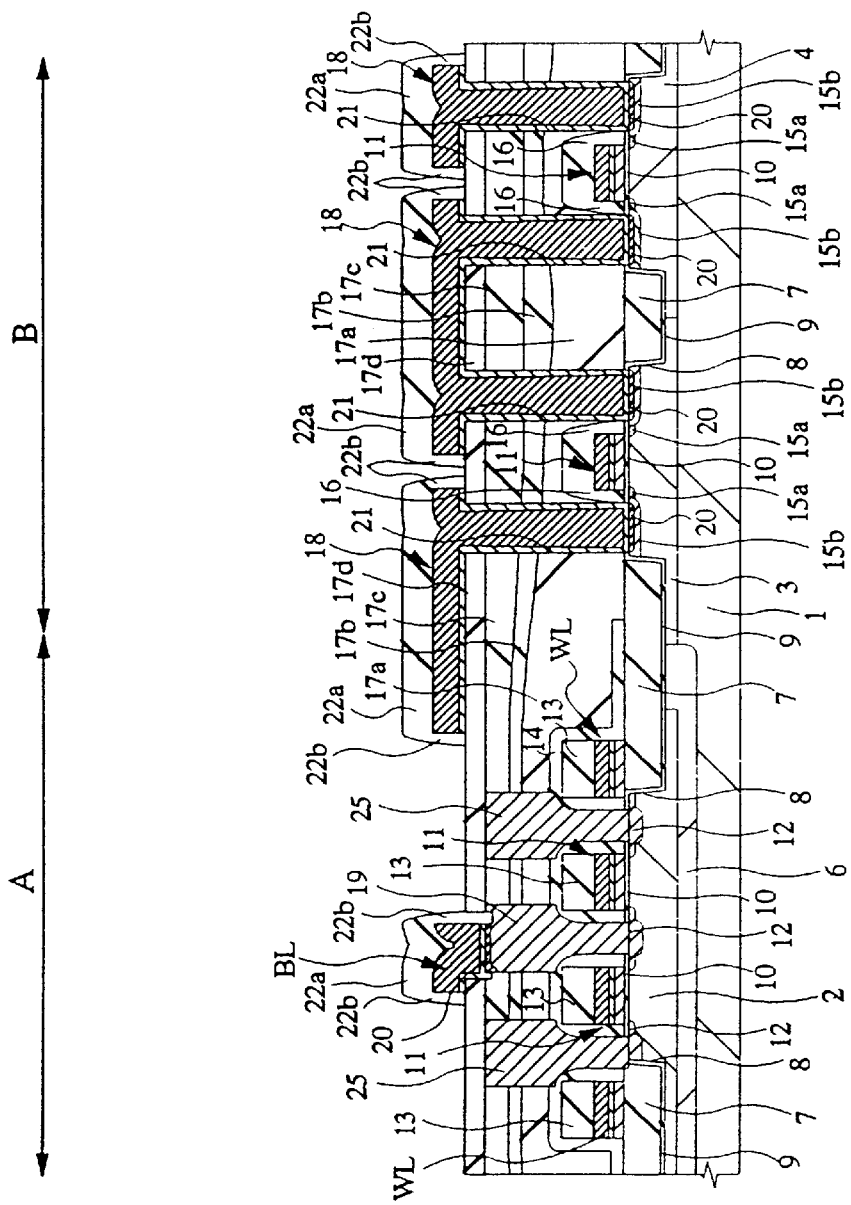
FIG. 15 is a schematic cross sectional view of embodiment 1 of DRAM similar to FIG. 13, showing a still subsequent step of manufacturing it.

Then, a silicon nitride film is deposited further and anisotropically etched to produce side wall spacers 22b (FIG. 15).

Then, after forming an SOG film 23a on the entire surface of the semiconductor substrate 1 and curing it, a TEOS oxide film 23b is formed deposited thereon by plasma CVD. Then, the TEOS oxide film 23b is polished by CMP to planarize the surface thereof in order to improve the focusing margin in a subsequent photolithography process so that fine contact holes can be formed. After cleansing the surface, another TEOS oxide film 23c is formed by deposition to produce an interlayer insulation film 23. The TEOS oxide film 23c is used to cover the scratches on the TEOS oxide film 23b produced as a result of CMP.

Figure 16:
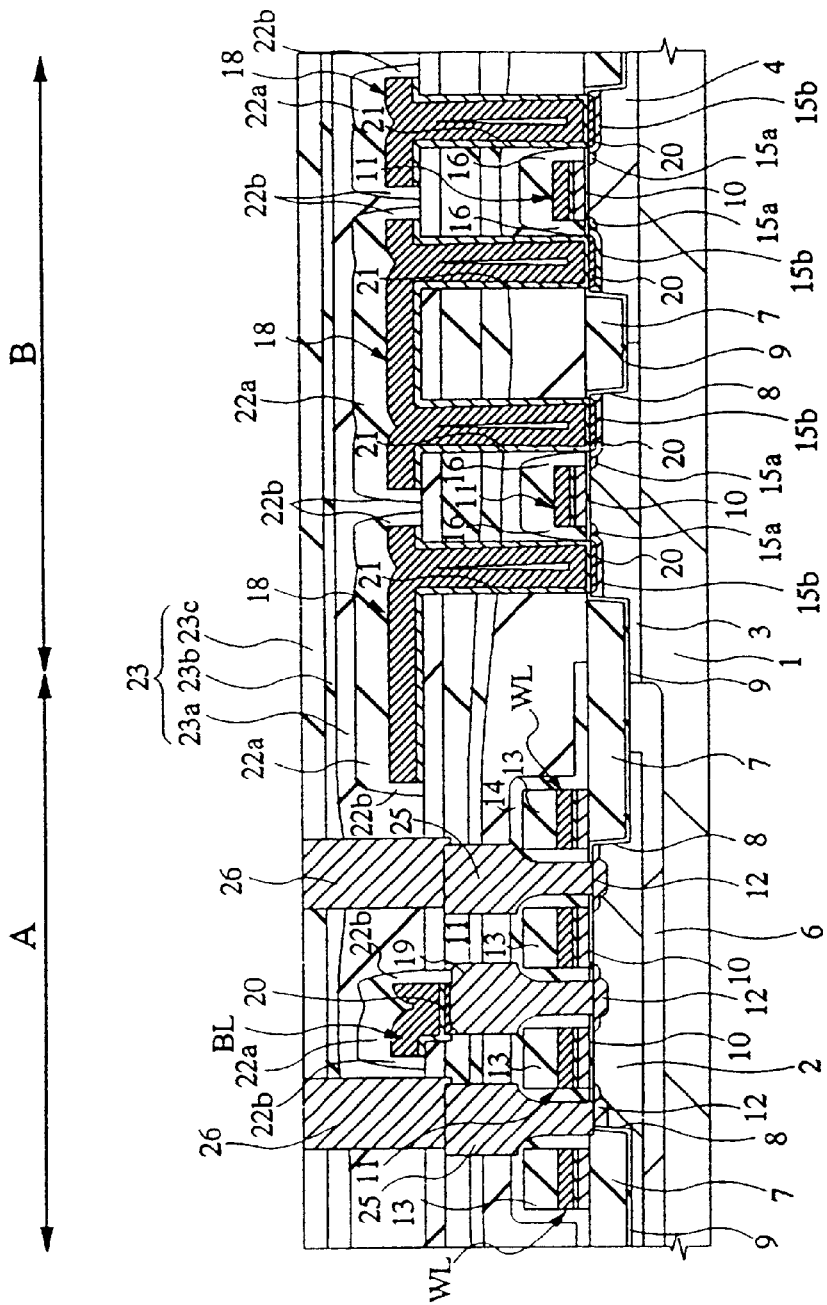
FIG. 16 is a schematic cross sectional view of embodiment 1 of DRAM similar to FIG. 15, showing a still subsequent step of manufacturing it.

Thereafter, contact holes are cut through the interlayer insulation film 23 and an impurity-doped polycrystal silicon film is formed by deposition. Then, the polycrystal silicon film is polished by CMP to produce plugs 26 (FIG. 16).

Figure 17:
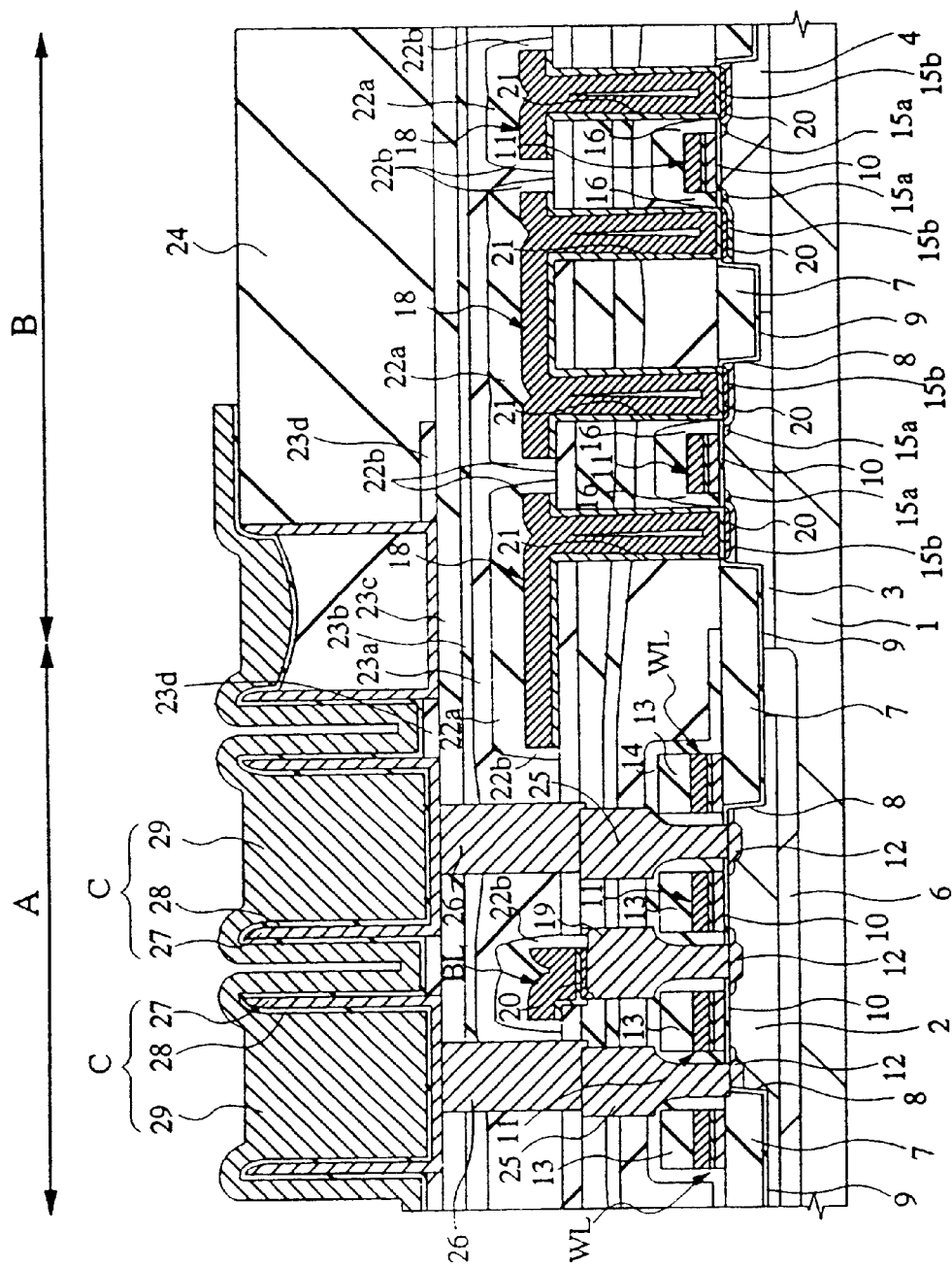
FIG. 17 is a schematic cross sectional view of embodiment 1 of DRAM similar to FIG. 16, showing a still subsequent step of manufacturing it.

Then, after forming a silicon nitride film 23d only in the memory cell array region A and depositing an insulation film 24 there, groove are cut therethrough to expose the plugs 26 in areas where capacitors C are to be formed. Then, a polycrystal silicon film is deposited to cover the grooves. Thereafter, the polycrystal silicon film formed in areas other than the grooves is removed to produce lower electrodes 27 for the capacitors C. Subsequently, the insulation film 24 in the memory cell region A and inside the lower electrodes 27 is removed by wet etching to expose the lower electrodes 27 having a cylindrical profile. Note that the silicon nitride film 23d can be used as mask for the wet etching operation. After treating the surface of the lower electrodes 27 with for nitriding or oxidation/nitriding, a tantalum oxide film is deposited thereon. Then, the tantalum oxide film is heat-treated to crystallize it to a very solid dielectric substance so that a capacitive insulation film 28 is produced there. It will be understood that a problem of thermal resistivity can arise particularly in the bottom of the contact holes 21 during the process of baking the tantalum oxide film for heat treatment. However, with embodiment 1, no leak current nor any increase in the contact resistance occurs because of the heat treatment because of the above described measures. Thereafter, a titanium nitride film is deposited and subjected to a patterning operation to produce plate electrodes 29 (FIG. 17).

Figure 18:
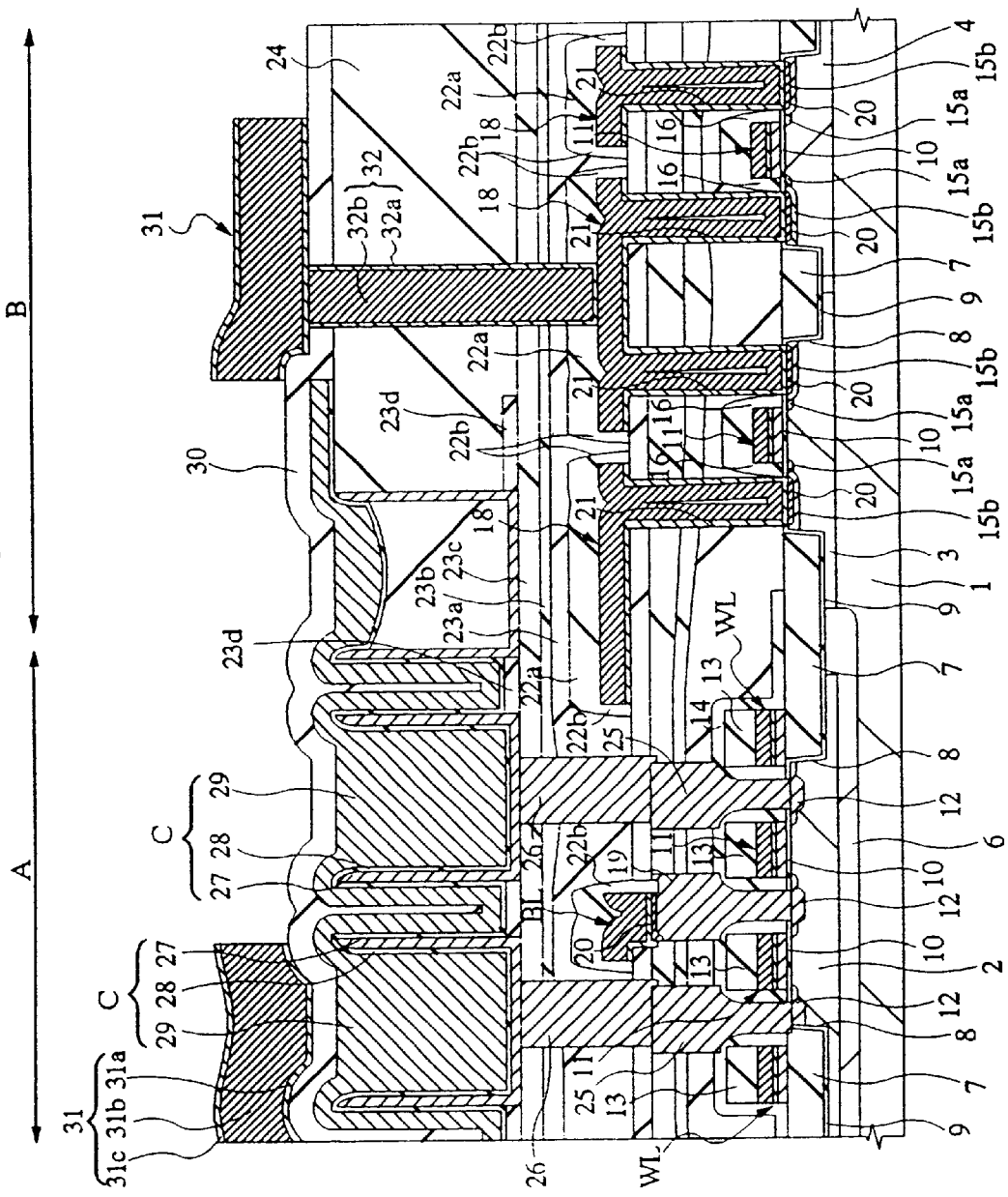
FIG. 18 is a schematic cross sectional view of embodiment 1 of DRAM similar to FIG. 17, showing a still subsequent step of manufacturing it.

Then, a TEOS film is deposited on the entire surface of the substrate 1 to produce an insulation film 30 and contact holes are bored to connect the first wiring layer 18 to the peripheral circuit region B and then a plug 32 is produced by forming a laminate of a titanium film and a titanium nitride film by deposition on the entire surface of the semiconductor substrate, depositing a tungsten film by means of blanket CVD and thereafter etching back the tungsten film, the titanium nitride film and the titanium film. The titanium film and the titanium nitride film may be formed either by sputtering or by CVD. Then, after sequentially depositing a titanium film 31a, an aluminum film 31b and a titanium nitride film 31c on the entire surface of the semiconductor substrate 1 by sputtering, they are subjected to a patterning operation to produce a second wiring layer 31 (FIG. 18).

Finally, a TEOS oxide film 33a, an SOG film 33b and a TEOS oxide film 33c are deposited to produce an interlayer insulation film 33 and a plug 35 is formed therein as in the case of the second wiring layer 31. Thereafter, a third wiring layer 34 is formed to complete the operation of preparing a DRAM as shown in FIG. 2.

With the above described embodiment 1 of DRAM, the bit line contact hole BLCT shows an open structure during the operation of patterning the bit line BL. However, since the titanium silicide film 20 contains nitrogen and hence shows an etching-resistivity during the operation of patterning the bit line BL, it would not be etched even transversally so that consequently the plug 19 is prevented from being excessively etched away. Thus, no problem arises in the subsequent steps and the reliability of the electric connection between the bit line BL and the plug 19 is improved to consequently improve the reliability and the yield of manufacturing DRAMs.

Figure 19:
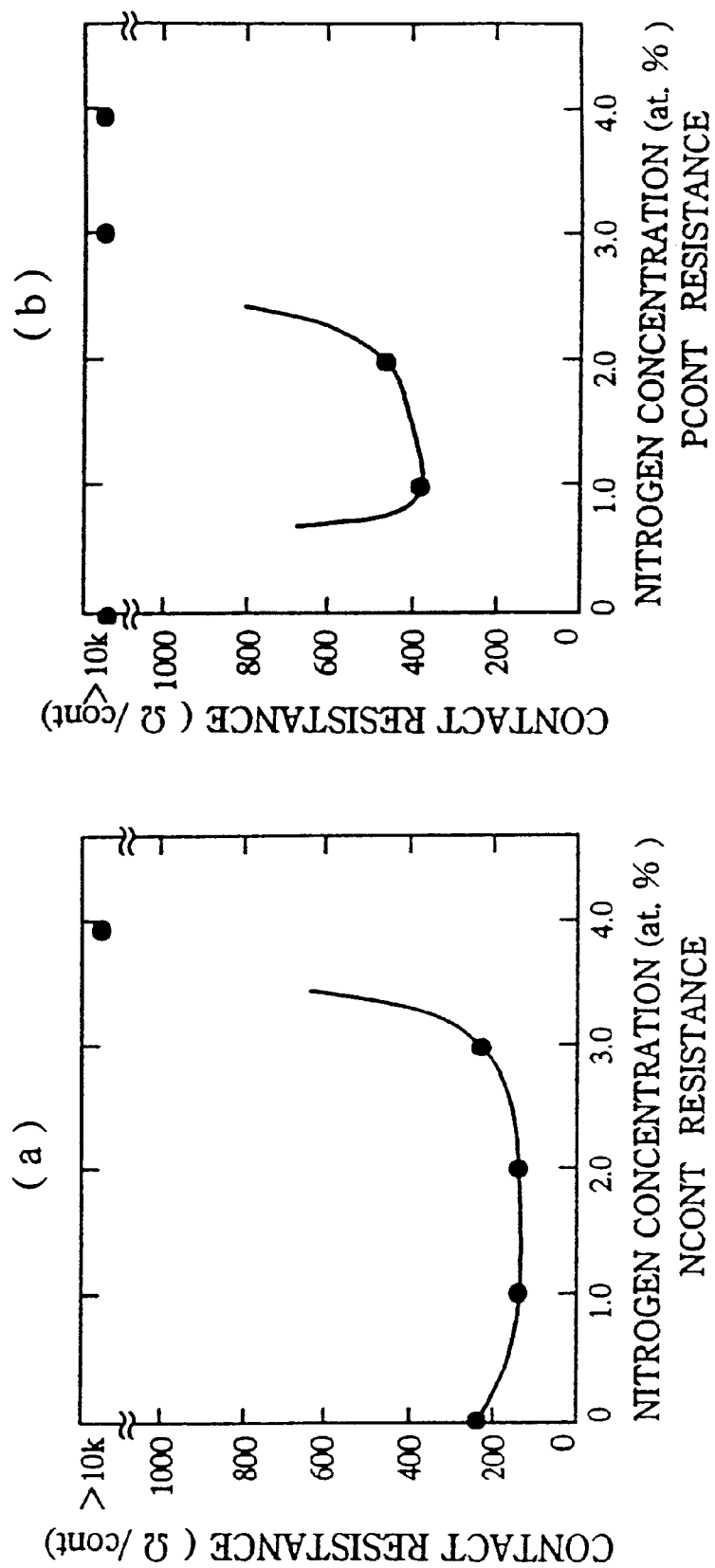
FIG. 19 is graphs showing the result of a series of experiments conducted by the inventors of the present invention to see the relationship between the nitrogen concentration and the contact resistance, wherein (a) of FIG. 19 shows a graph obtained when an n-type substrate is used and (b) of FIG. 19 shows a graph obtained when a p-type substrate used.
Figure 20:
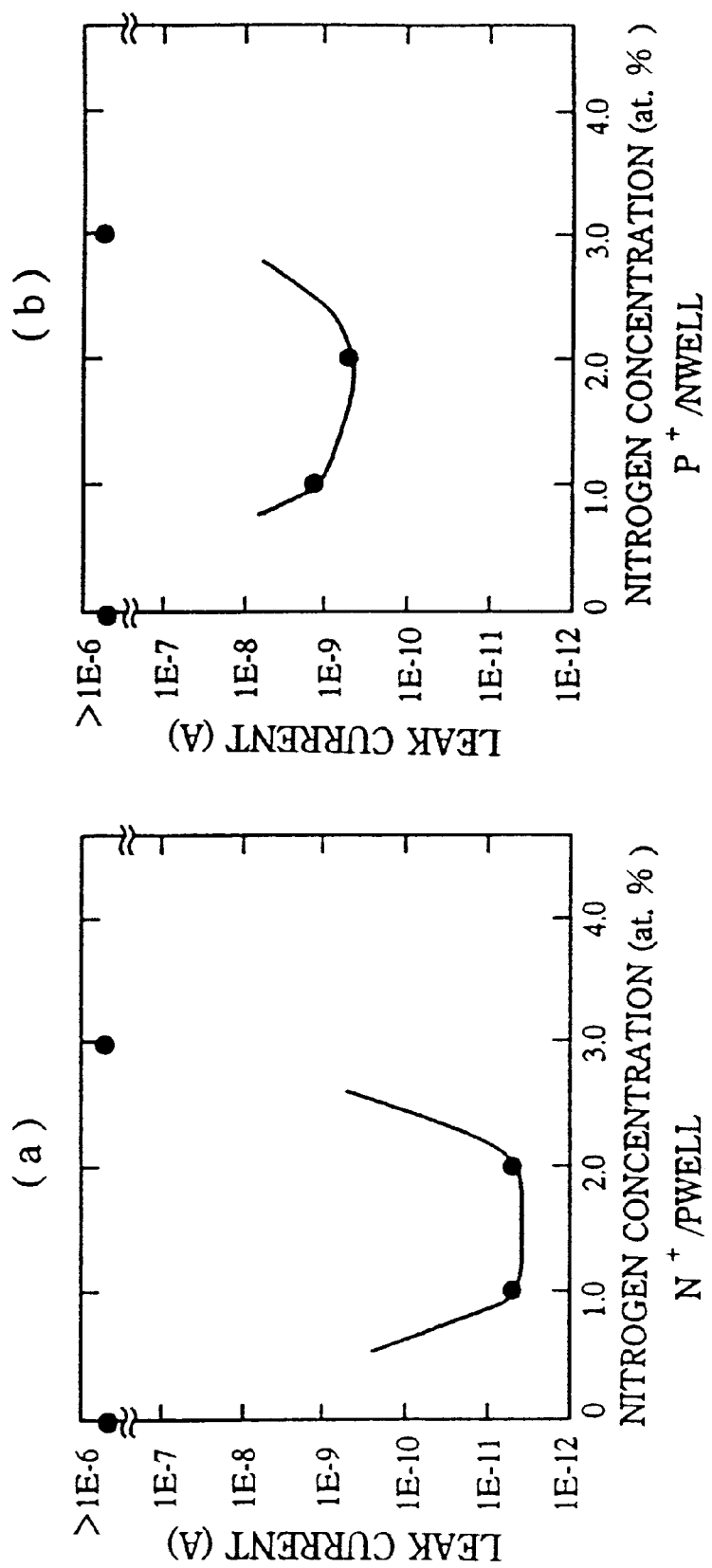
FIG. 20 is graphs showing the result of a series of experiments conducted by the inventors of the present invention to see the relationship between the nitrogen concentration and the leak current, wherein (a) of FIG. 20 shows a graph obtained when an n-type substrate is used and (b) of FIG. 20 shows a graph obtained when a p-type substrate used.

Additionally, since the titanium silicide film 20 arranged under the contact holes 21 (CT) contains nitrogen to improve the thermal resistance of the bottom of the contact holes so that the contact resistance and the leak current at the contact areas of the first wiring layer M1 and the semiconductor substrate 1 would not increase if high temperature is applied thereto when forming the insulation film 28. This will be described on the basis of the data obtained as a result of a series of experiments conducted by the inventors of the present invention and summarily shown in the graphs of FIGS. 19 and 20. FIG. 19 shows graph for the relationship between the nitrogen concentration and the contact resistance and FIG. 20 shows graphs for the relationship between the nitrogen concentration and the leak current. In both FIGS. 19 and 20, graph (a) is for an n-type substrate and graph (b) is for an p-type substrate.

As clearly seen from the graphs, both the contact resistance and the leak current are high when the titanium silicide film contains no nitrogen (nitrogen concentration is 0 atomic %) and fall as the nitrogen concentration increases, although they rise once again when the nitrogen concentration exceeds 13 atomic % to improve that a too large nitrogen concentration would not provide the effect of reducing both the contact resistance and the leak current. In other words, there is an optimal range for the nitrogen concentration, which is between 1 atomic % and 13 atomic %, preferably between 1 atomic % and 3 atomic %.

While the bit lines BL and the first wiring layer 18 (M1) of this embodiment are made of titanium nitride and tungsten in the above description, they may alternatively be made of a single layer film of titanium nitride. If such is the case, although the titanium silicide film 20 is exposed to fluorine containing gas that is used for etching the titanium nitride film, it will show a sufficient level of etching-resistivity because it contains nitrogen. However, it should be noted that the use of cobalt silicide or tungsten silicide will be more effective in terms of etching-resistivity.

Finally, if both the bit lines BL and the first wiring layer 18 are made of a laminate of a titanium nitride film and a tungsten film, the use of cobalt silicide that may or may not contain nitrogen, oxygen, carbon or germanium will be move advantageous in terms of etching-resistivity.

(Embodiment 2)

FIGS. 21 through 24 are enlarged schematic cross sectional views of embodiment 2 of DRAM according to the invention, shown in different manufacturing steps.

This embodiment of DRAM differs from the above described embodiment 1 of DRAM only in terms of the structure of the bit lines BL, that of the first wiring layer and the plugs formed in the bit line contact holes BLCT and the contact holes 21. The two embodiments are identical in all the remaining aspects particularly from the viewpoint of configuration and manufacturing method. Therefore, this embodiment will be described only in terms of the differences.

The method of manufacturing the embodiment 2 of DRAM is identical with that of manufacturing the embodiment 1 of DRAM down to the step of FIG. 13. However, the titanium silicide 20 of this embodiment does not need to contain any of nitrogen, oxygen, carbon and germanium, although it may contain any of these elements or may be replaced by a cobalt silicide film or a tungsten silicide film as in the case of the embodiment 1.

Figure 21:
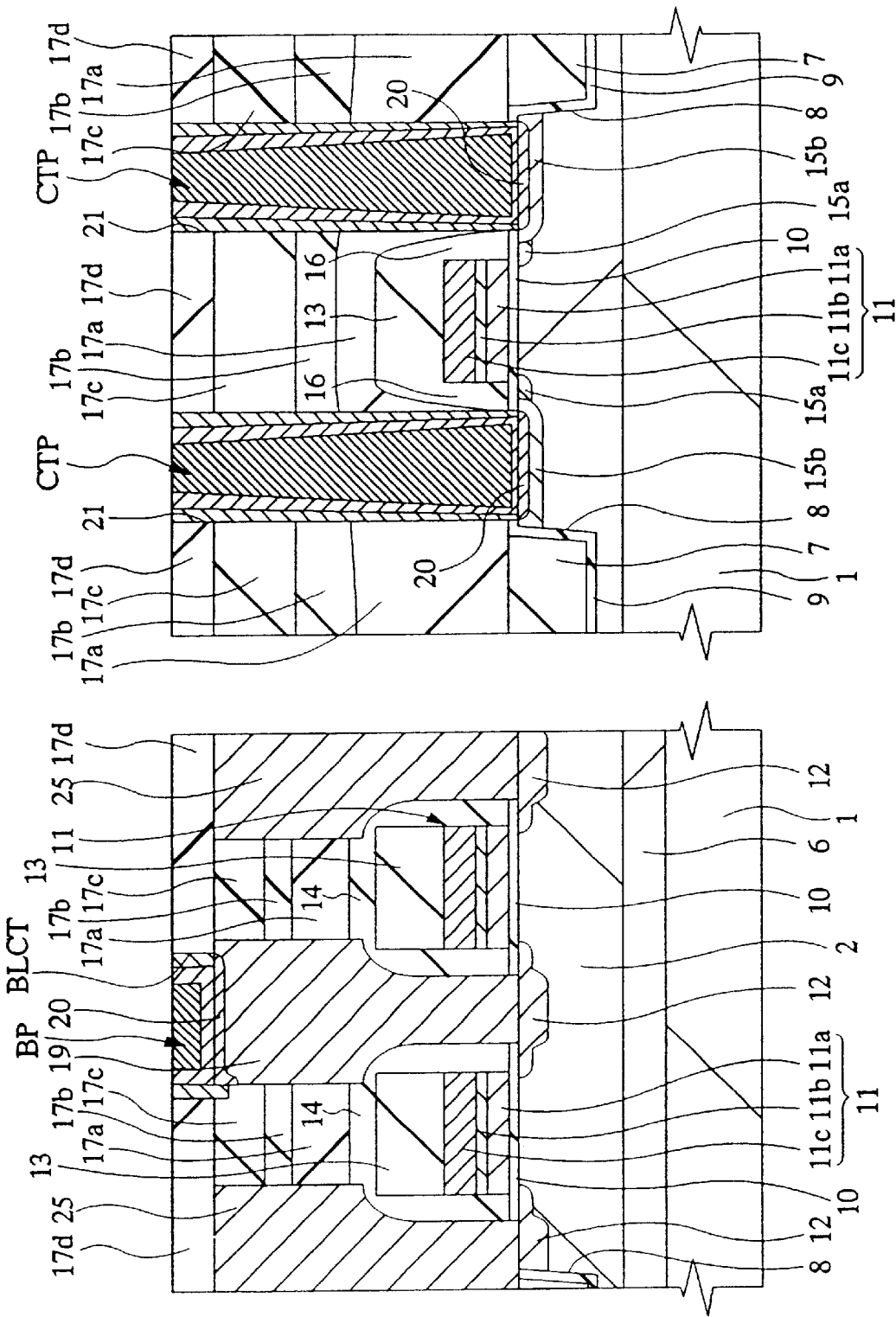
FIG. 21 is an enlarged schematic cross sectional view of embodiment 2 of DRAM according to the invention, showing a step of manufacturing it.
Figure 22:
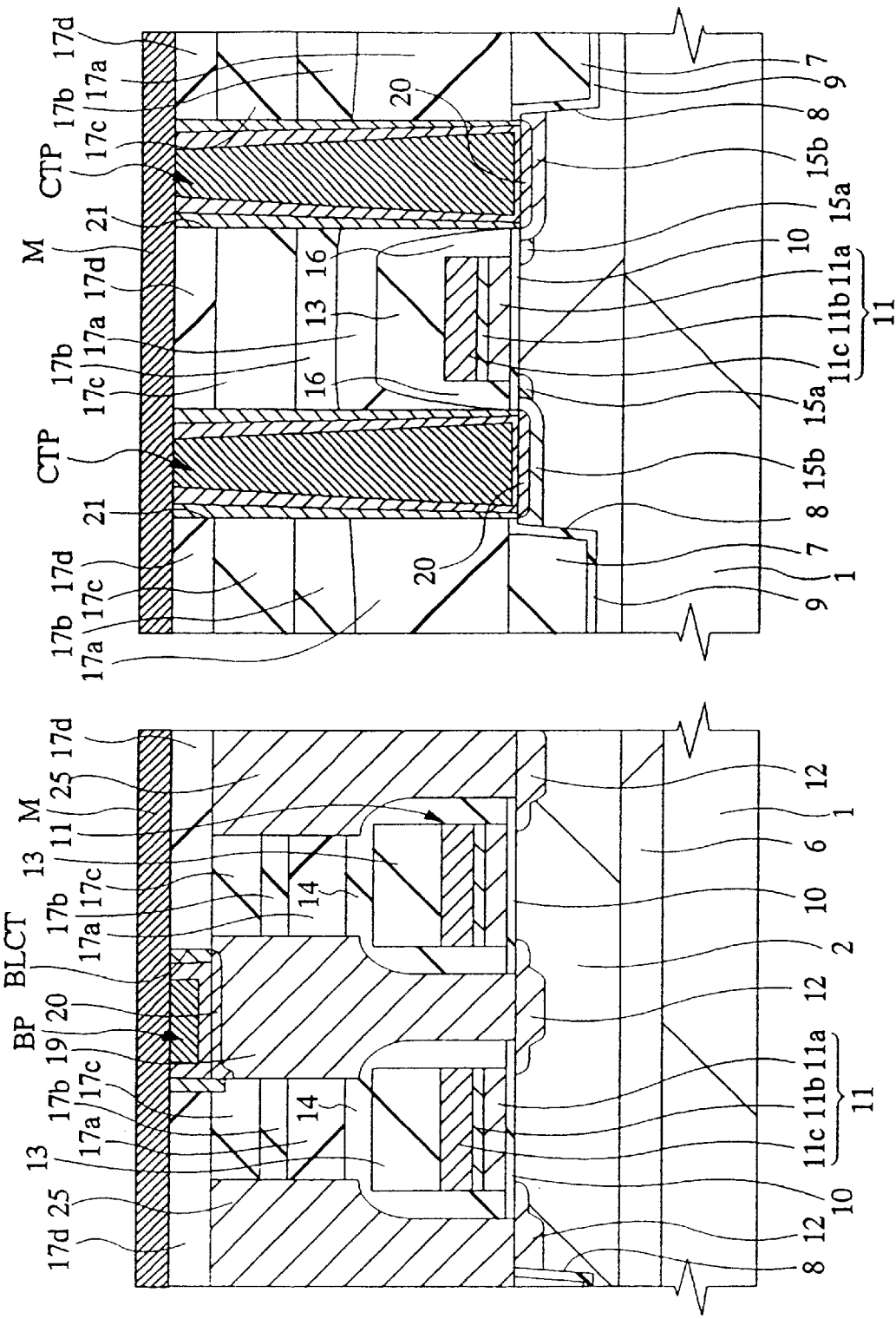
FIG. 22 is an enlarged schematic cross sectional view of embodiment 2 of DRAM similar to FIG. 21, showing a subsequent step of manufacturing it.
Figure 23:
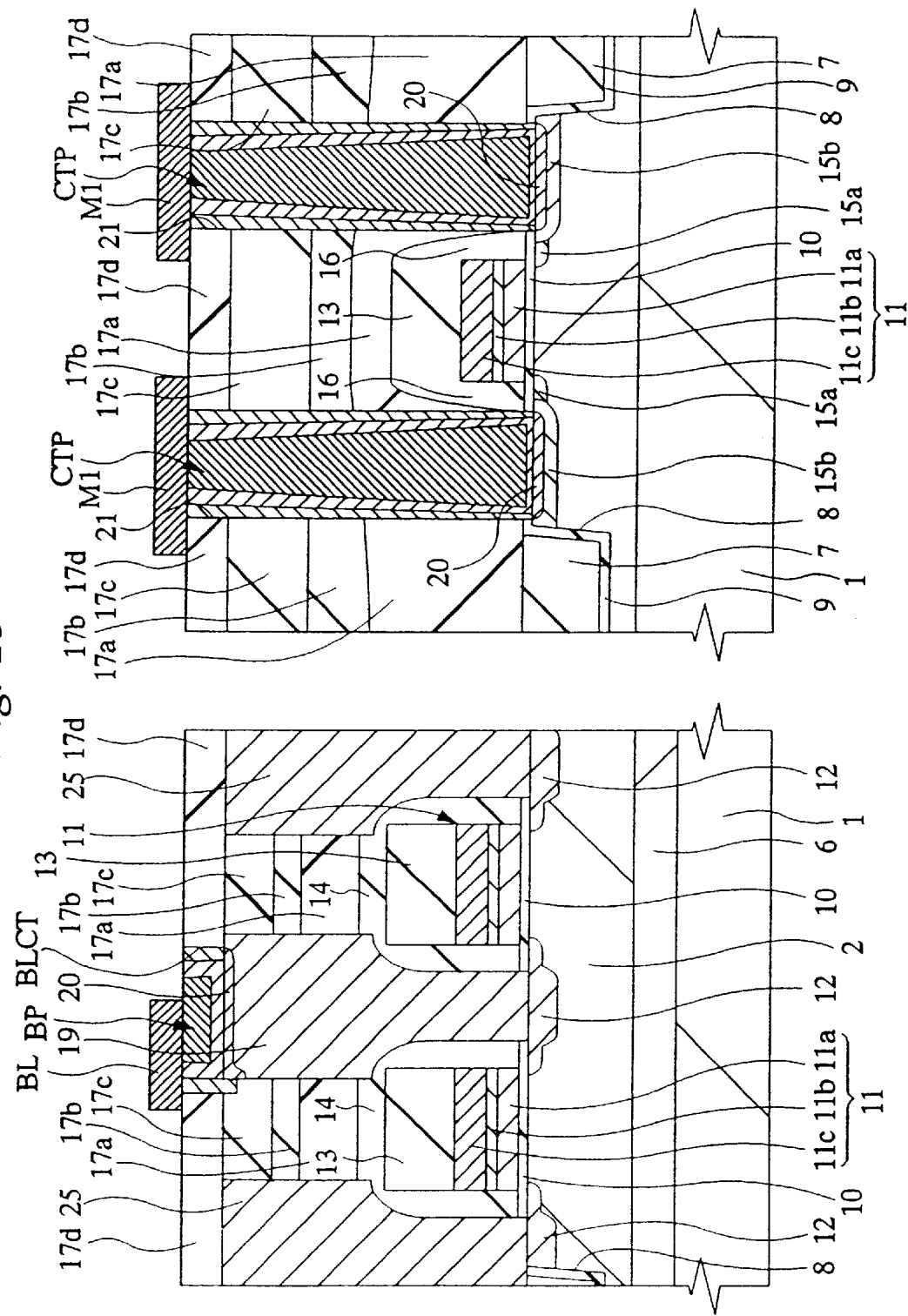
FIG. 23 is an enlarged schematic cross sectional view of embodiment 2 of DRAM similar to FIG. 22, showing a still subsequent step of manufacturing it.

As shown in FIG. 13 for the embodiment 1, after depositing a tungsten film 18c, the tungsten film 18c, the titanium nitride film 18b and the titanium 18a are etched back to remove the laminate except the bit line contact hole BLCT and the contact holes 21. As a result, a bit line plug BP is formed in the bit line contact hole BLCT and a wiring plugs CPT is formed in each of the contact holes 21 (FIG. 21). The etching back operation may be carried out by means of an etching back technique or a CMP technique.

For forming the bit line plug BP and the wiring plugs CTP by means of CMP, the surface of the TEOS oxide film 17d where the bit line contact hole BLCT and the contact holes 21 are formed needs to be planarized. It is preferable to planarize also the surface of the TEOS oxide film 17c where the plugs 19, 25 are formed. Thus, the film thickness of each of the electro-conductive films for producing the bit line plug BP and the wiring plugs CTP can be reduced including the thickness by which the films are polished away so as to reduce the load of the polishing operation by planarizing the underlayer and/or the layer where the bit line plug BP and the wiring plugs CTP are formed.

Then, a metal film M is formed on the entire surface of the semiconductor substrate 1 by deposition (FIG. 22) and subsequently subjected to a patterning operation to produce a bit line BL and a first wiring layer M1 (FIG. 23) The metal film M may be a single layer film of tungsten or molybdenum.

All the subsequent steps are same as their counterparts of embodiment 1.

A bit line plug BP is formed in this embodiment of DRAM and operates as a sort of mask when patterning the metal film M so that consequently, the titanium silicide film 20 and the plug 19 would not be etched. More specifically, the plug 19 would be protected against excessive etching and the titanium silicide film 20 would be prevented from being etched transversally if the bit line BL shows an open structure. If the bit line BL is made of a single layer film of tungsten and the bit line plug BP contains tungsten, the tungsten of the bit line plug BP can be etched away during the operation of patterning the metal film M. However, since the bit line BL can be made to show a reduced film thickness in this embodiment as will be described hereinafter, the metal film M that will eventually make the bit line BL will have to be over-etched only to an extent corresponding to the film thickness of the bit line BL that is to be produced. In short, the metal film M needs to be over-etched only to a small extent because of the thin film thickness of the bit line BL. Therefore, the tungsten contained, if any, in the bit line plug BP that lies under the metal film M when the latter is etched would be etched only to a small extent and hence the etching would not get to the bottom of the plug. Thus, the silicide layer will be prevented from being excessively etched.

If the bit line BL is made of molybdenum, on the other hand, the metal film M that eventually makes the bit line BL can be etched under a condition that is so selected as to make the etching rate of molybdenum greater than that of tungsten and hence etch the metal film M selectively relative to the bit line plug BP. In other words, the bit line plug BP can be made to operates as etching stopper for the metal film M. Thus, the bit line plug BP would not be etched to prevent the silicide film from being etched if the bit line shows an open structure relative to the bit line plug BP.

Additionally, the bit line BL is made of a single layer film of tungsten to reduce the electric resistance of the bit line BL. While a titanium nitride film has to be used conventionally for the bit line BL, from the viewpoint of the ease of burying it in the contact holes, a bit line BL made of only tungsten whose electric resistivity is lower than that of a titanium nitride film can be used in this embodiment because plugs are buried in the contact holes. A titanium nitride film is less workable than a tungsten film and hence the use of a bit line BL made of only a tungsten film is advantage because of its workable property.

Still additionally, since a bit line plug BP is formed in advance for the bit line contact hole BLCT, the metal film M does not have to be buried in the bit line contact hole BLCT and hence is allowed to have a reduced film thickness to improve the inter-bit-line capacitance and improve the sensitivity of the device for detecting the stored electric charge. If, for example, the contact holes have a bore of 300 nm, the metal film M of a conventional device requires a film thickness of 150 nm or more but that of this embodiment may well be much less than 150 nm because it is made of tungsten having a high electric conductivity.

As shown in FIG. 3, the bit lines BL have a linear profile and arranged close to each other because they are patterned with minimum processing dimensions in the memory cell region. The rule of minimum processing dimensions is practically also applied to the pattern width. As described earlier by referring to the embodiment 1, the linear profile of the bit lines BL has an effect of improving the resolution of photolithography in the process of patterning them and reducing the width of the bit lines BL to consequently reduce the inter-bit-line capacitance. However, any attempt for further reducing the inter-bit-line capacitance will be baffled by the limit of the resolution of photolithography to make it difficult to reduce the inter-bit-line capacitance by increasing the gap separating adjacent bit lines BL. To the contrary, the capacitance is successfully reduced in this embodiment by reducing the film thickness of the bit lines BL and hence is more advantageous than the embodiment 1 in terms of reducing the inter-bit-line capacitance.

Figure 24:
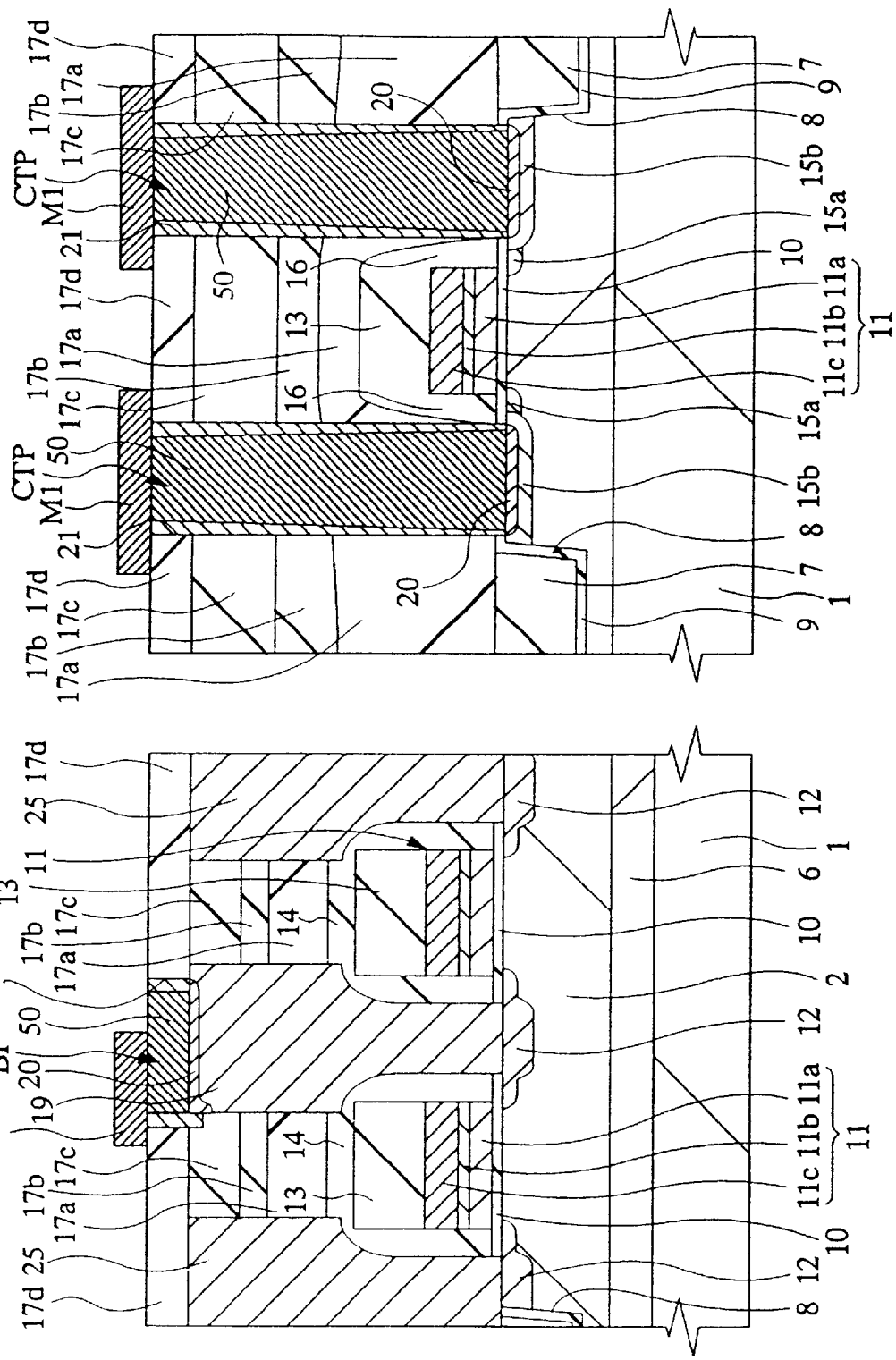
FIG. 24 is an enlarged schematic cross sectional view of an embodiment of DRAM obtained by modifying embodiment 2, showing a step of manufacturing it.

As shown in FIG. 24, the above described laminate film of a titanium nitride layer and a tungsten layer used for the bit line plug BP may be replaced by a titanium nitride film 50. If such is the case, the bit line plug BP made of titanium nitride film 50 can operate as etching stopper in the process of patterning bit lines BL because a titanium nitride film 50 shows an etching selectivity greater than that of a tungsten film that is used for the bit lines BL. The etching operation of patterning bit lines BL can be realized by using SF6 as etching gas to improve the process margin in the operation of patterning bit lines BL. The titanium nitride film 50 may be replaced by a tungsten nitride film. Then, again, the bit line plug BP made of tungsten nitride film can operate as etching stopper in the process of patterning bit lines BL.

It may be needless to say that, in the case where the bit line plug BP is made of a laminate film of a titanium nitride layer and a tungsten layer, a titanium nitride film or a tungsten nitride film and the bit line BL is made of molybdenum, it can operate as etching stopper when etching the molybdenum film.

(Embodiment 3)

FIGS. 25 through 28 are enlarged schematic cross sectional views of embodiment 3 of DRAM according to the invention, shown in different manufacturing steps.

Figure 25:
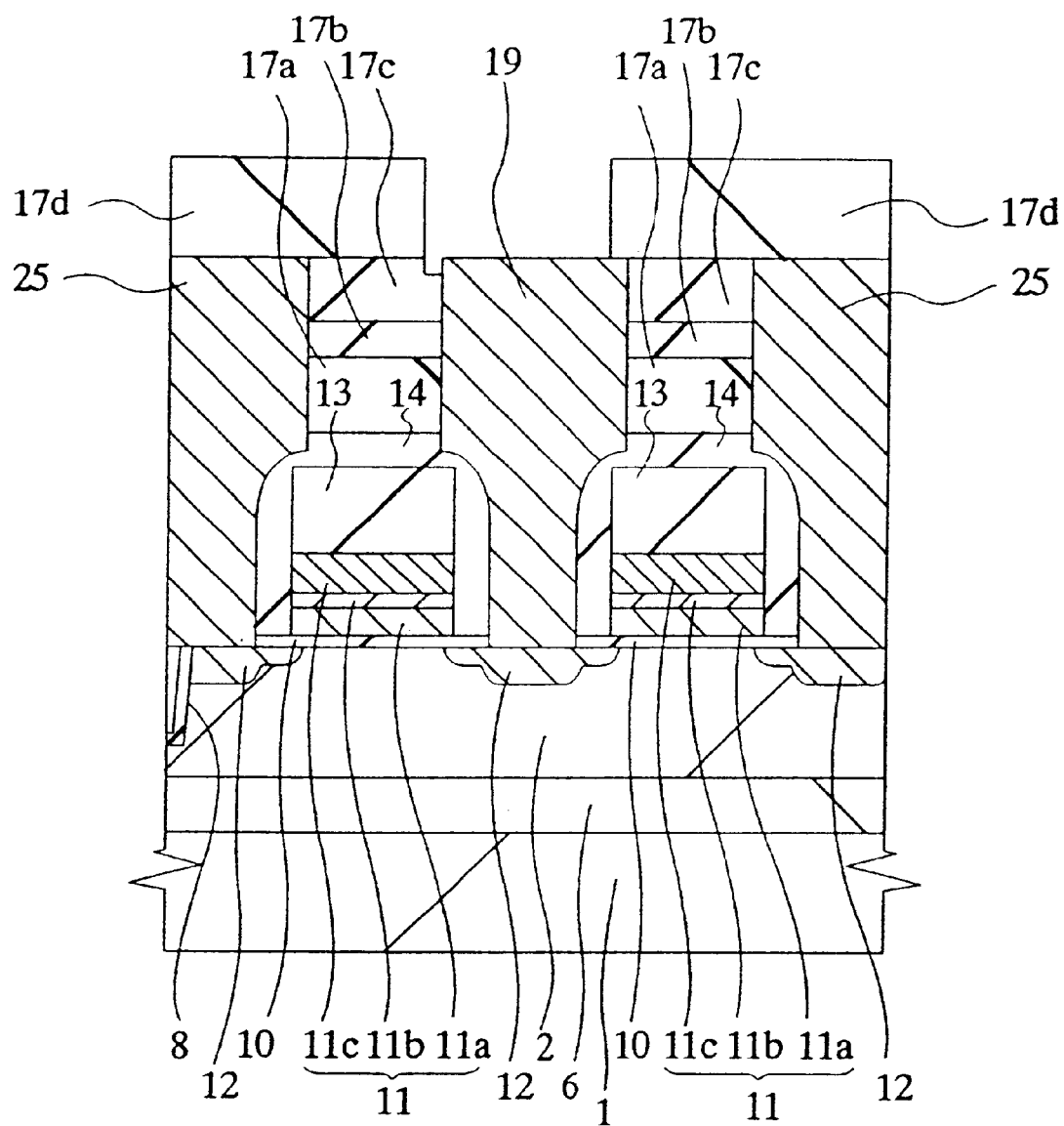
FIG. 25 is an enlarged schematic cross sectional view of embodiment 3 of DRAM according to the invention, showing a step of manufacturing it.

The method of manufacturing the embodiment 3 of DRAM is identical with that of manufacturing the embodiment 1 of DRAM down to the step of FIG. 9. However, the TEOS oxide film 17d of this embodiment has a film thickness slightly greater than that of the embodiment 1 (FIG. 25).

Figure 26:
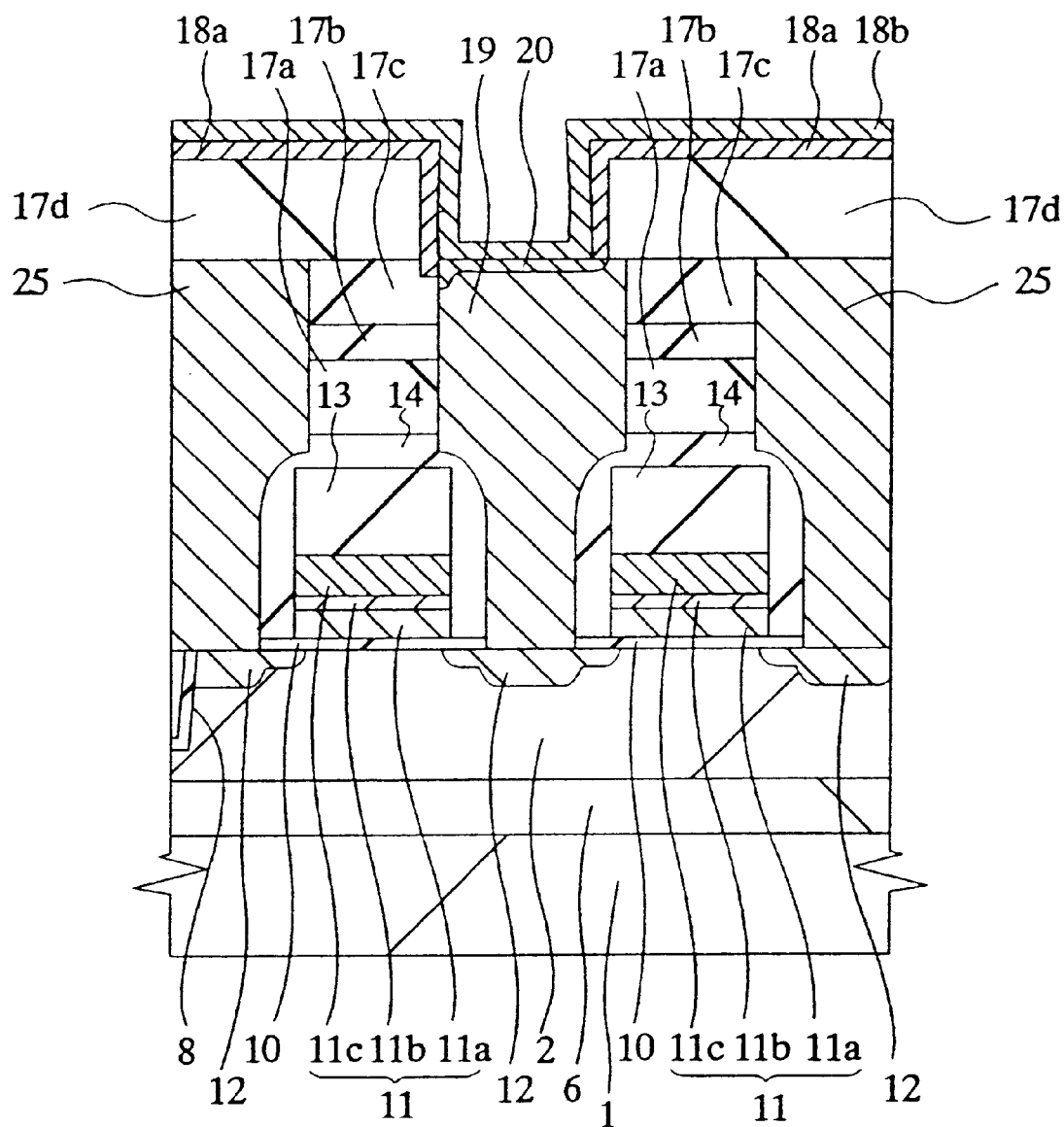
FIG. 26 is an enlarged schematic cross sectional view of embodiment 3 of DRAM similar to FIG. 25, showing another step of manufacturing it.

Then, a titanium film 18a is formed by deposition and heat-treated to produce a titanium silicide film 20 and then a titanium nitride film 18b is formed by deposition as in the case of the embodiment 1 (FIG. 26). Note that the titanium silicide film 20 may or may not contain nitrogen or oxygen as impurity.

Figure 27:
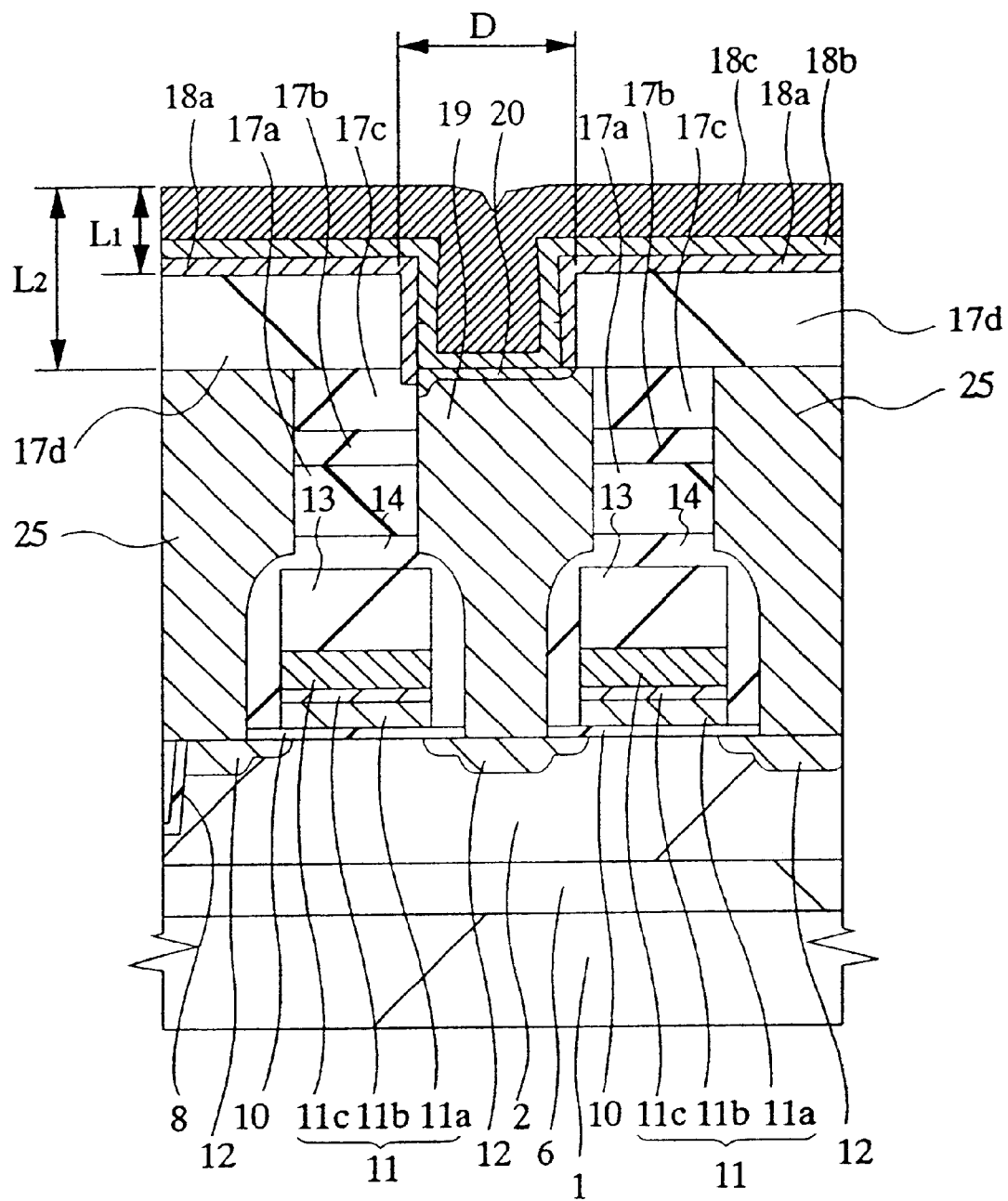
FIG. 27 is an enlarged schematic cross sectional view of embodiment 3 of DRAM similar to FIG. 26, showing a still another step of manufacturing it.
Figure 28:
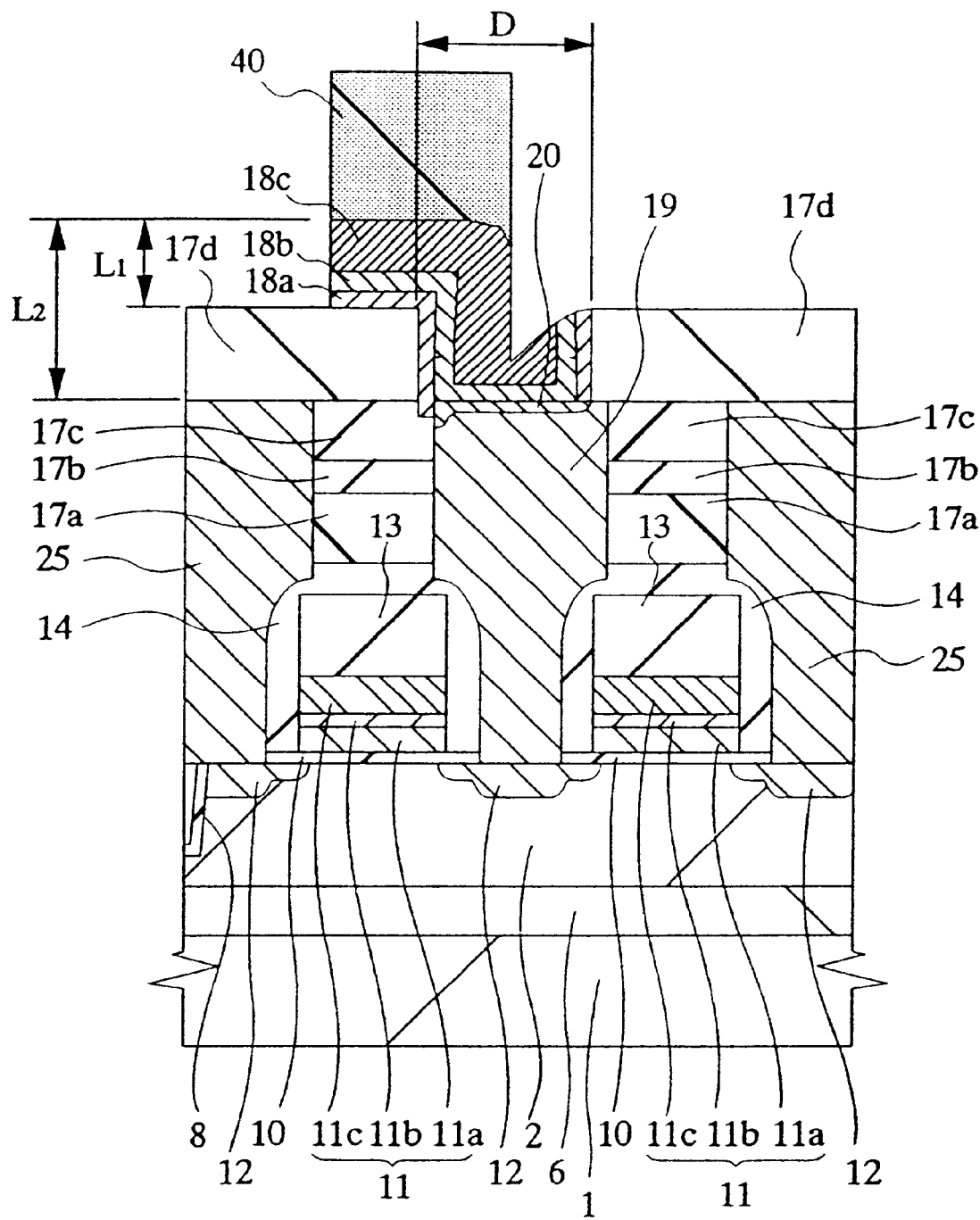
FIG. 28 is an enlarged schematic cross sectional view of embodiment 3 of DRAM similar to FIG. 27, showing a still another step of manufacturing it.

Then, a tungsten film 18c is deposited by a blanket CVD technique (FIG. 27). In this embodiment, if the total thickness of the tungsten film 18c, the titanium nitride film 18c and the titanium film 18a, which equal to the film thickness of the bit line BL, is L1, the distance L2 which is the sum of the thickness L1 and the film thickness of the TEOS oxide film 17d and the bore D of the bit line contact hole BLCT are so selected as to realize the relationships of $L1 \times (1+OVE) < L2$ and $L1 > D/2$, where OVE represents the extent of over-etching of the bit line. The OVE preferably has a value of 0.5.

As long as the above relationships are maintained, the etching process of patterning the tungsten film 18c, the titanium nitride film 18b and the titanium film 18a, using a photoresist film 40 would not get to the bottom of the bit line contact hole BLCT. Therefore, the titanium silicide film 20 and the plug 19 would not be etched if the bit line BL shows an open structure.

The method to be used for etching the tungsten film 18c, the titanium nitride film 18b and the titanium film 18a is same as the one described for the embodiment 1.

Thus, this embodiment shows an effect of preventing the titanium silicide film and the plug 19 from being etched as in the case of the embodiments 1 and 2.

(Embodiment 4)

Figure 29:
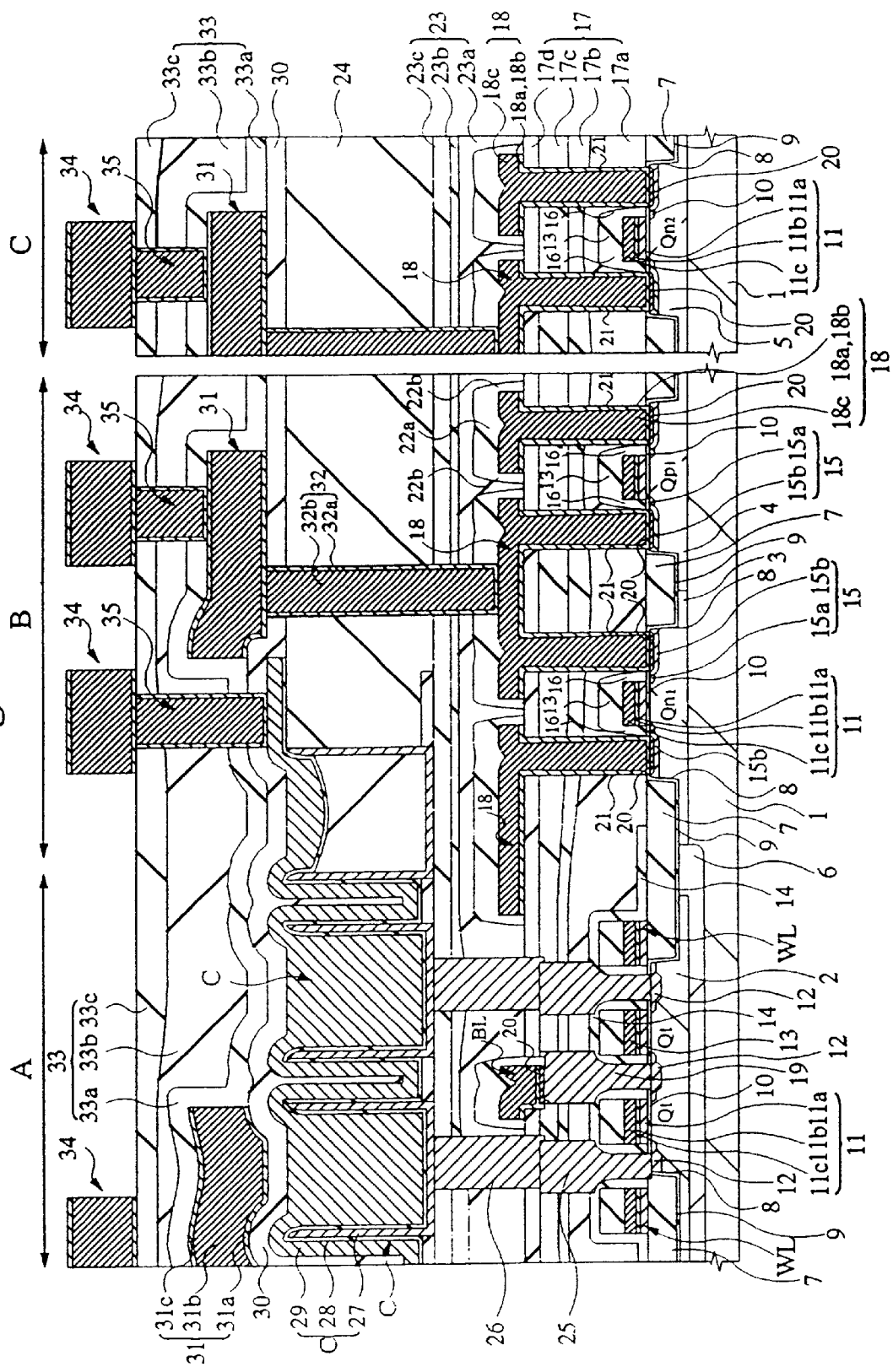
FIG. 29 is a schematic cross sectional view of embodiment 4 of DRAM according to the invention.
Figure 30:
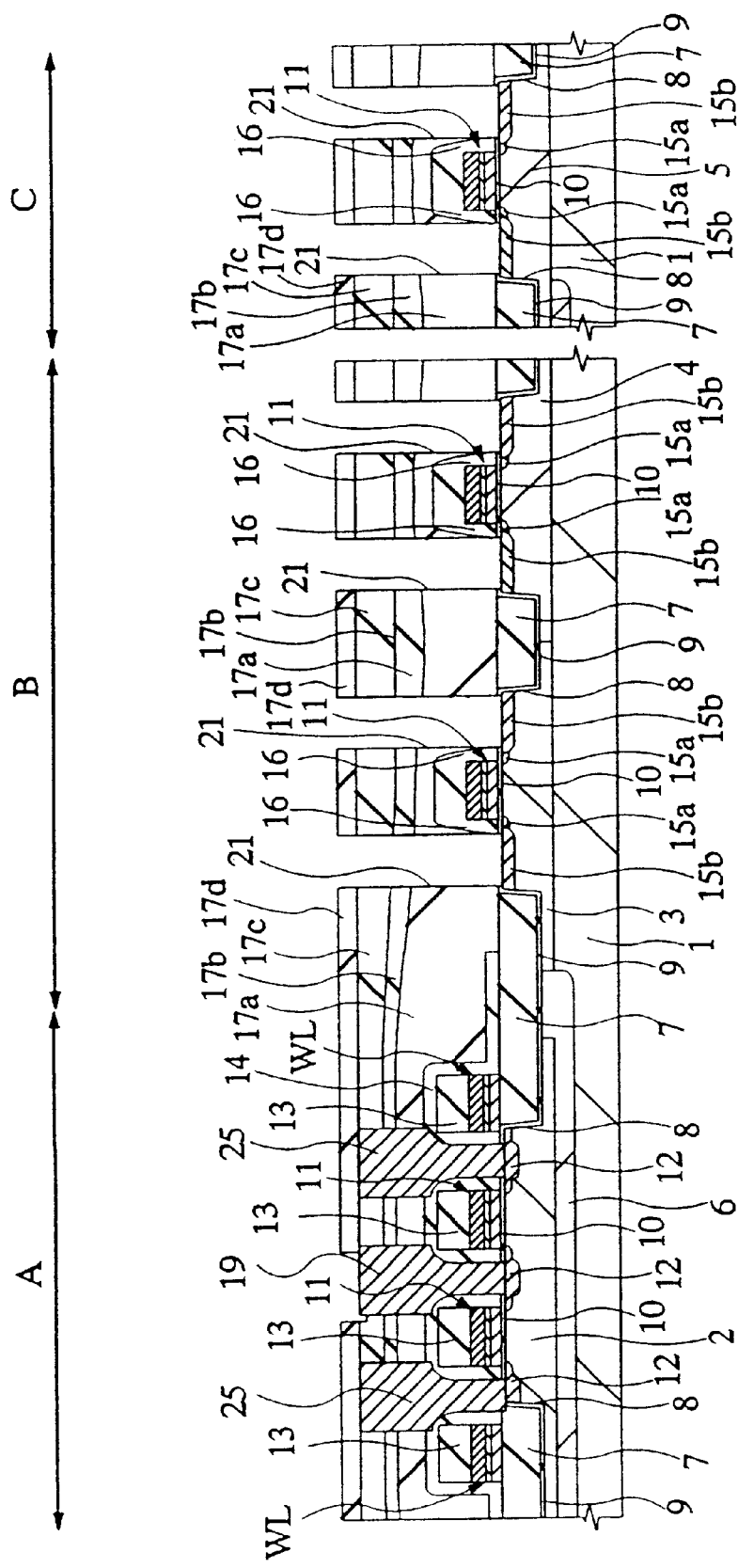
FIG. 30 is a schematic cross sectional view of embodiment 4 of DRAM, showing a step of manufacturing it.
Figure 31:
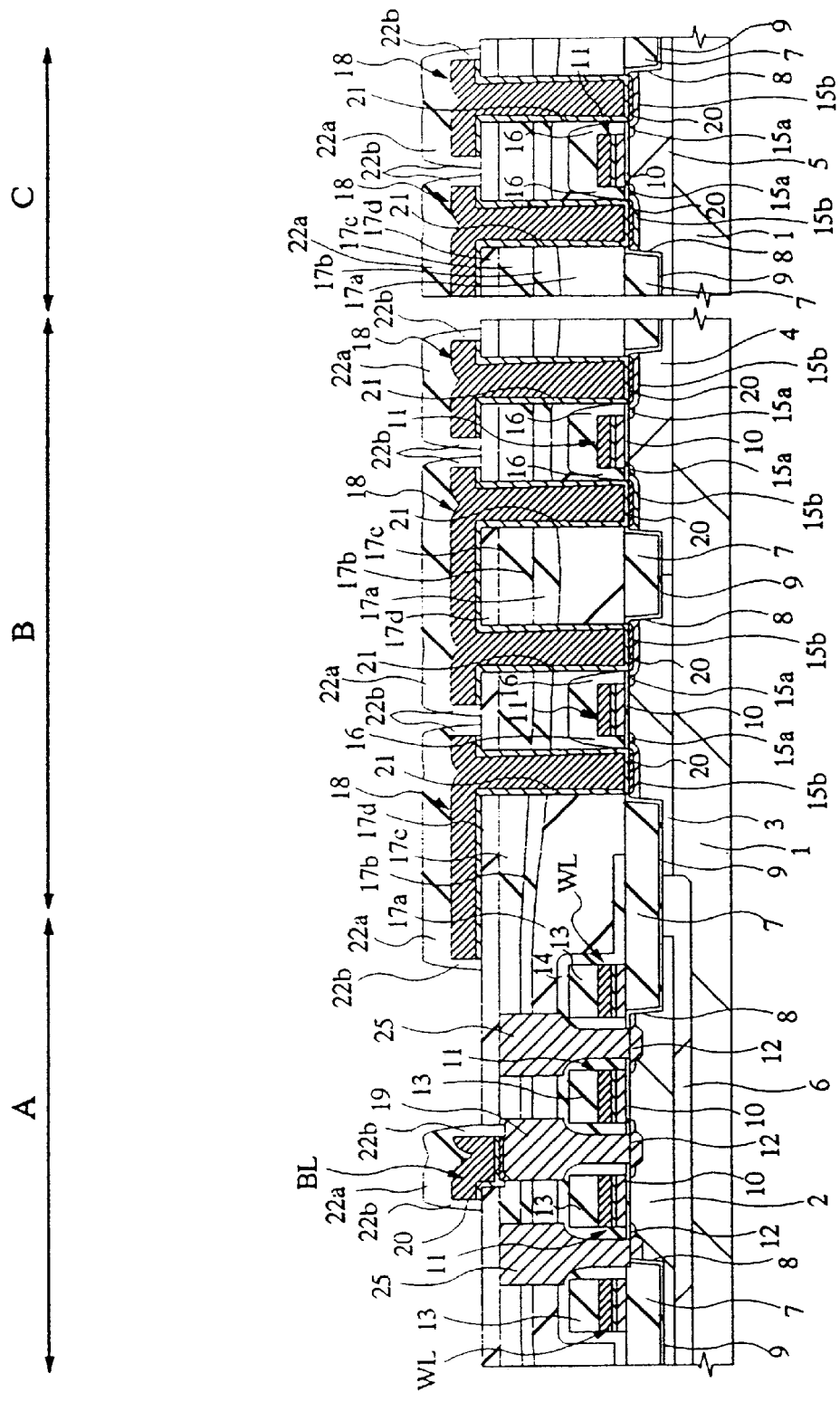
FIG. 31 is a schematic cross sectional view of embodiment 4 of DRAM similar to FIG. 30, showing another step of manufacturing it.

FIG. 29 is a schematic cross sectional view of embodiment 4 of DRAM according to the invention. FIGS. 30 and 31 are enlarged schematic cross sectional views of the embodiment 4 of DRAM according to the invention, shown in different manufacturing steps.

The embodiment 4 of DRAM is substantially identical with the embodiment 1 with regard to region A and region B in FIG. 29. FIG. 29 shows also region C which is an indirect peripheral circuit region. In this embodiment, the contact holes 21 in region C and the contact holes 21 in region B shows a same bore.

The method of manufacturing the embodiment 4 of DRAM is substantially identical with that of manufacturing the embodiment 1. However, as shown in FIG. 30, the contact holes 21 in region C and the contact holes 21 in region B are made to have a same bore in this embodiment.

Now, this embodiment will be described further by referring to FIGS. 10 through 13 showing the embodiment 1. Note that region B which is a direct peripheral circuit region and region C which is an indirect peripheral circuit region are shown throughout FIGS. 10 through 13.

A titanium film 18a is formed by deposition on the entire surface of the semiconductor substrate 1. FIG. 11 shows an enlarged partial view of the deposit (FIG. 10). The film thickness of the titanium film 18a is greater on the bottom of the contact holes 21 than on the interlayer insulation film 17. This is because the titanium film 18a is produced by patterning and hence the film thickness if reduced on the bottom of the contact holes 21 as a function of the viewing angle from the bottom of the contact holes 21. Meanwhile, the contact holes 21 in the direct peripheral circuit region B and those in the indirect peripheral circuit region C have a same bore. Therefore, the film thickness of the titanium film 18a is same at the bottom of all the contact holes in the both regions.

Then, the semiconductor substrate 1 is annealed to give rise to a silicifying reaction between the semiconductor substrate 1 and the titanium film 18a (FIG. 11). As a result, a titanium silicide film 20 is produced on the bottom of the contact holes 21. Note that the film thickness of the titanium film 18a is same throughout the contact holes 21 regardless of the direct peripheral circuit region B and the indirect peripheral circuit region C so that consequently, the titanium film 18a on the bottom of all the contact holes 21 are made to react and hence no unreacted titanium will be left there. Thus, no unexpected silicifying reaction will occur due to the heat generated in subsequent steps to improve the contact reliability and the thermal resistance in the contact holes 21.

Figure 12:
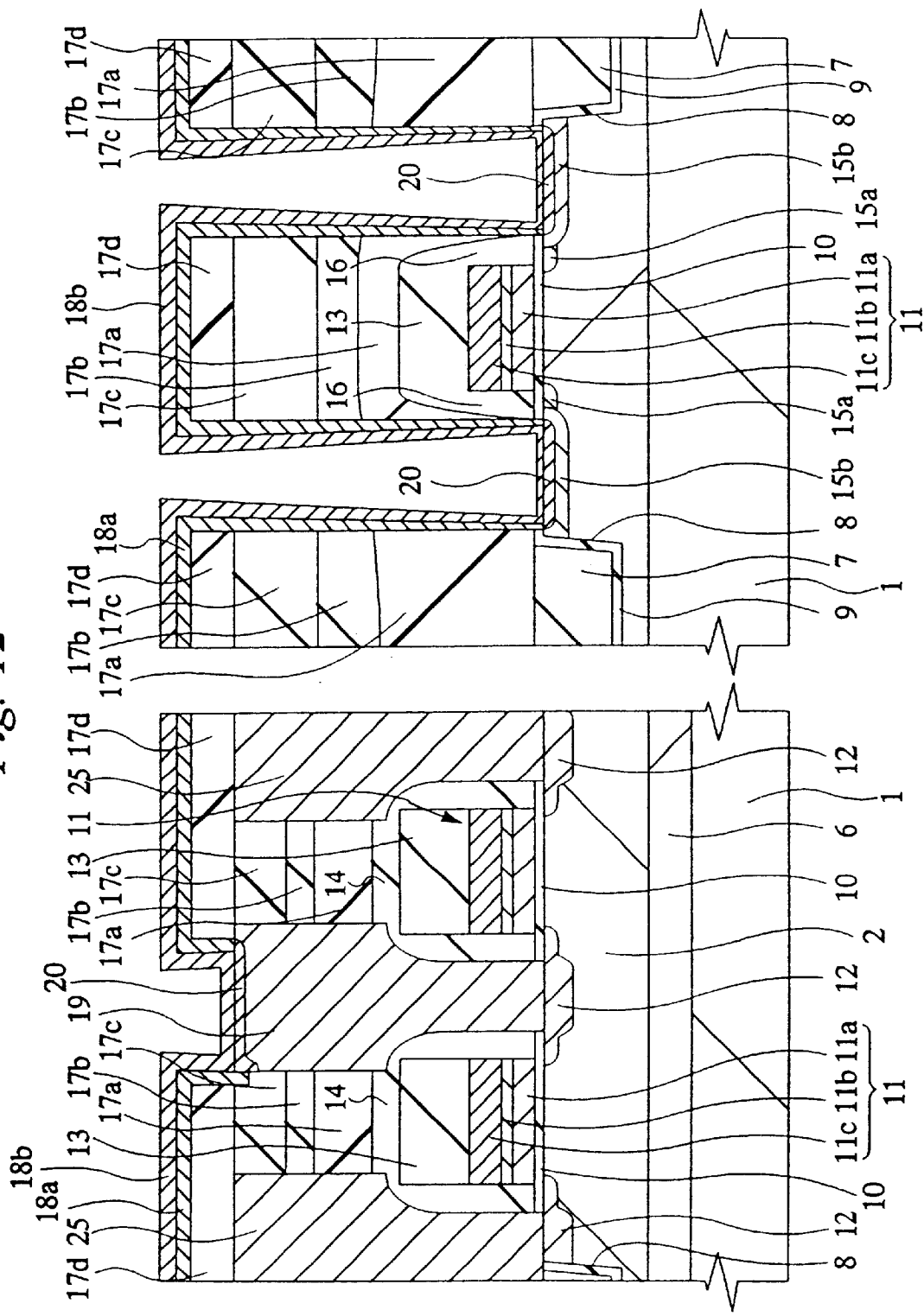
FIG. 12 is a schematic cross sectional view of embodiment 1 of DRAM similar to FIG. 11, showing a still subsequent step of manufacturing it.

Then, a titanium nitride film 18b is formed by deposition (FIG. 12). The titanium nitride film 18 can also be produced by CVD or sputtering to realize a uniform film thickness on the bottom of the contact holes 21 as in the case of the titanium film 18a. Therefore, any reduction in the thermal resistance of the titanium nitride film 18b due to an uneven film thickness can be effectively suppressed to improve the contact reliability in the contact holes 21.

Thereafter, a tungsten film 18c is deposited by a blanket CVD technique (FIG. 13). The use of a blanket CVD technique is advantageous in successfully burying the tungsten film into fine contact holes 21.

Subsequently, a silicon nitride film is formed by deposition and subjected to a patterning operation to produce a bit line BL, a first wiring layer M1 and a cap insulation film 22a along with side wall spacers 22b.

All the subsequent steps are identical with those of the method of manufacturing the embodiment 1.

With a DRAM having a configuration as described above, all the contact holes 21 has a same bore over the entire surface of the semiconductor substrate 1 and, therefore, a thermally highly resistive titanium silicide film 20 can be formed. More specifically, the titanium film 18a is formed by sputtering and the film thickness of the titanium film 18 on the bottom of the contact holes vary as a function of the bore of the contact holes. If a titanium film 18a having a varying film thickness is heat-treated to produce a titanium silicide film 20, unreacted titanium can be left in part of the contact holes particularly having a large bore because the film thickness of the titanium film is increased in contact holes having a large diameter. The inventors of the present invention have realized that the remaining titanium chemically reacts in subsequent heat treatment steps to produce cavities and corrode the semiconductor substrate 1 until the leak current and the contact resistance increase.

Thus, all the contact holes 21 are made to show a same diameter in this embodiment of DRAM to make the titanium film 18a show a same film thickness on the bottom of all the contact holes 21. As a result, no unreacted titanium will be left after the silicifying reaction to improve the thermal resistance (resistance against a rise of leak current and a rise of contact resistance) in the contact holes.

In an experiment conducted for this embodiment of DRAM, where the titanium film 18a was deposited by a collimation sputtering technique to a film thickness of 50 nm, the titanium film 18a showed a film thickness of 10 nm on the bottom of all the contact holes 21. No residual titanium was detected after heat-treating the titanium film 18a at 650° C. for 1 minute. The device was also heat-treated at 800° C. for 11 minutes in a subsequent step of forming capacitors C but no particular increase in the contact resistance nor in the leak current was observed in the contact holes 21.

While the contact holes 21 are made to show a same bore in this embodiment, they may alternatively be made to show a same aspect ratio if they have different depths. In any event, the titanium film shows a uniform film thickness on the bottom of all the contact holes and the thermal resistance at the bottom of the contact hole will be satisfactorily improved.

It may be needless to say that the bit line plug BP and the wiring plugs CTP may be prepared by CMP as in the case of the embodiment 2.

(Embodiment 5)

Figure 32:
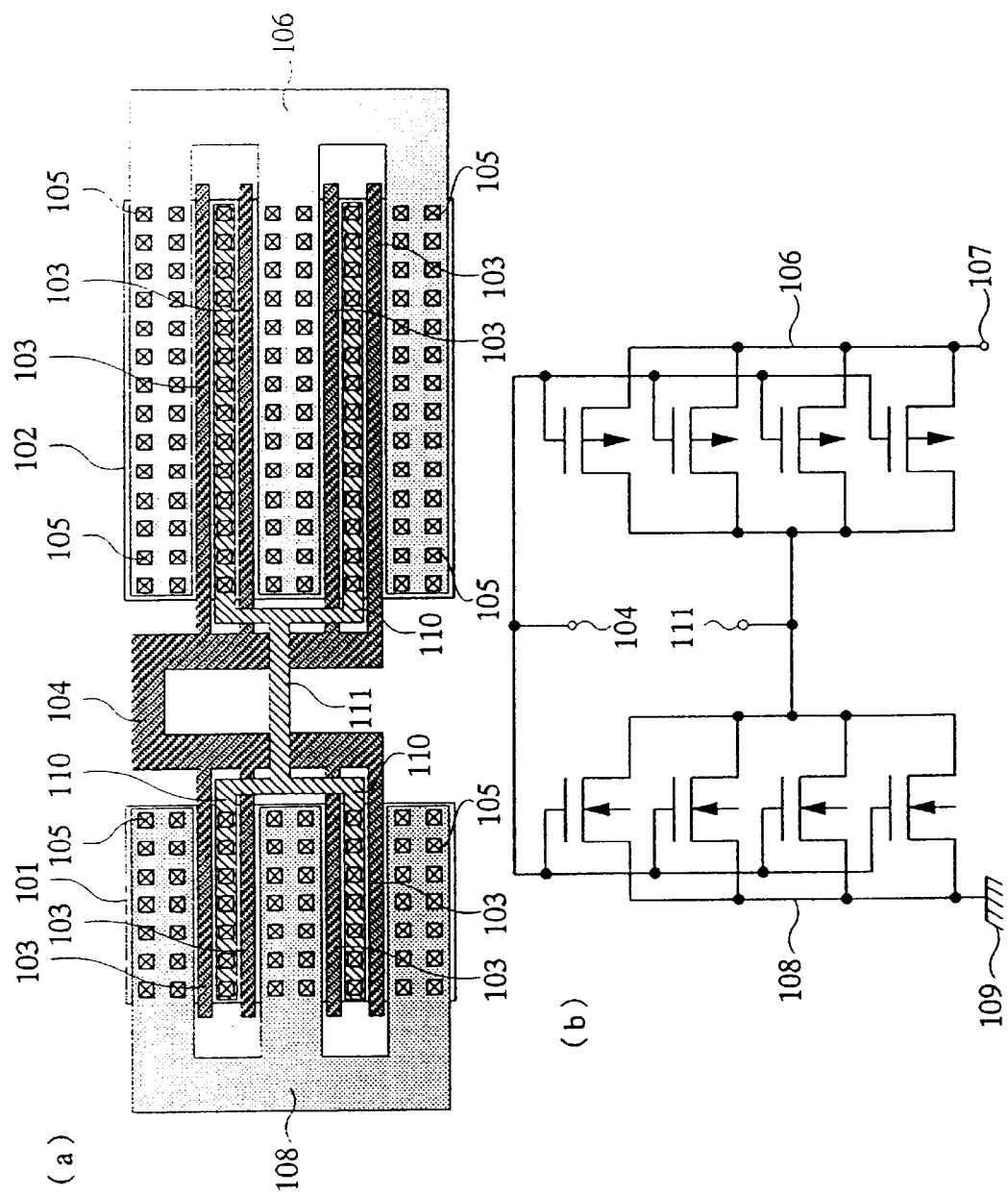
FIG. 32 is a schematic plan view of embodiment 5 of semiconductor integrated circuit device according to the invention.

In FIG. 32, (a) is a schematic plan view of part of the indirect peripheral circuits of an embodiment of semiconductor integrated circuit device according to the invention and (b) is an equivalent circuit diagram of the part of (a).

The output buffer will be described for this embodiment. The output buffer of this embodiment is designed as CMOS inverter where four n-channel MISFETs and four p-channel MISFETs are connected in parallel and then the n-channel MISFETs and the p-channel MISFETs are connected in series.

The n-channel MISFETs are formed in an n-diffusion region 101 where an n-type impurity is diffused, whereas the p-channel MISFETs are formed in a p-diffusion region 102 where a p-type impurity is diffused.

Gate electrodes 103 are formed both in the n-diffusion region 101 and the p-diffusion region 102 and connected to each other to produce an input section 104.

Source/drain regions are formed respectively at the opposite sides each of the gate electrodes 103. One of the source/drain regions of each of the gate electrodes 103 is connected to a power supply terminal 107 by way of a contact hole 105 and a wire 106 or to a grounding terminal 109 by way of the contact hole 105 and a wire 108. The other of the source/drain regions of each of the gate electrode 103 is connected to an output section 111 by way of the contact hole 105 and a wire 110. Note that a p-channel MISFET has a gate width greater than an n-channel MISFET because the current drive power of the former is smaller than that of the latter.

As described above by referring to the embodiment 4, the contact holes 105 are made to have an identical bore both in the direct peripheral circuit region and in the indirect peripheral circuit region in order to improve the thermal resistance of the contact holes.

However, when a large drive current capacity is required as in the case of this embodiment, this arrangement reduces the contact areas of the bottom of each contact hole to raise the contact resistance to such an extent that can obstruct the current drive.

Therefore, in this embodiment, the contact holes 105 are arranged in two rows along the lateral edges of the gate electrodes 103 to suppress any possible rise in the contact resistance. Thus, the current capacity of the buffer can be increased to make the device operate satisfactorily with a large electric current.

Additionally, the areas of this embodiment where contact holes 105 are arranged in two rows are limited to those where the wires 106 and 108 connected to the supply terminal 107 or the grounding terminal 109 are arranged and contact holes 105 are arranged in a single row in areas where the wires 110 connected to the output section 111. This is because, while the contact resistance falls when contact holes 105 are arranged in two rows, the contact area between the wires and the semiconductor substrate increases so the substrate capacitance is added to the wires to degrade the responsiveness of the output signal.

As described above, contact holes are arranged in two rows to reduce the contact resistance in areas where a large current capacitance is required, whereas they are arranged in a single row to improve the current capacitance and the responsiveness in areas where a quick signal response is required. It will be needless to say that the above effect is realized without sacrificing the improved thermal resistance of the contact holes of a DRAM according to the invention.

While contact holes 105 are arranged in two rows in certain areas in the above description, they may alternatively be arranged in more than two rows. Additionally, since the indirect peripheral circuit region is relatively roomy in terms of component arrangement, it is relatively easy to arrange contact holes 105 in a plurality of rows and no problem arises in the space requirement of the device.

(Embodiment 6)

FIGS. 33 through 36 are enlarged schematic cross sectional views of embodiment 6 of DRAM according to the invention, shown in different manufacturing steps. Note that only some of the peripheral circuits are shown in FIGS. 33 through 36.

The DRAM of this embodiment differs from that of the embodiment 1 only in the structure of and the process of preparing the titanium silicide film. Otherwise, the DRAM of this embodiment is identical with that of the embodiment 1. Therefore, the embodiment 6 will be described only in terms of the difference. The method of manufacturing the embodiment 6 of DRAM is identical with that of manufacturing the embodiment 1 of DRAM down to the step of FIG. 9.

After forming the contact holes 21, a titanium film 18a is formed by deposition (FIG. 33) typically by using a collimation sputtering technique until it shows a film thickness between 10 and 20 nm on the bottom of the contact holes 21.

Figure 34:
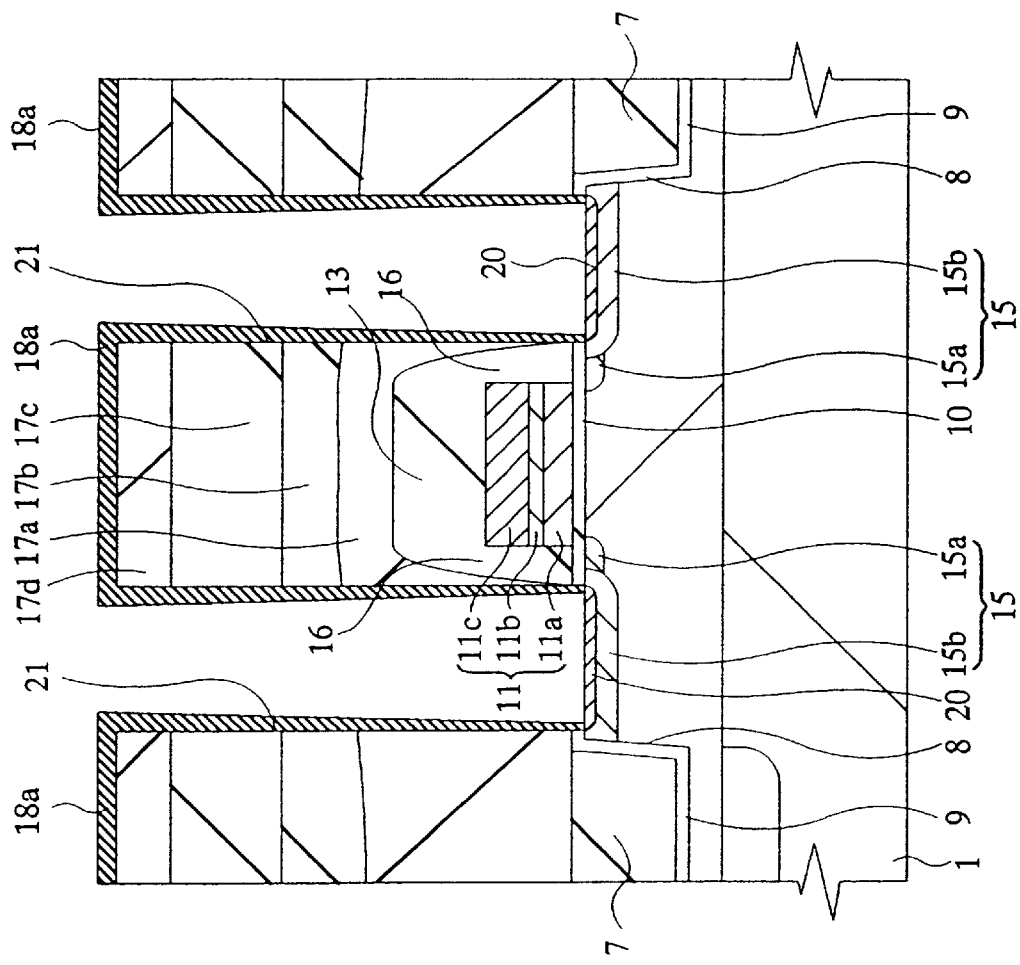
FIG. 34 is an enlarged schematic cross sectional view of embodiment 6 of DRAM similar to FIG. 33, showing another step of manufacturing it.
Figure 35:
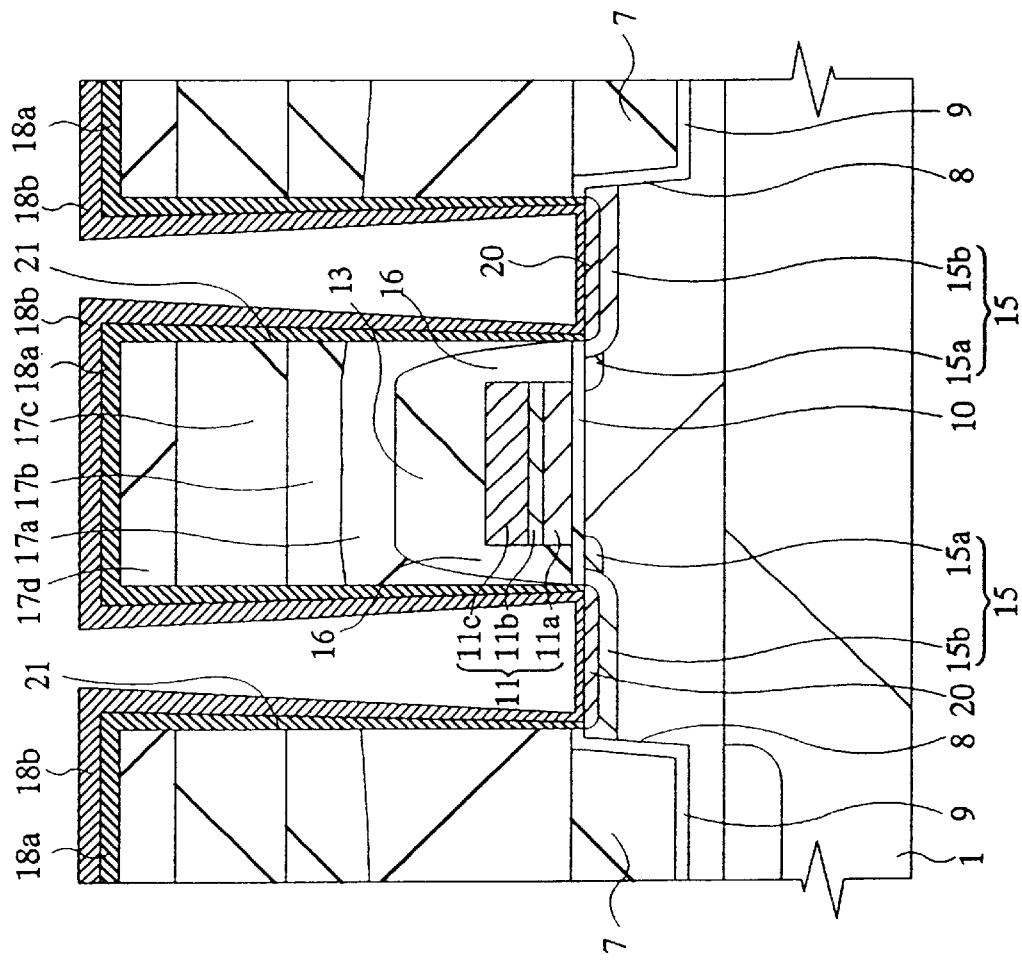
FIG. 35 is an enlarged schematic cross sectional view of embodiment 6 of DRAM similar to FIG. 34, showing a still another step of manufacturing it.

Then, as in the case of the embodiment 1, the work is subjected to a heat treatment process to cause the titanium film 18a and the semiconductor substrate 1 to react with each other and produce a titanium silicide film 20 (FIG. 34). Care should be taken in the process of producing the titanium silicide film 20 by heat treatment so that all the titanium reacts with the semiconductor substrate 1 at the bottom of the contact holes 21 and no residual titanium may be left on the bottom.

If the film thickness of the titanium film 18a on the bottom of the contact holes 21 is between 10 and 20 nm and all the titanium is caused to react with the semiconductor substrate, then the titanium silicide film of the reaction product will show a film thickness between 15 and 30 nm. As a result of the silicifying reaction, all the titanium on the bottom of the contact holes 21 are silicified and no residual titanium will be found there. Thus, the thermal resistance of the contact areas will be improved because there is no titanium left on the bottom of the contact holes. If, on the other hand, any residual titanium is found, it will be silicified in a subsequent heat treatment process to increase the film thickness of the titanium silicide film 20. However, as pointed out above, the titanium silicide film 20 will not increase its film thickness in a subsequent heat treatment process so that consequently any possible rise in the contact resistance of the contact areas will be successfully suppressed in this embodiment as discussed below.

Figure 37:
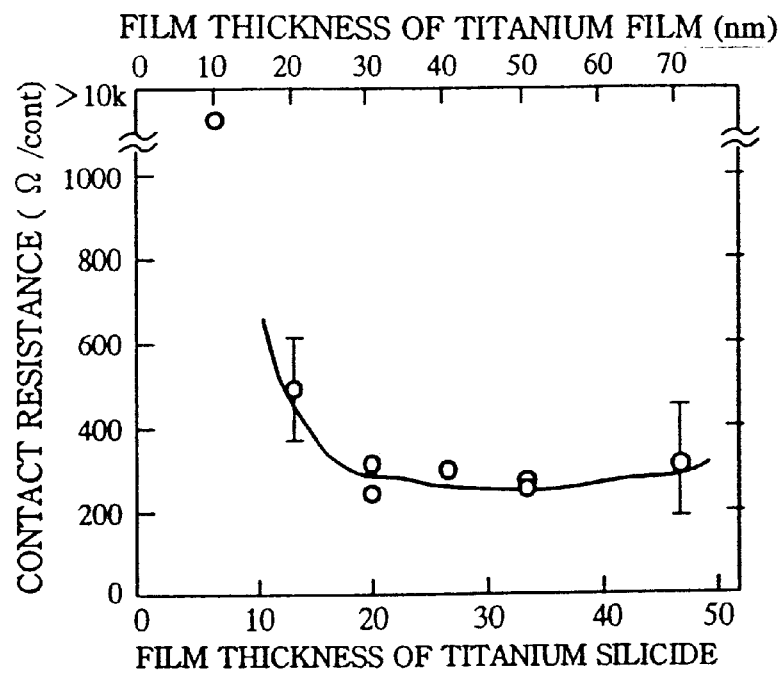
FIG. 37 is graphs showing the result of a series of experiments conducted by the inventors of the present invention to see the relationship between the contact resistance and the film thickness of a titanium silicide film at the bottom of contact holes, wherein (a) of FIG. 37 shows a graph obtained when an n-type substrate is used and (b) of FIG. 37 shows a graph obtained when a p-type substrate used.
Figure 37:
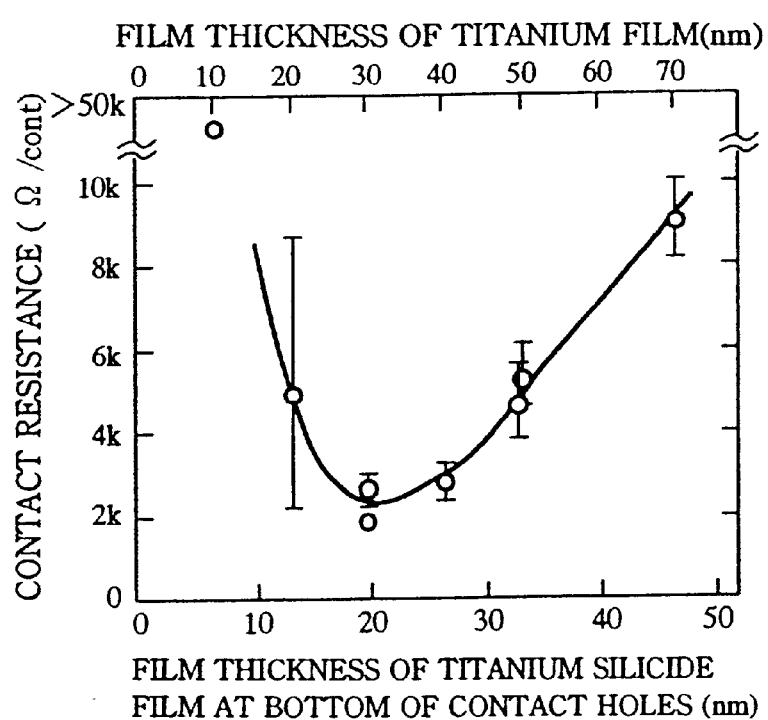

A titanium silicide film 20 having a film thickness between 15 and 30 nm can reduce the contact resistance at the bottom of the contact holes 21. More specifically, it was found by the inventors of the present invention as a result of a series of experiments that the contact resistance of a titanium silicide film varies as a function of its film thickness. This finding will be described by referring to FIG. 37 that shows the relationship between the contact resistance and the film thickness of the titanium silicide film 20 on the bottom of contact holes 21. In FIG. 37, (a) is for the n-type and (b) is for the p-type. Regardless if is of the n-type or of the p-type, the titanium silicide film 20 shows a high contact resistance when it has a film thickness less than 15 nm. This indicates that the titanium silicide film needs to have a film thickness of at least about 15 nm in order to realize a low contact resistance. In other words, it would not operate well with a low resistance unless it has a certain film thickness. Now, when the titanium silicide film is of the p-type, the contact resistance increases as the film thickness of the titanium silicide film rises. Presumably, this reflects the impurity concentration profile of the high concentration impurity region 15b. In a p-type high concentration impurity region, the impurity concentration is high in the surface area and falls as a function of the depth from the surface. If a thick titanium silicide film is formed with such an impurity concentration profile, it will be safe to presume that the titanium silicide film is found in a low impurity concentration area that is located deep in the high concentration impurity region 15b and the area showing a high impurity concentration and a low electric resistance will be taken into the silicide layer. Then, the electric resistance of the high concentration impurity region 15b would not be reduced satisfactorily to consequently make the contact resistance rather high.

When, on the other hand, the titanium silicide film is of the n-type, no remarkably increase in the contact resistance can be observed if the film thickness of the titanium silicide film 20 is increased. Presumably, this is because the impurity concentration profile of an n-type high concentration impurity region 15b does not depend on the depth from the surface and shows a substantially uniform level. Therefore, the contact resistance would not be affected if the film thickness of the titanium silicide film 20 is increased. This phenomenon is advantageous for the titanium silicide film 20 on the top surface of the plug 19 to be connected to the bit line BL in the memory cell region because the aperture formed on the plug 19 has a small depth and hence a low aspect ratio if compared with the contact holes 21. Thus, the film thickness of the titanium silicide film 18a on the bottom of the aperture is greater than that of the titanium silicide film 18a on the bottom of the contact holes 21. The titanium silicide film 20 formed on the top surface of the plug 19 has a large film thickness. However, the selector MISFETs Qs for selecting memory cells are of the n-channel type and the impurity with which the plug 19 is doped is an impurity of the n-conductivity type. Therefore, advantageously, the contact resistance would not be increased if the titanium silicide film 20 shows a relatively large film thickness.

While the titanium silicide film 20 does not need to contain nitrogen, oxygen, carbon or germanium, it may contain any of nitrogen, oxygen, carbon and germanium as in the case of the embodiment 1. Additionally, the titanium film 18a may be replaced by a tungsten film or a cobalt film to produce tungsten silicide or cobalt silicide.

Figure 36:
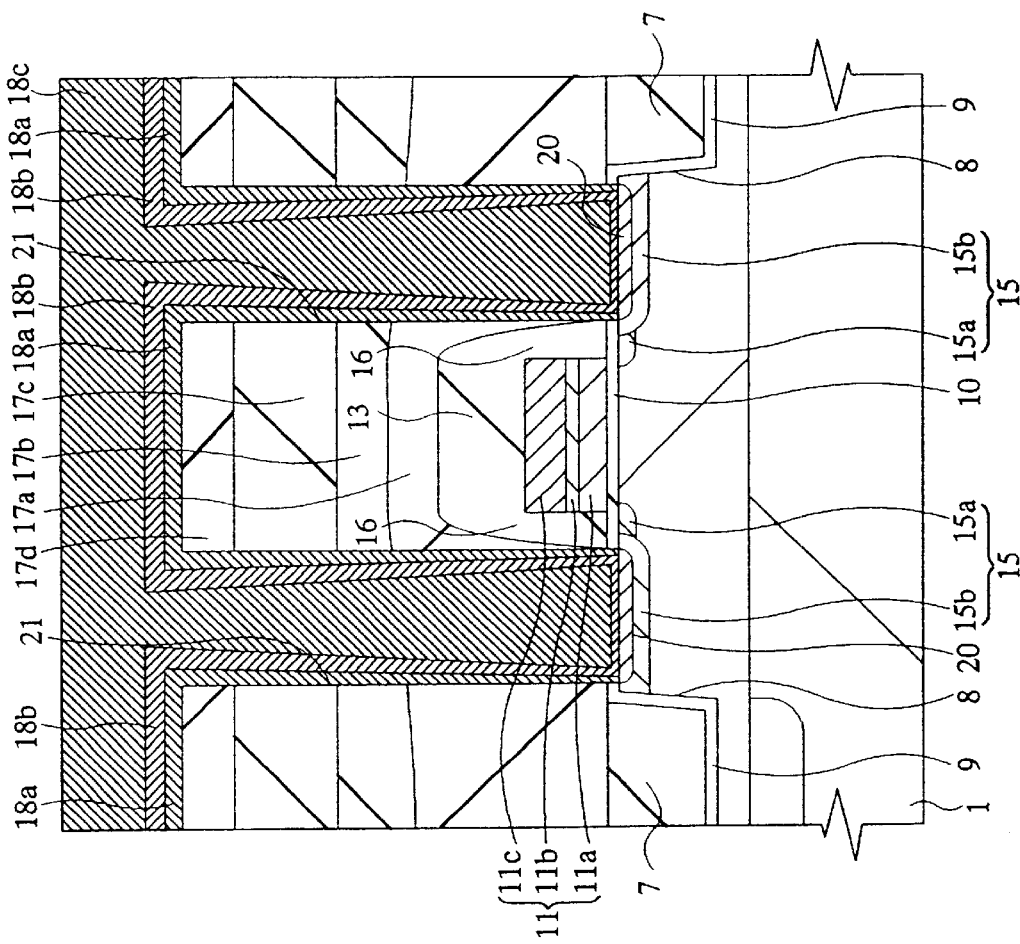
FIG. 36 is an enlarged schematic cross sectional view of embodiment 6 of DRAM similar to FIG. 35, showing a still another step of manufacturing it.

Then, as in the case of the embodiment 1, a titanium nitride film 18b is formed by deposition (FIG. 35) and a tungsten film 18c is deposited thereon (FIG. 36).

All the subsequent steps are identical with their counterparts of the embodiment 1.

Thus, with the above described embodiment, the contact resistance on the bottom of the contact holes 21 is reduced and the thermal resistance of the contact areas is improved.

As in the case of the embodiment 1, the laminate film of a titanium nitride film layer 18b and a tungsten film layer 18c may be replaced by a single layer of titanium nitride or tungsten nitride. Additionally, the titanium silicide film 20 of this embodiment can be applied to the embodiment 2.

(Embodiment 7)

FIGS. 38 through 41 are enlarged schematic cross sectional views of embodiment 7 of DRAM according to the invention, shown in different manufacturing steps. Note that only some of the peripheral circuits are shown in FIGS. 38 through 41.

Figure 38:
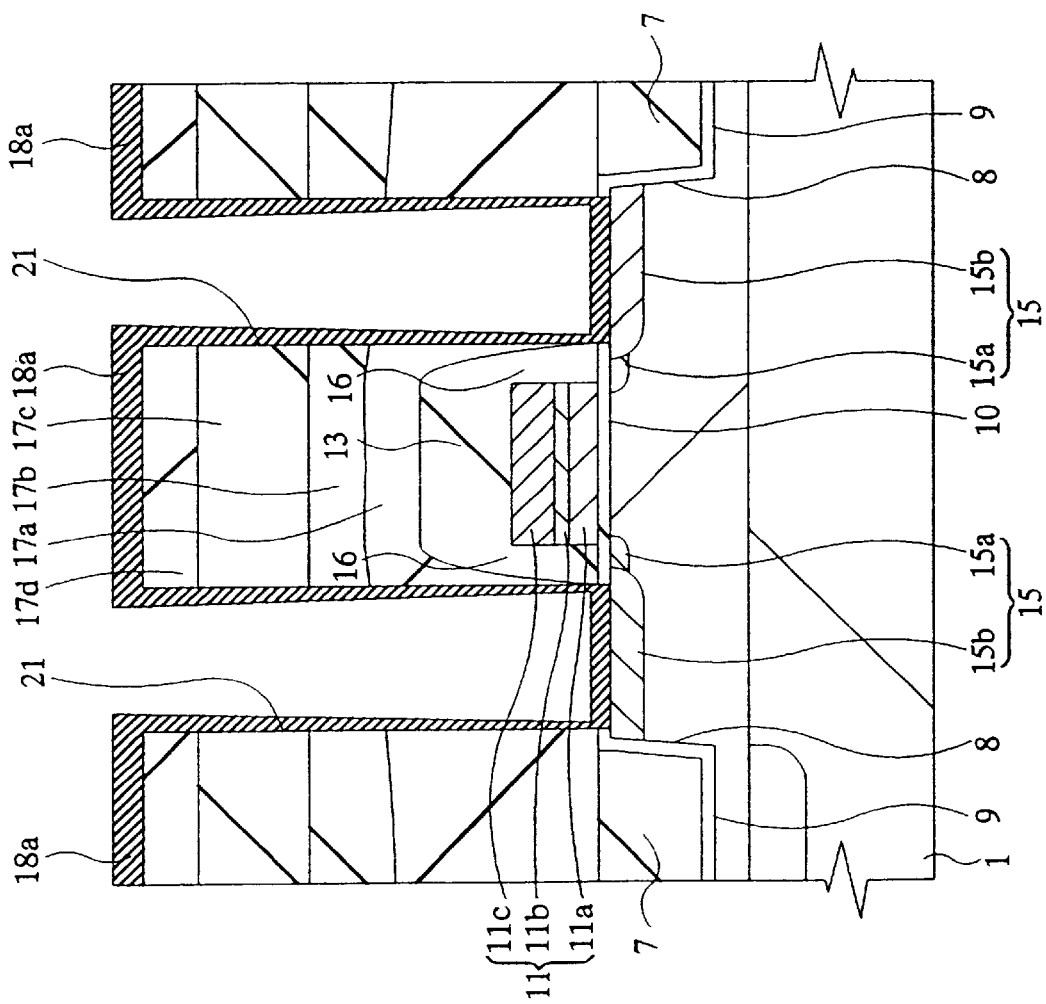
FIG. 38 is an enlarged schematic cross sectional view of embodiment 7 of DRAM according to the invention, showing a step of manufacturing it.

The DRAM of this embodiment differs from that of the embodiment 6 only in the process of preparing the titanium silicide film. Otherwise, the DRAM of this embodiment is identical with that of the embodiment 1 in terms of the structure and the manufacturing method. Therefore, the embodiment 7 will be described only in terms of the difference. The method of manufacturing the embodiment 7 of DRAM is identical with that of manufacturing the embodiment 6 of DRAM down to the step of FIG. 33. However, in this embodiment, the titanium film 18a is only required to have a film thickness greater than 10 nm so that the titanium silicide film produced as a result of a heat treatment process has a film thickness greater than 15 nm. It is not subjected to any other restrictions. Therefore, the titanium film 18a may have a film thickness exceeding 20 nm (FIG. 38).

Figure 39:
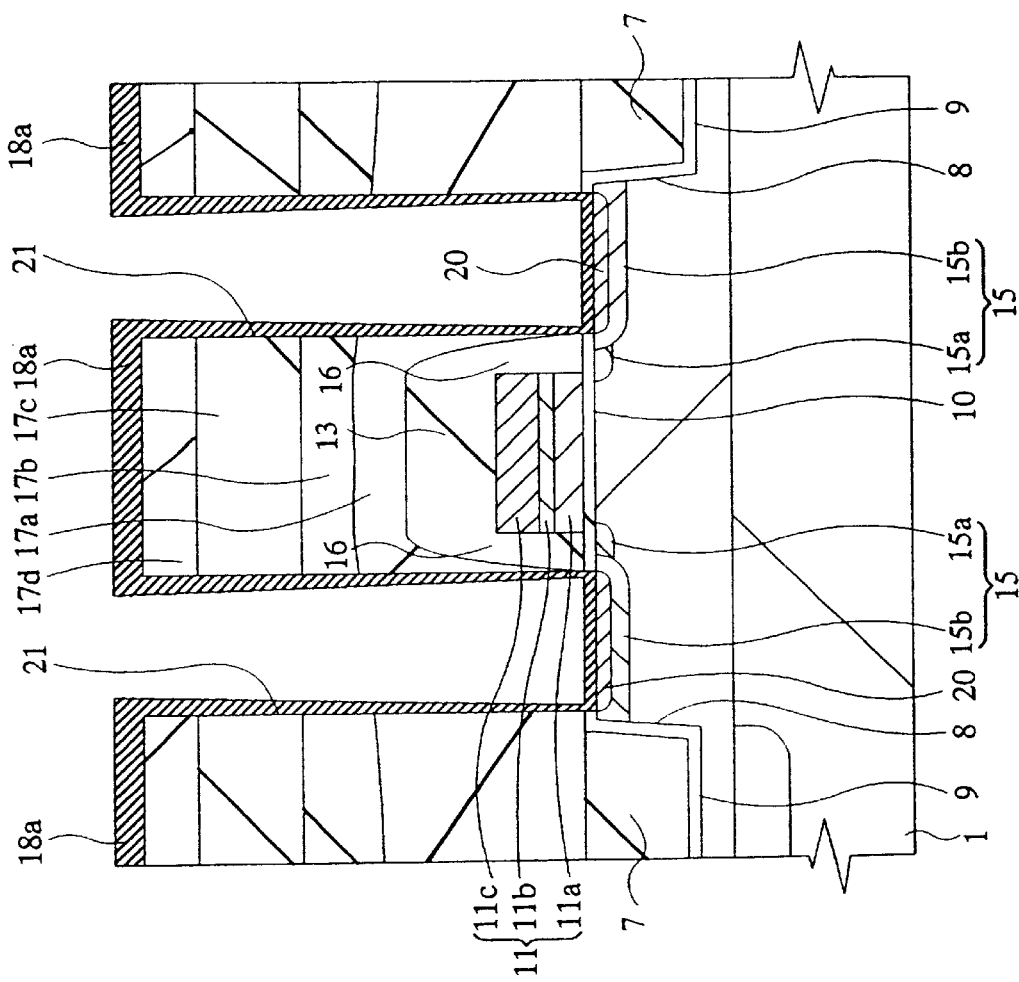
FIG. 39 is an enlarged schematic cross sectional view of embodiment 7 of DRAM similar to FIG. 38, showing another step of manufacturing it.

Then, the titanium film is subjected to a heat treatment process to produce a titanium silicide film 20 as in the case of the embodiment 6 (FIG. 39). However, not all the titanium film 18a on the bottom of the contact holes 21 is silicified but the duration and the temperature of the heat treatment are so controlled as to make the film thickness of the titanium silicide film 20 is found between 15 and 30 nm. The titanium silicide film 20 having a film thickness between 15 and 30 nm of this embodiment shows the effect of suppressing the contact resistance similar to that of the embodiment 6 as described above.

Figure 40:
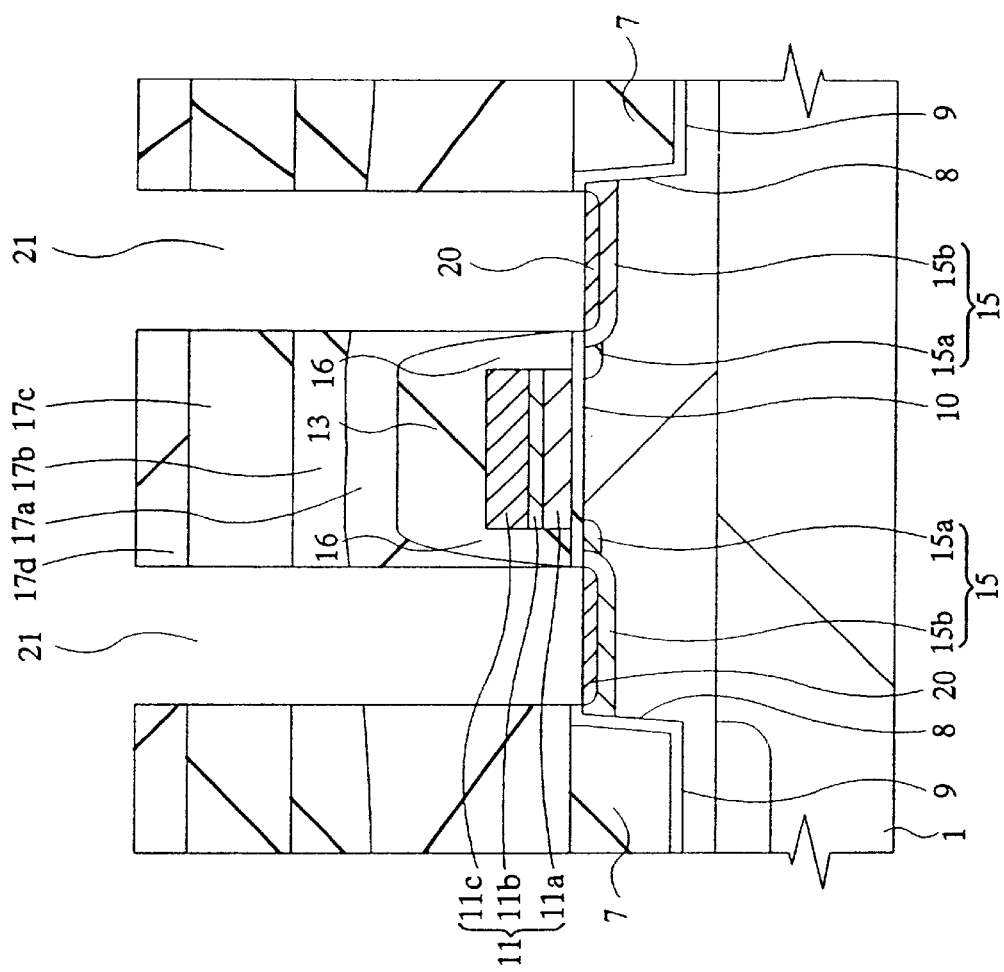
FIG. 40 is an enlarged schematic cross sectional view of embodiment 7 of DRAM similar to FIG. 39, showing a still another step of manufacturing it.

With this embodiment, unreacted titanium is left on the bottom of the contact holes 21 as shown in FIG. 39. As pointed out above, such unreacted titanium can reduce the reliability of the contact areas as a result of a subsequent heat treatment process. Therefore, with this embodiment, the residual unreacted titanium is removed selectively by means of, for example, wet etching (FIG. 40). As a result of removing the unreacted titanium by etching, any possible reduction in the thermal resistance and hence the reliability of the contact areas that may be caused by a subsequent heat treatment process can be effectively avoided.

Figure 41:
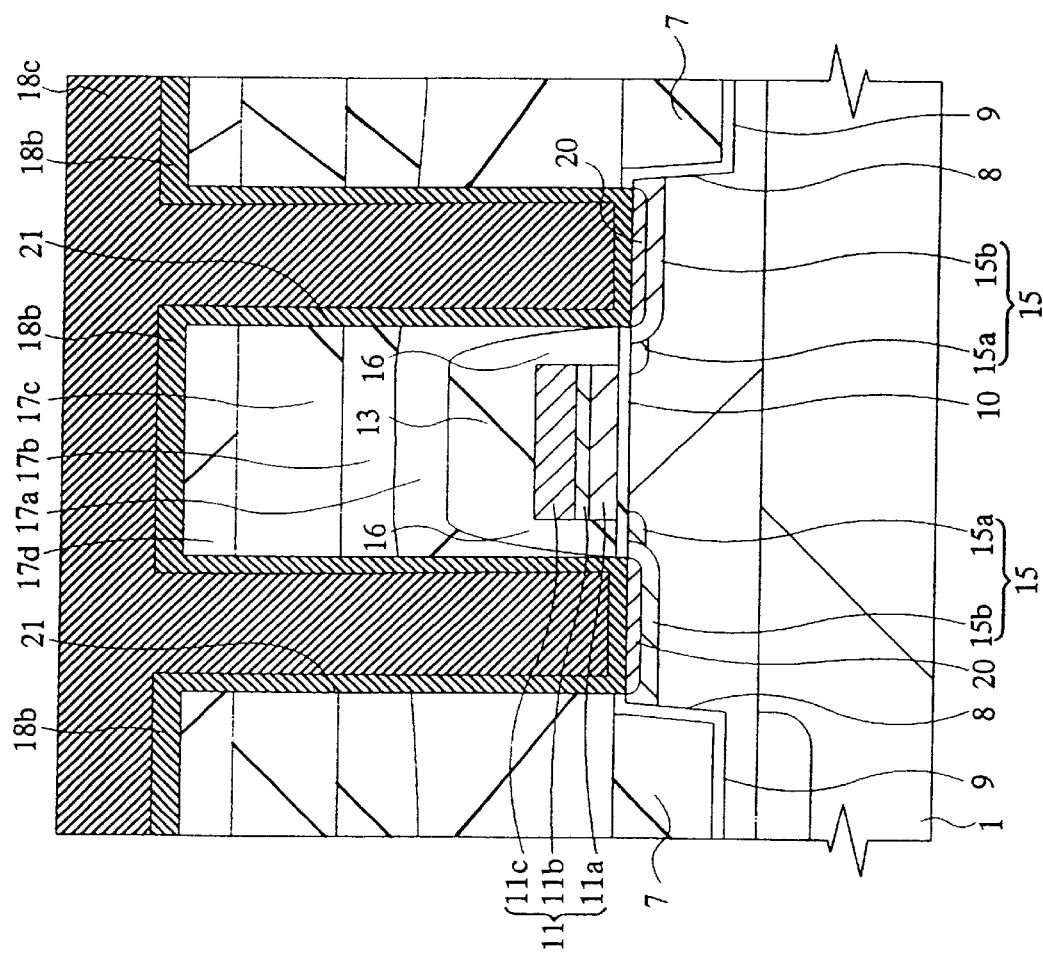
FIG. 41 is an enlarged schematic cross sectional view of embodiment 7 of DRAM similar to FIG. 40, showing a still another step of manufacturing it.

Then, as in the case of the embodiment 6, a titanium nitride film 18b is formed by deposition and a tungsten film 18c is deposited thereon (FIG. 41). All the subsequent steps are identical with their counterparts of the embodiment 6.

Thus, with the above described embodiment, the contact resistance on the bottom of the contact holes 21 is reduced and the reliability (thermal resistance) of the contact areas is improved.

While the titanium silicide film 20 does not need to contain nitrogen, oxygen, carbon or germanium, it may contain any of nitrogen, oxygen, carbon and germanium as in the case of the embodiment 1. Additionally, the titanium film 18a may be replaced by a tungsten film or a cobalt film to produce tungsten silicide or cobalt silicide.

As in the case of the embodiment 2, the laminate film of a titanium nitride film layer 18b and a tungsten film layer 18c may be replaced by a single layer of titanium nitride or tungsten nitride. Additionally, the titanium silicide film 20 of this embodiment can be applied to the embodiment 2.

(Embodiment 8)

Figure 42:
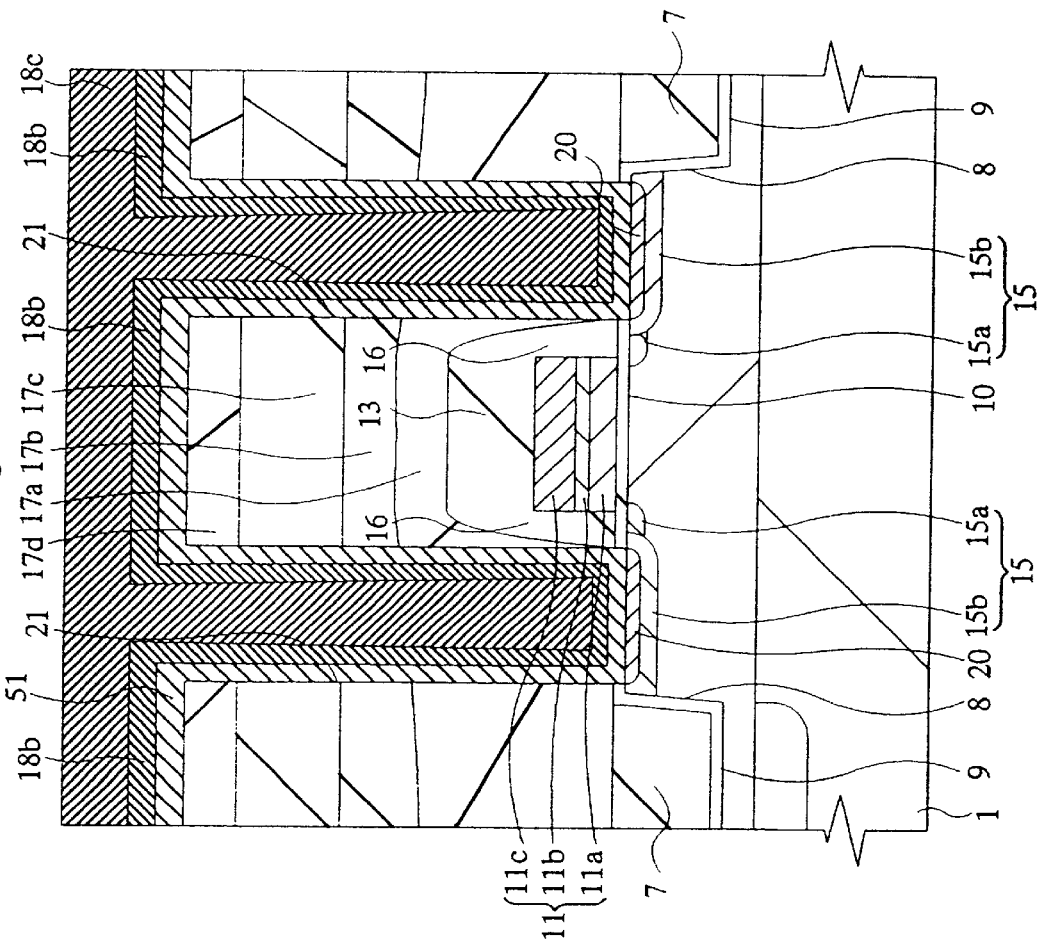
FIG 42 is an enlarged schematic cross sectional view of embodiment 8 of DRAM according to the invention, showing a step of manufacturing it.

FIG. 42 is an enlarged schematic cross sectional view of embodiment 8 of DRAM according to the invention, showing a manufacturing step thereof. Note that only some of the peripheral circuits are shown in FIG. 42.

The DRAM of this embodiment differs from that of the embodiment 6 only in the structure of the bit line BL and that of the first wiring layer M1. Additionally, no titanium silicide film 20 is formed on the principal surface of the semiconductor substrate 1 of this embodiment. Therefore, this embodiment will be described below only in terms of the difference.

Both the bit line BL and the first wiring layer M1 of this embodiment comprise a titanium silicide film 51, a titanium nitride film 18b and a tungsten film 18c. The titanium silicide film 51 of this embodiment replaces the titanium silicide film 20 of the embodiments 1 through 7 and has an effect of reducing the contact resistance of between the bit line BL and the first wiring layer M1 and the plug 19 or the semiconductor substrate 1.

As in the case of the embodiment 1, the titanium silicide film 51 of this embodiment is formed by sputtering or CVD after producing contact holes 21. The titanium silicide 51 is made to show a film thickness between 15 and 30 nm.

With this embodiment of DRAM, the contact resistance at the bottom of the contact holes 21 can be reduced by the titanium silicide film 51. Additionally, since no undesired residual titanium is left on the bottom of the contact holes 21, the contact reliability (thermal resistance) at the bottom can be improved in the contact holes.

While the titanium silicide film 51 does not need to contain nitrogen, oxygen, carbon or germanium, it may contain any of nitrogen, oxygen, carbon and germanium as in the case of the embodiment 1. Additionally, the titanium film 18*a* may be replaced by a tungsten film or a cobalt film to produce tungsten silicide or cobalt silicide.

As in the case of the embodiment 2, the laminate film of a titanium nitride film layer 18*b* and a tungsten film layer 18*c* may be replaced by a single layer of titanium nitride or tungsten nitride. Additionally, the bit line plug BP and the wiring plug CTP may be formed after the step of FIG. 42 as in the case of the embodiment 2.

(Embodiment 9)

Figure 43:
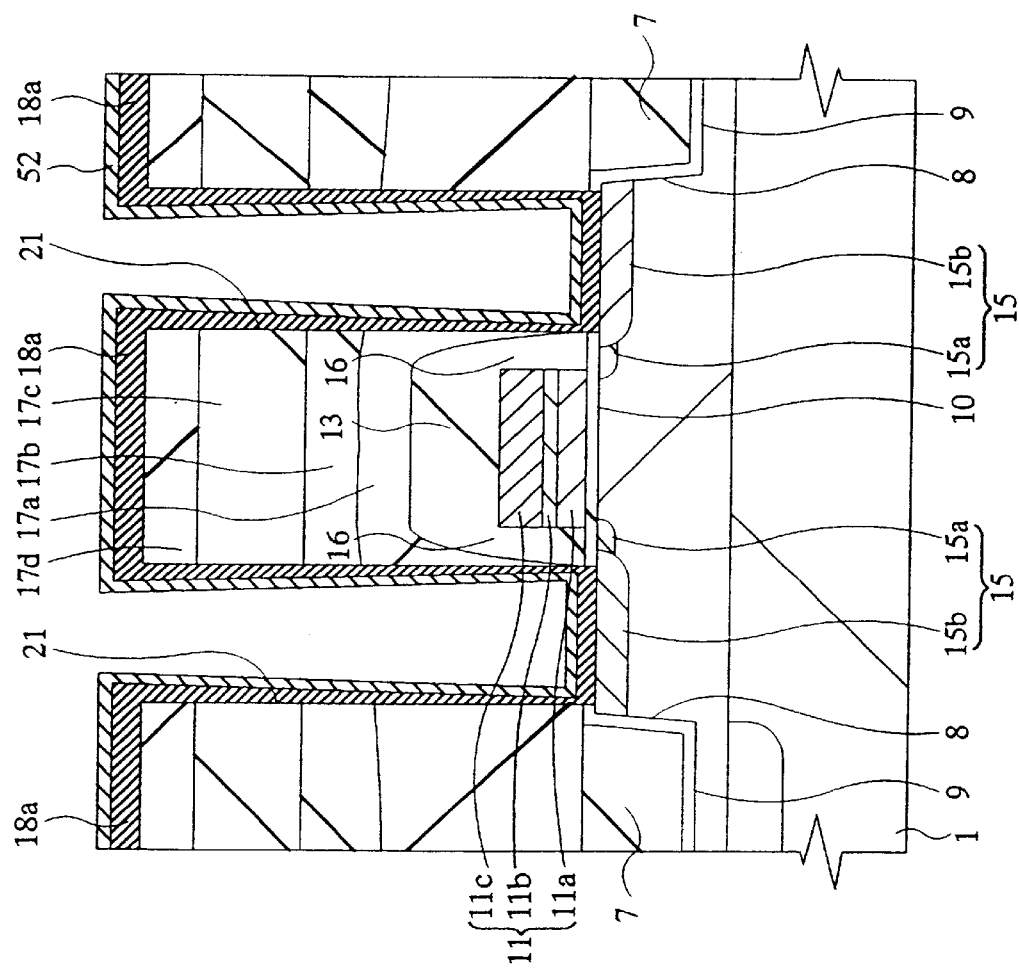
FIG. 43 is an enlarged schematic cross sectional view of embodiment 9 of DRAM according to the invention, showing a step of manufacturing it.
Figure 44:
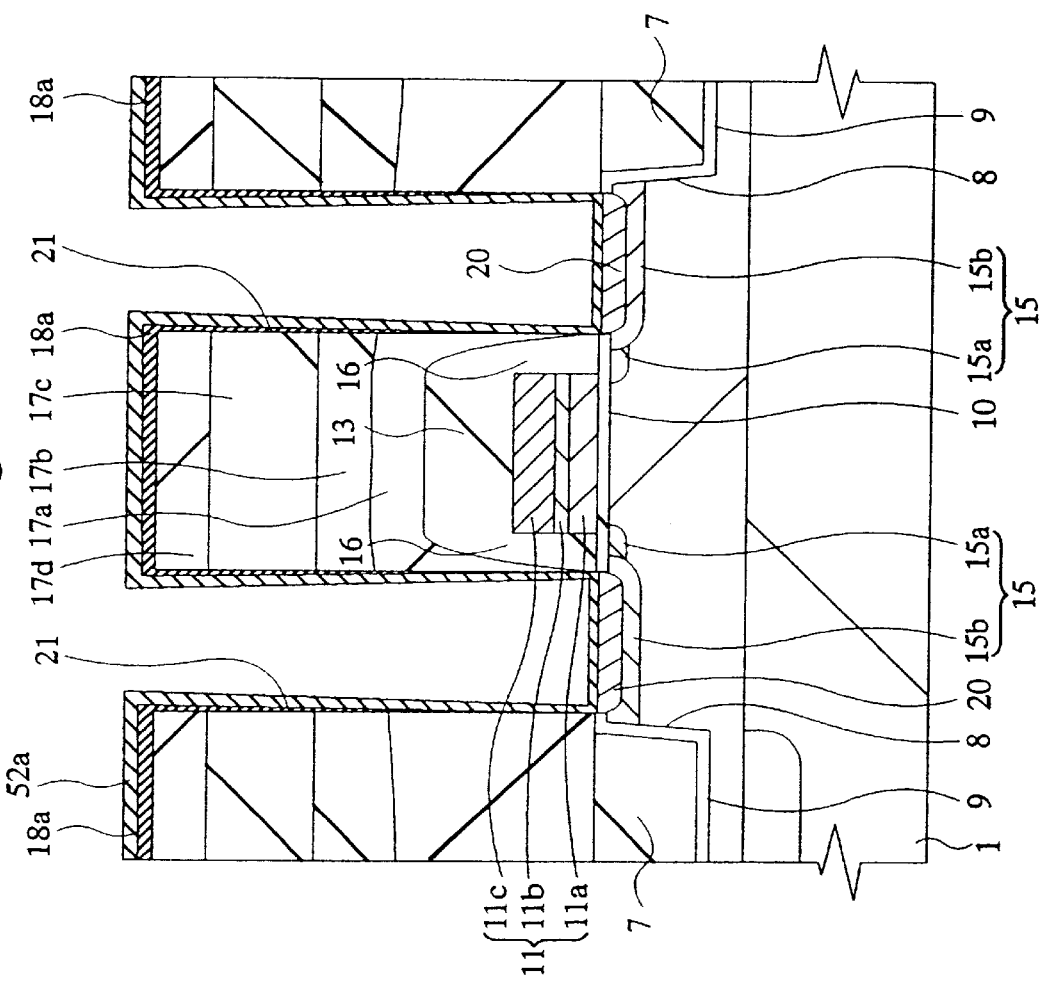
FIG. 44 is an enlarged schematic cross sectional view of embodiment 9 of DRAM similar to FIG. 43, showing another step of manufacturing it.

FIGS. 43 and 44 are enlarged schematic cross sectional views of embodiment 9 of DRAM according to the invention, shown in different manufacturing steps. Note that only some of the peripheral circuits are shown in FIGS. 43 and 44.

The DRAM of this embodiment differs from that of the embodiment 1 in the structure of the bit line BL and that of the first wiring layer M1. Additionally, the process of preparing the titanium silicide film 20 of this embodiment differs from that of the embodiment 1. Therefore, this embodiment will be described below only in terms of the difference.

Figure 33:
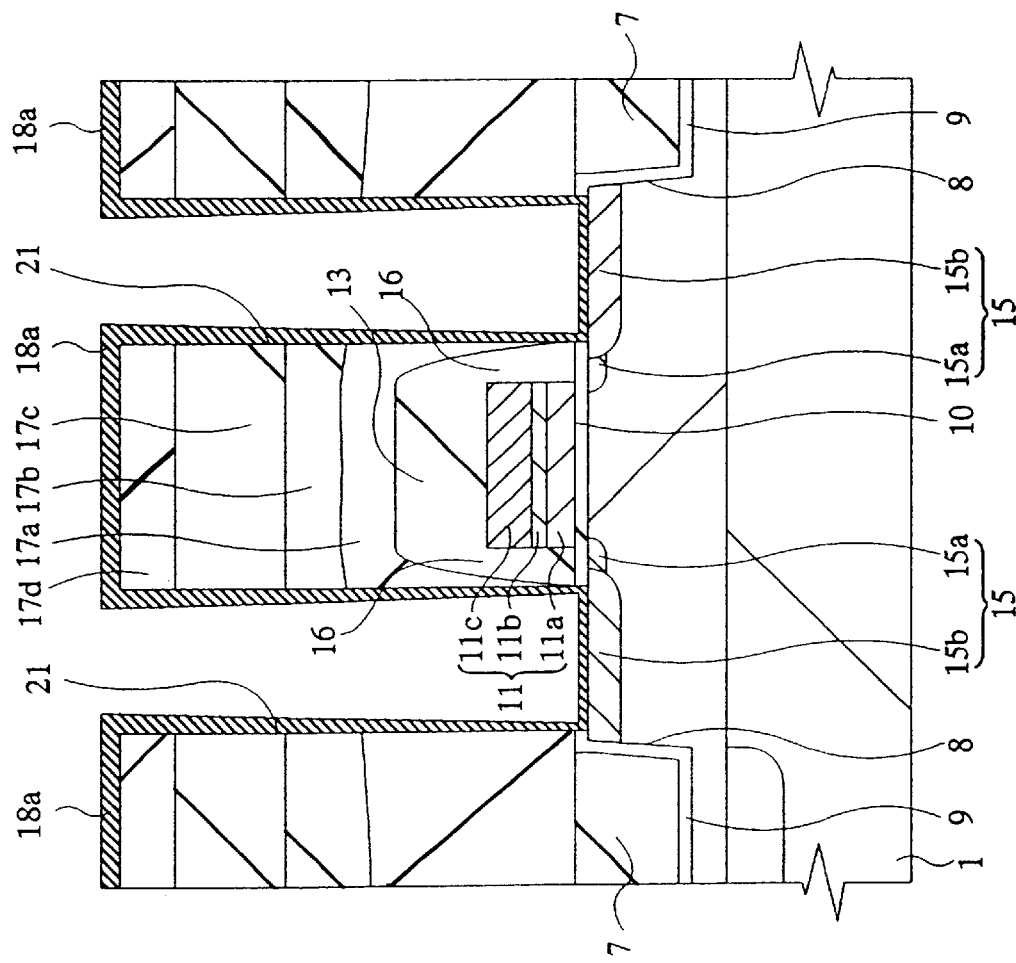
FIG. 33 is an enlarged schematic cross sectional view of embodiment 6 of DRAM according to the invention, showing a step of manufacturing it.

The method of manufacturing the embodiment 9 of DRAM is identical with that of manufacturing the embodiment 6 of DRAM down to the step of FIG. 33. However, in this embodiment, the titanium film 18*a* is only required to have a film thickness greater than 10 nm so that the titanium silicide film produced as a result of a heat treatment process has a film thickness greater than 15 nm. It is not subjected to any other restrictions. Therefore, the titanium film 18*a* may have a film thickness exceeding 20 nm.

Then, a polycrystal silicon film 52 is formed by deposition (FIG. 43). A polycrystal silicon film 52 reacts with a titanium film having an excessive volume in a heat treatment step as will be discussed below in order to eliminate any residual titanium.

Then, a heat treatment process is carried out as in the case of the embodiment 6. As a result of the heat treatment, the titanium film 18*a* on the bottom of the contact holes 21 partly reacts with silicon in the semiconductor substrate 1 (at the bottom), while the remain of the titanium film 18*a* reacts with the polycrystal silicon film 52 (at the top). Thus, the titanium film 18*a* is partly consumed by the reaction with the polycrystal silicon film 52 at the top thereof so that only the remaining titanium film 18*a* reacts with silicon in the semiconductor substrate 1. Therefore, the silicide layer of the semiconductor substrate 1 does not get to a deep area of the high concentration impurity region 15*b* to raise the contact resistance. On the other hand, no residual titanium will appear if the titanium film 18*a* has a large film thickness so that the thermal resistance (contact reliability) of the contact areas can be ensured.

While part of the titanium film 18*a* that does not react with the polycrystal silicon film 52 will remain on the lateral walls of the contact holes 21 and the top surface of the TEOS oxide film 17*d*, the remaining titanium would not damage the contact reliability of the device in the subsequent heat treatment step. With this embodiment, any possible residual titanium that can be left on the bottom of the contact holes 21 and any silicide layer that can get deep into the semiconductor substrate 1 can be eliminated by appropriately selecting the film thickness of the titanium film 18*a* and that of the polycrystal silicon film 52. The polycrystal silicon film 52 may have a film thickness smaller than that of the titanium film 18*a*.

All the subsequent steps are identical with those of the method of manufacturing the embodiment 6.

Thus, this embodiment can reduce the contact resistance at the bottom of the contact holes 21 and suppress any possible degradation in the contact reliability (thermal resistance) due to a subsequent heat treatment step.

While the titanium silicide film 20 does not need to contain nitrogen, oxygen, carbon or germanium, it may contain any of nitrogen, oxygen, carbon and germanium as in the case of the embodiment 1. Additionally, the titanium film 18*a* may be replaced by a tungsten film or a cobalt film to produce tungsten silicide or cobalt silicide.

As in the case of the embodiment 1, the laminate film of a titanium nitride film layer 18*b* and a tungsten film layer 18*c* may be replaced by a single layer of titanium nitride or tungsten nitride. Additionally, the titanium silicide film 20 of this embodiment can be applied to the embodiment 2.

Figure 45:
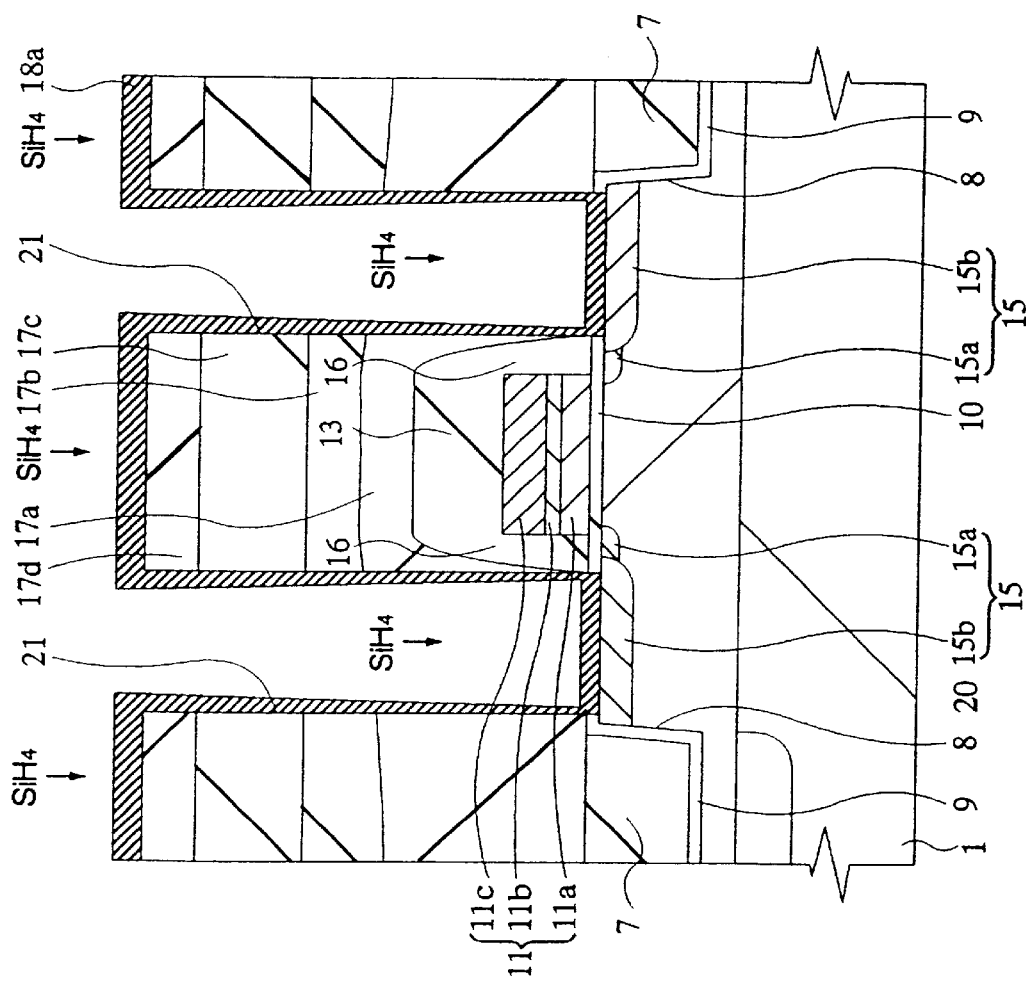
FIG. 45 is an enlarged schematic cross sectional view of an embodiment of DRAM obtained by modifying embodiment 9, showing a step of manufacturing it.

Referring to FIG. 45, if the titanium film 18*a* has a film thickness greater than 20 nm, it can be safely subjected to a heat treatment process in a silane gas ($SiH_4$) atmosphere to produce a titanium silicide film by the heat treatment. If such is the case, any excessive titanium will be silicified by the silane gas to prevent unreacted titanium from being produced.

(Embodiment 10)

Figure 46:
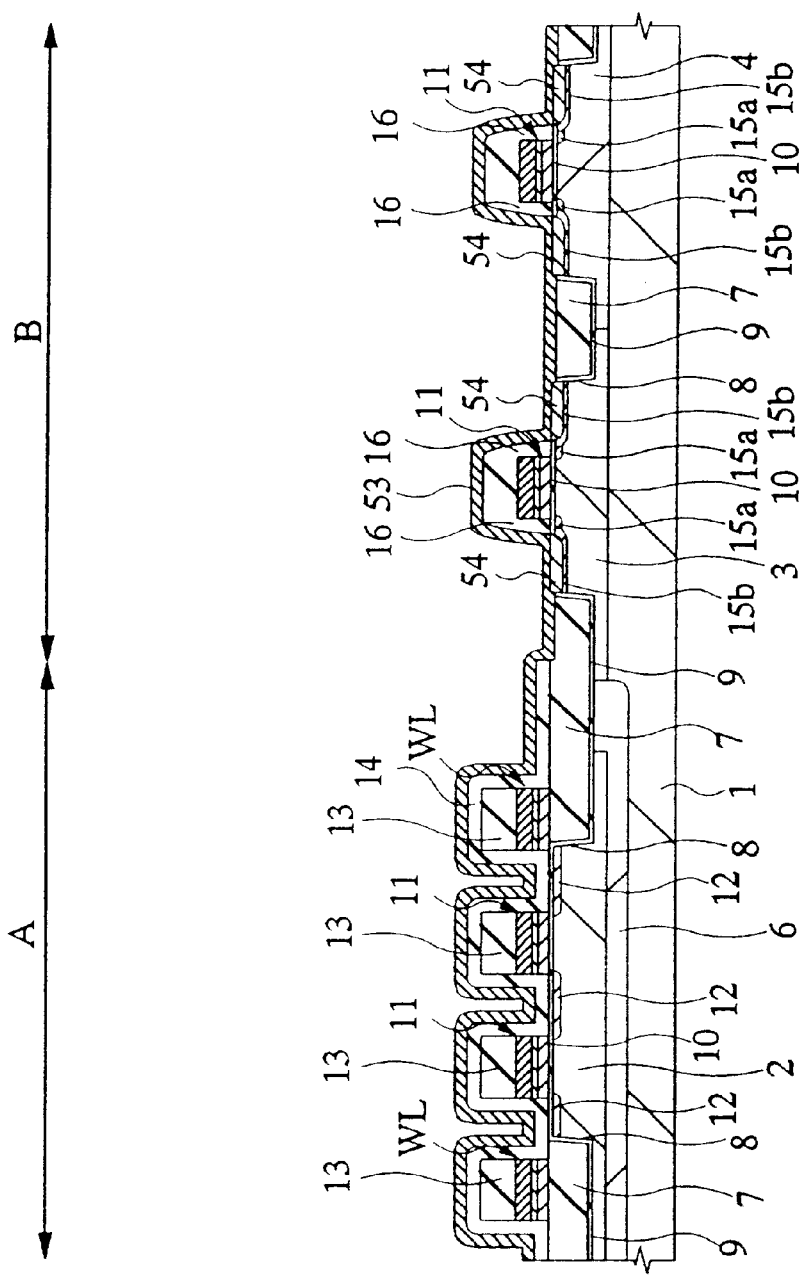
FIG. 46 is a schematic cross sectional view of embodiment 10 of DRAM according to the invention, showing a step of manufacturing it.
Figure 47:
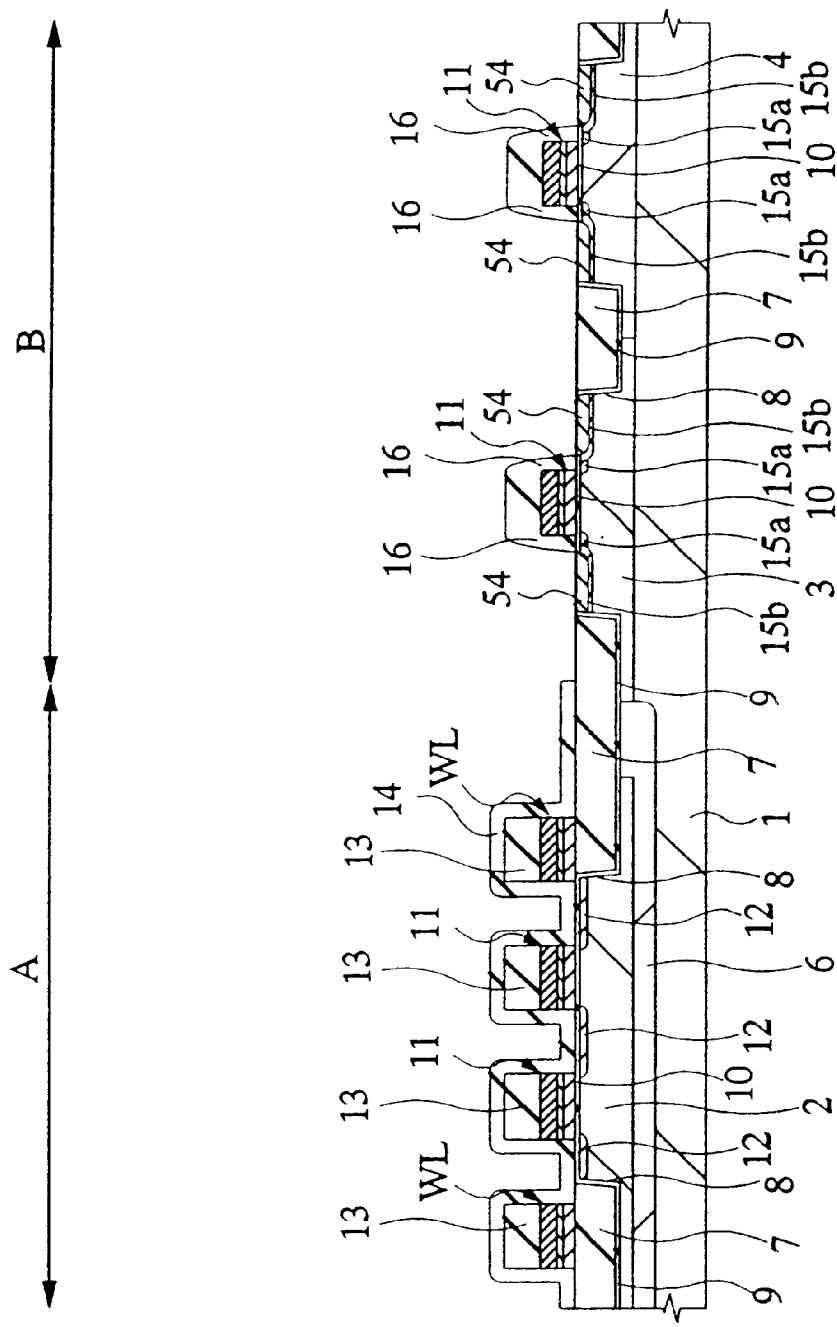
FIG. 47 is a schematic cross sectional view of embodiment 10 of DRAM similar to FIG. 46, showing another step of manufacturing it.

FIGS. 46 and 47 are enlarged schematic cross sectional views of embodiment 10 of DRAM according to the invention, shown in different manufacturing steps.

With the method of manufacturing a semiconductor integrated circuit device to be used for this embodiment, a silicifying reaction is conducted before the step of forming an SOG film 17*a* described earlier by referring to the embodiment 1.

After the step of FIG. 7 for the embodiment 1, a titanium film 53 is formed by deposition on the entire surface of the semiconductor substrate 1. Then, the semiconductor substrate 1 is heat-treated to produce a titanium silicide film 54 as in the case of the embodiment 1 (FIG. 46).

Thereafter, the unreacted titanium film is selectively removed typically by wet etching (FIG. 47) All the subsequent steps are identical with their counterparts of the embodiment 1. However, the metal film M for producing a bit line BL and a first wiring layer M1 after forming the contact holes 21 does not require to have a layer for silicifying titanium.

With this embodiment, a silicide layer is formed on the entire area of the semiconductor substrate 1 where silicon is exposed so that the contact resistance can be reduced highly reliably. Additionally, the thermal resistance can be reliably improved because the unreacted titanium is selectively removed.

However, the metal film M for producing a bit line BL and a first wiring layer M1 after forming the contact holes 21 may have a layer for silicifying titanium. Then, the contact resistance at the bottom of the contact holes 21 may be reduced to raise the contact resistance because excessive titanium is present on the bottom of the contact holes 21. However, since the titanium silicide film 54 is found in the semiconductor region other than the bottom of the contact holes 21, or in the high concentration impurity region 15 15*b*, the low resistance of the semiconductor region is secured by the titanium silicide film 54 found in the semiconductor region other than the bottom of the contact holes 21.

The present invention is described above in detail by referring to preferred embodiments, although the present invention is not limited to those embodiments, which may be modified in various different ways without departing from the scope of the invention.

Figure 48:
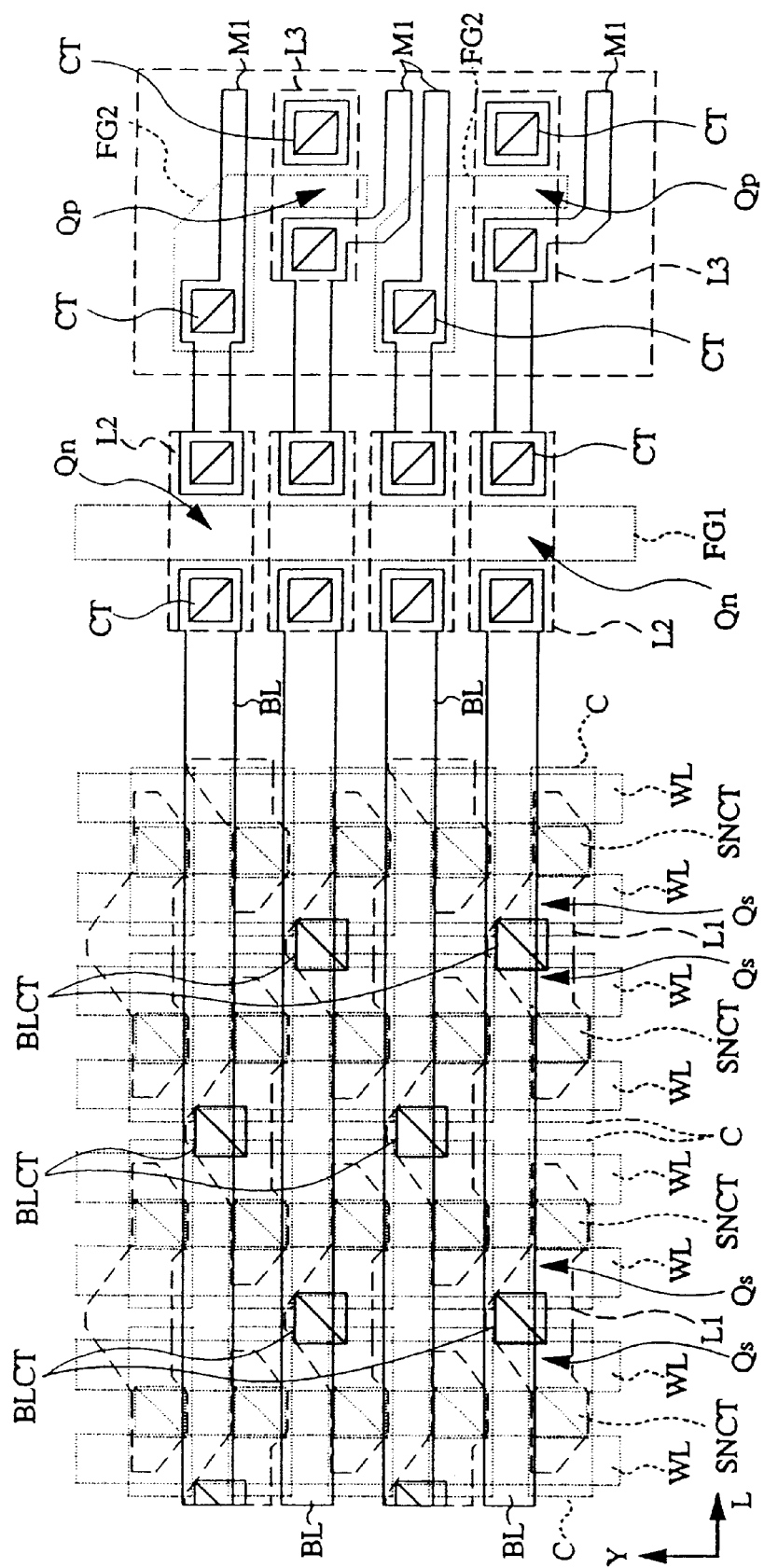
FIG. 48 is a schematic plan view of a device according to the invention.

For example, the bit line BL is intentionally made to show an open structure relative to the corresponding bit line contact hole BLCT in any of the embodiments 1 through 10, the present invention is applicable to a situation where an open structure is unintentionally produced as a result of, for example, a displaced mask as shown in FIG. 48.

Additionally, while the first wiring layer M1 and the underlayer is described in terms of the connection between a high concentration impurity region 15b which is a source/drain region of each MISFET and the first wiring layer M1 in any of the above embodiments, the source/drain region of each MISFET may be replaced by some other region such as the surface of the semiconductor substrate 1 or some other component or the gate electrode of each MISFET for the connection.

[Advantages of the Invention]

Some of the most remarkable advantages of the present invention will be summarized below.

(1) Undulations are prevented from being produced in the polycrystal silicon plugs in the bit line contact holes to eliminate any possible adverse effect of such undulations on the subsequent photolithography and etching steps and improve the yield of these steps.

(2) The phenomenon that the silicide film at the contacts of the bit lines and the polycrystal silicon plugs is etched transversally from taking place is prevented from taking place in order to secure the communication between each bit line and the corresponding polycrystal silicon plug and consequently improve the yield and the reliability of manufacturing semiconductor integrated circuit devices.

(3) The capacity of each bit line and hence the storage capacity of a DRAM required to store a given amount of information are reduced so that the operating speed of the DRAM can be improved.

(4) The thermal resistance of the contacts between the first wiring layer and the semiconductor substrate is reduced to suppress the leak current at the contacts that can appear in subsequent steps involving the use of heat particularly when the bit lines of the DRAM and the first wiring layer of the peripheral circuit region are formed in a common layer so that consequently the yield and the reliability of manufacturing semiconductor integrated circuit devices may be improved.

(5) The contact resistance between the first wiring layer and the underlying members including the semiconductor substrate is reduced to improve the performance of the semiconductor integrated circuit device.

What is claimed is:

1. A dynamic random access memory (DRAM) having first MISFETs for selecting memory cells formed on the principal surface of a semiconductor substrate and second MISFETs for peripheral circuits formed on the surface, comprising:

polycrystal silicon plugs formed in a first insulation film and arranged on one of the source/drain regions of each of the first MISFETs;

bit lines arranged on a second insulation film and electrically connected to the respective polycrystal silicon plugs by way of respective contact holes formed to pass through the second insulation film arranged on the first insulation film; and wires of a first wiring layer arranged on the second insulation film and electrically connected to the source/drain regions of the second MISFETs respectively by way of second contact holes formed to pass through the first and second insulation films; wherein a silicide film of an element selected from titanium, tungsten and cobalt containing an impurity or impurities is formed in contact areas of the bit lines and the polycrystal silicon plugs;

the impurity or impurities being one or more than one elements selected from nitrogen, oxygen, carbon and germanium.

2. A dynamic random access memory according to claim 1, wherein a concentration of the impurity is between 1 atomic % and 13 atomic %.

3. A dynamic random access memory according to claim 2, wherein the impurity is nitrogen, and the concentration of nitrogen is between 1 atomic % and 13 atomic %.

4. A dynamic random access memory according to claim 2, wherein the width of the bit lines is not greater than the bore of the contact holes.

* * * * *